(12) United States Patent
Fujii et al.

(10) Patent No.: US 8,981,461 B2
(45) Date of Patent: *Mar. 17, 2015

(54) NONVOLATILE SEMICONDUCTOR MEMORY DEVICE AND METHOD OF MANUFACTURING THE SAME

(71) Applicant: Kabushiki Kaisha Toshiba, Minato-ku (JP)

(72) Inventors: Shosuke Fujii, Yokohama (JP); Daisuke Hagishima, Kawasaki (JP); Kiwamu Sakuma, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 191 days.

This patent is subject to a terminal disclaimer.

(21) Appl. No.: 13/622,644

(22) Filed: Sep. 19, 2012

(65) Prior Publication Data
US 2013/0015520 A1    Jan. 17, 2013

Related U.S. Application Data

(63) Continuation of application No. PCT/JP2010/054772, filed on Mar. 19, 2010.

(51) Int. Cl.
*H01L 29/792* (2006.01)
*H01L 27/115* (2006.01)
(Continued)

(52) U.S. Cl.
CPC .... *H01L 27/11578* (2013.01); *H01L 27/11568* (2013.01); *G11C 5/02* (2013.01); *G11C 16/0483* (2013.01)
USPC ..... 257/326; 257/324; 257/325; 257/E21.219

(58) Field of Classification Search
CPC ..................... H01L 72/11563; H01L 27/1157

USPC ................ 257/326, 324, 325, E21.219
See application file for complete search history.

(56) References Cited

U.S. PATENT DOCUMENTS

7,352,018 B2 *  4/2008  Specht et al. ................ 257/204
7,842,994 B2 * 11/2010  Yin et al. ..................... 257/316
(Continued)

FOREIGN PATENT DOCUMENTS

JP    2004-152893 A    5/2004
JP    2006-155750 A    6/2006
(Continued)

OTHER PUBLICATIONS

International Preliminary Report on Patentability issued Nov. 1, 2012 in PCT/JP2010/054772 filed Mar. 19, 2010.
(Continued)

*Primary Examiner* — Jarrett Stark
(74) *Attorney, Agent, or Firm* — Oblon, McClelland, Maier & Neustadt, L.L.P.

(57) ABSTRACT

According to one embodiment, a nonvolatile semiconductor memory device includes a fin-type stacked layer structure in which a first insulating layer, a first semiconductor layer, . . . an n-th insulating layer, an n-th semiconductor layer, and an (n+1)-th insulating layer (n is a natural number equal to or more than 2) are stacked in order thereof in a first direction perpendicular to a surface of a semiconductor substrate and which extends in a second direction parallel to the surface of the semiconductor substrate, first to n-th memory strings which use the first to n-th semiconductor layers as channels respectively, a common semiconductor layer which combines the first to n-th semiconductor layers at first ends of the first to n-th memory strings in the second direction.

18 Claims, 36 Drawing Sheets

(51) Int. Cl.
    *G11C 5/02*     (2006.01)
    *G11C 16/04*    (2006.01)

(56) References Cited

U.S. PATENT DOCUMENTS

| | | | |
|---|---|---|---|
| 7,969,789 B2* | 6/2011 | Katsumata et al. | 365/185.28 |
| 8,008,732 B2 | 8/2011 | Kiyotoshi et al. | |
| 8,017,993 B2* | 9/2011 | Kidoh et al. | 257/324 |
| 8,247,857 B2* | 8/2012 | Ozawa et al. | 257/314 |
| 8,710,580 B2* | 4/2014 | Sakuma et al. | 257/324 |
| 2006/0091556 A1* | 5/2006 | Shigeoka | 257/773 |
| 2007/0290223 A1* | 12/2007 | Yagishita | 257/103 |
| 2008/0258203 A1* | 10/2008 | Happ et al. | 257/324 |
| 2011/0272745 A1 | 11/2011 | Kiyotoshi et al. | |
| 2011/0284946 A1* | 11/2011 | Kiyotoshi | 257/324 |
| 2012/0139030 A1 | 6/2012 | Sakuma et al. | |
| 2012/0280303 A1 | 11/2012 | Kiyotoshi et al. | |
| 2013/0015519 A1* | 1/2013 | Fujii et al. | 257/324 |
| 2013/0134372 A1* | 5/2013 | Sakuma et al. | 257/1 |
| 2013/0175490 A1* | 7/2013 | Kusai et al. | 257/1 |
| 2013/0181184 A1* | 7/2013 | Sakuma et al. | 257/5 |
| 2013/0194871 A1* | 8/2013 | Lin et al. | 365/185.17 |

FOREIGN PATENT DOCUMENTS

| | | |
|---|---|---|
| JP | 2007-266143 A | 10/2007 |
| JP | 2008-78404 A | 4/2008 |
| JP | 2009-27136 A | 2/2009 |
| JP | 2009-283799 A | 12/2009 |

OTHER PUBLICATIONS

Written Opinion issued Jun. 22, 2010 in PCT/JP2010/054772 filed Mar. 19, 2010 submitting English translation only.
U.S. Appl. No. 13/547,567, filed Jul. 12, 2012, Sakuma et al.
International Search Report mailed on Jun. 22, 2010, issued for International Application No. PCT/JP2010/054772, filed on Mar. 19, 2010 (with English translation).
International Written Opinion mailed on Jun. 22, 2010, issued for International Application No. PCT/JP2010/054772, filed on Mar. 19, 2010.
U.S. Appl. No. 13/689,026, filed Nov. 29, 2012, Sakuma, et al.
U.S. Appl. No. 13/752,526, filed Jan. 29, 2013, Kusai et al.

* cited by examiner

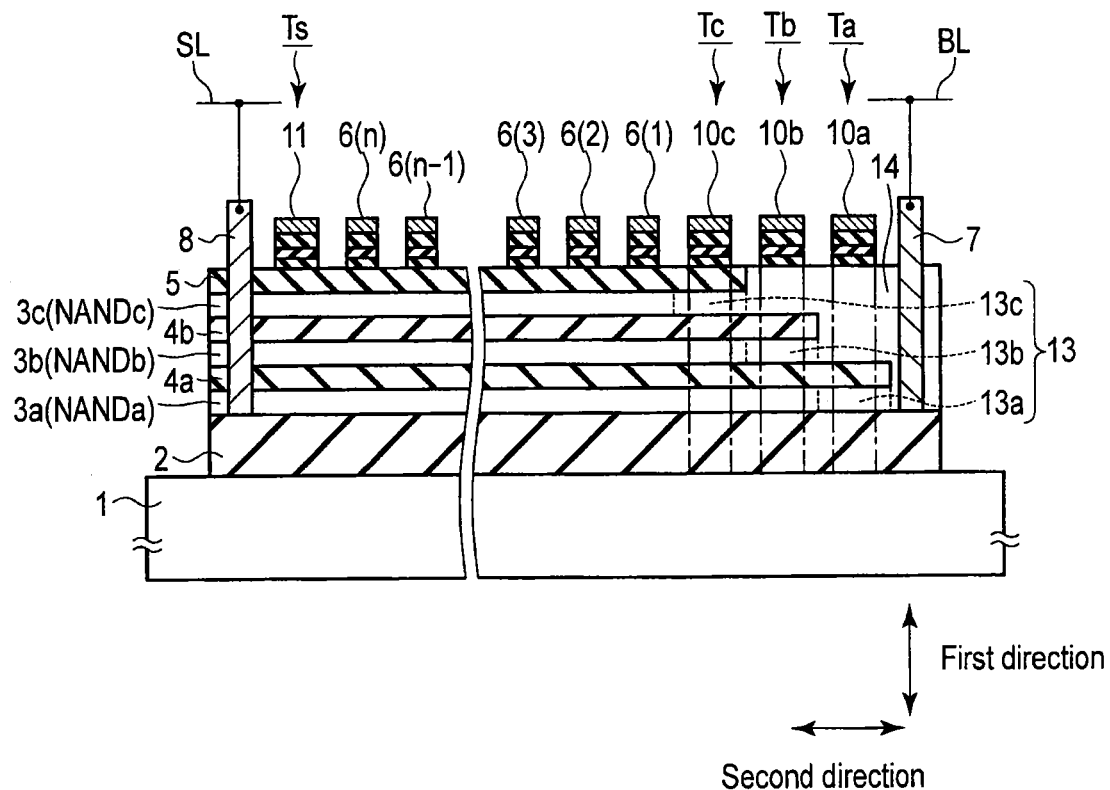
F I G. 2
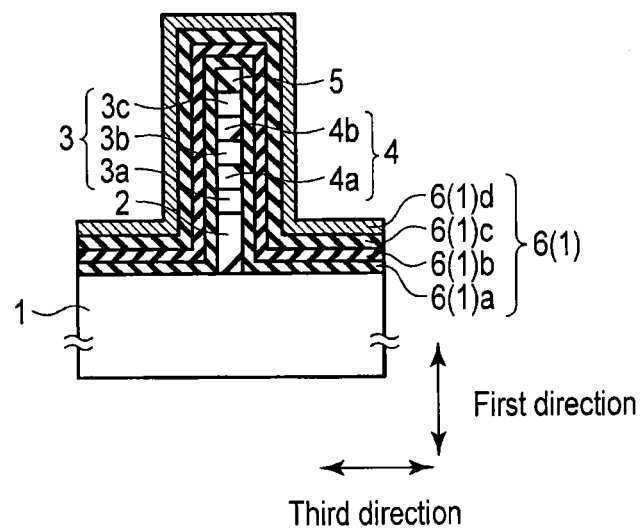
F I G. 3

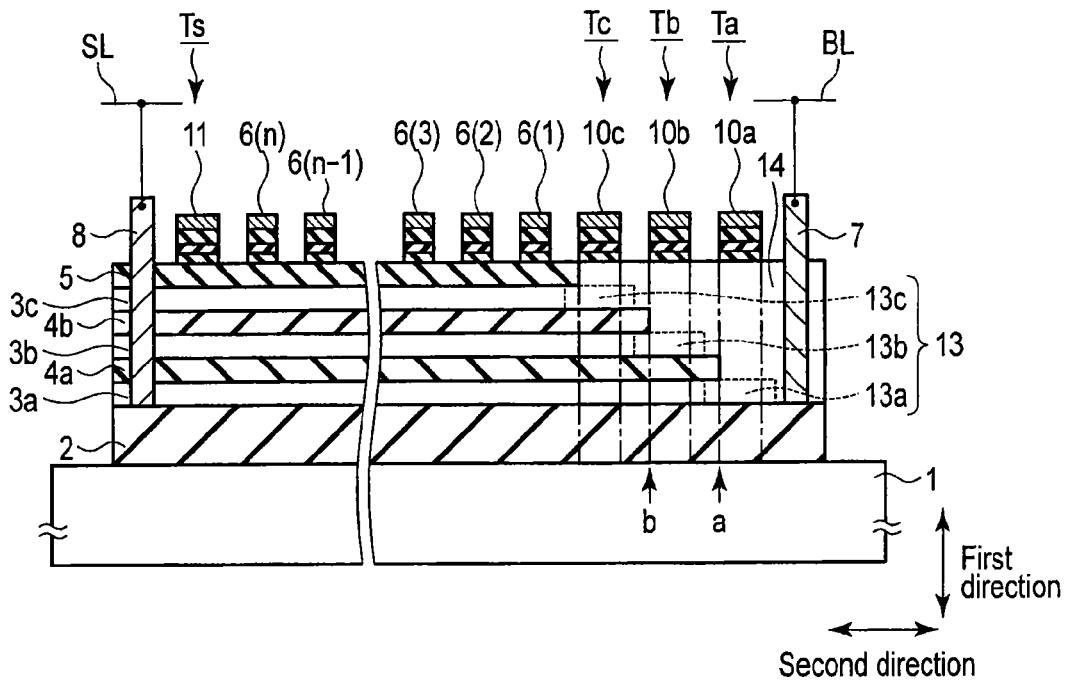
F I G. 4
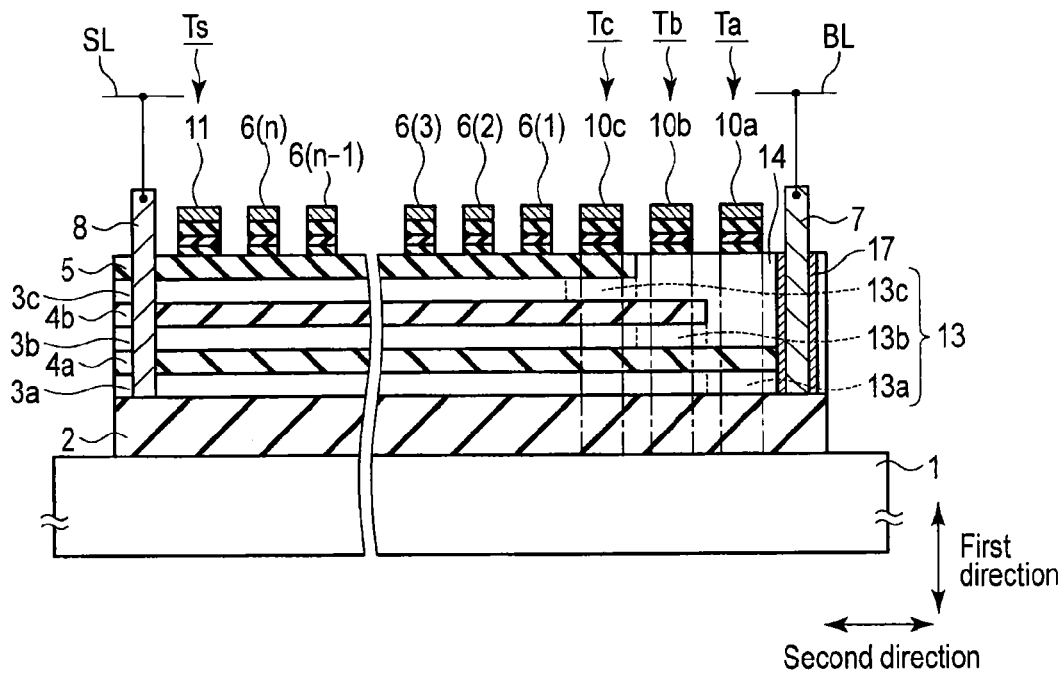
F I G. 5

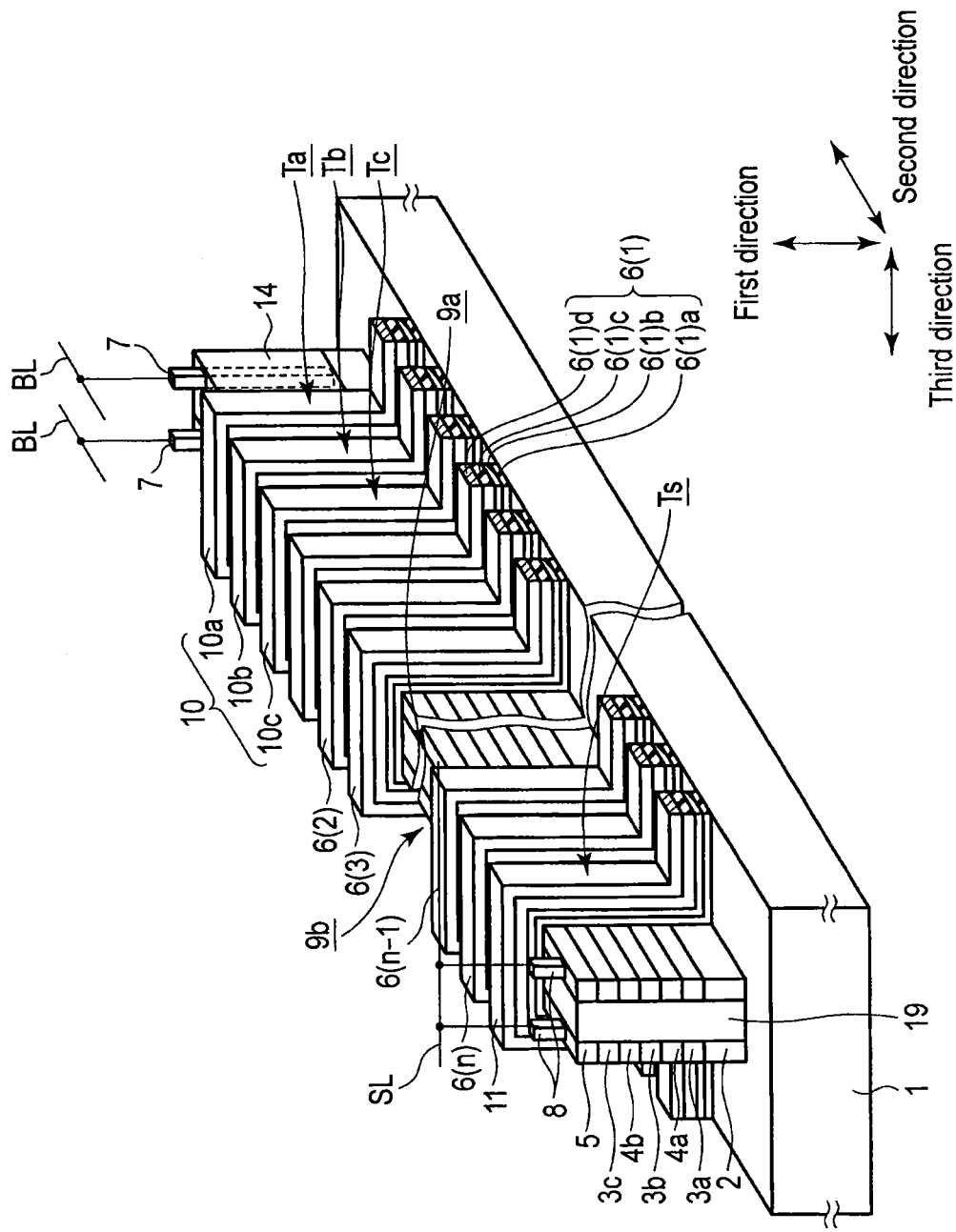
F I G. 6

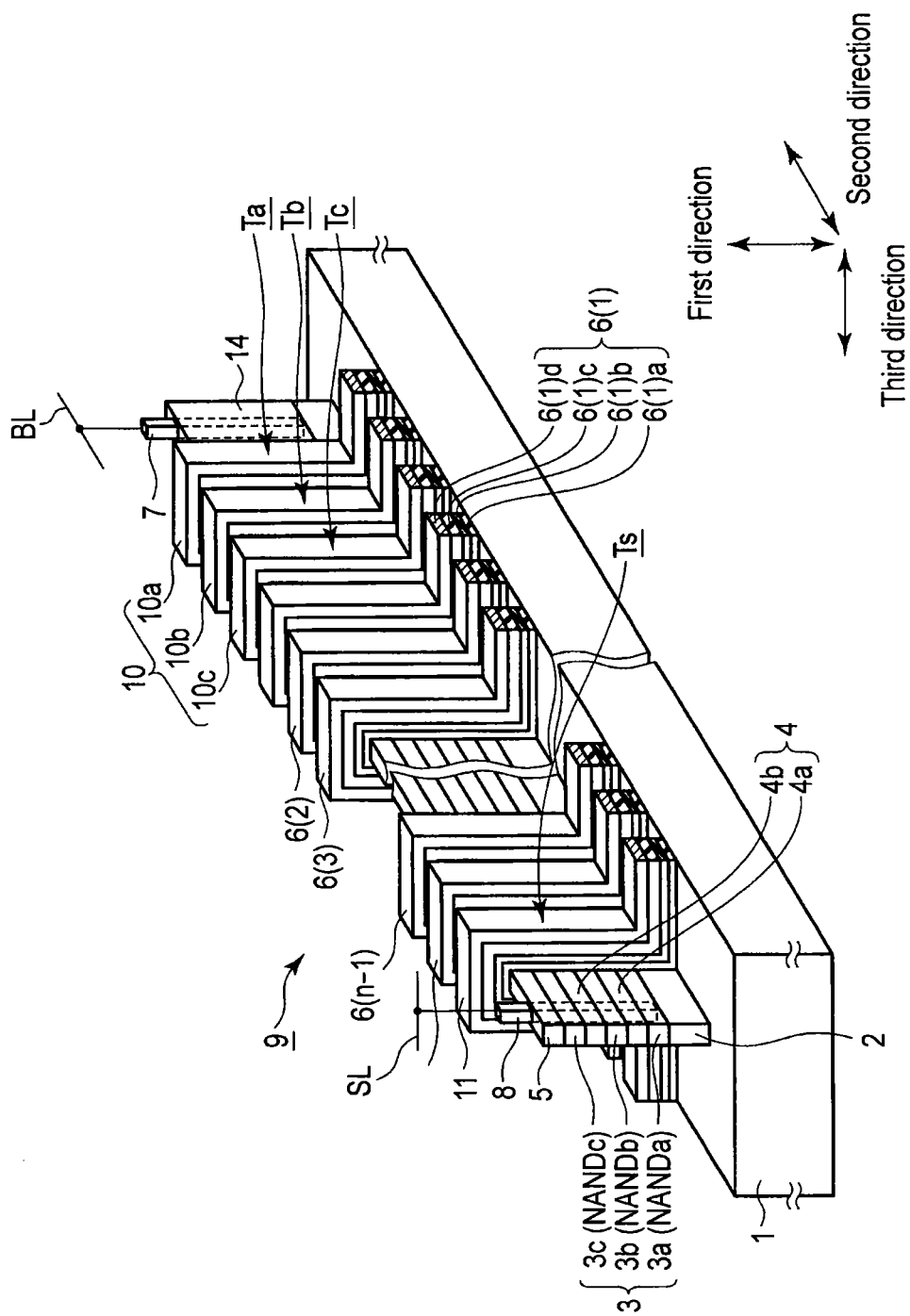
F I G. 8 F

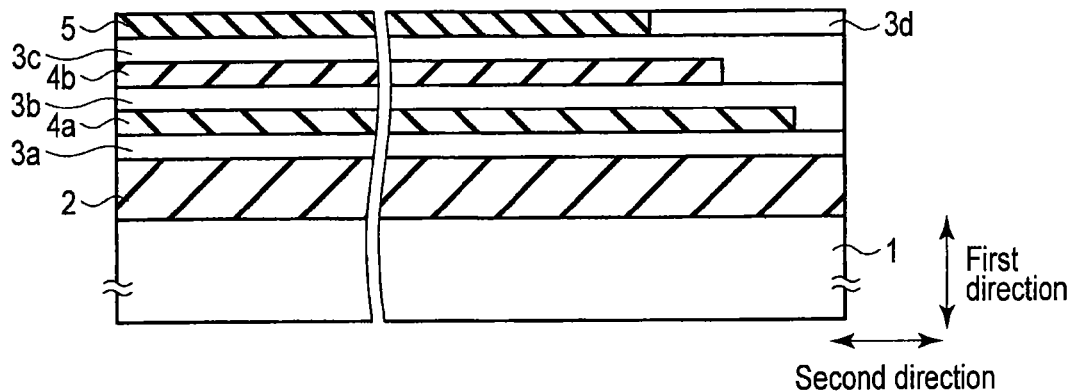
F I G. 9 A
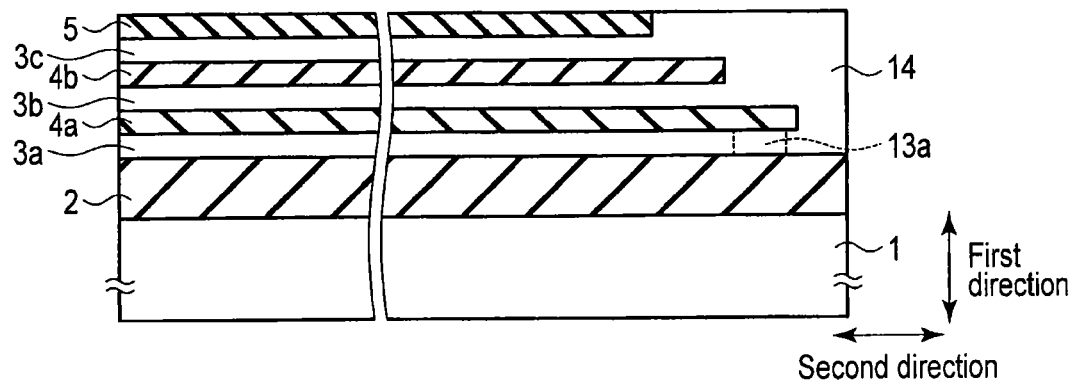
F I G. 9 B
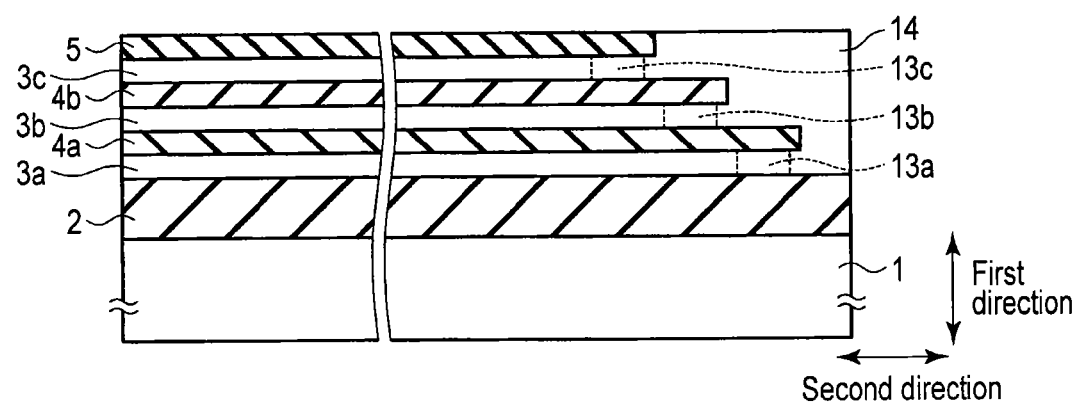
F I G. 9 C

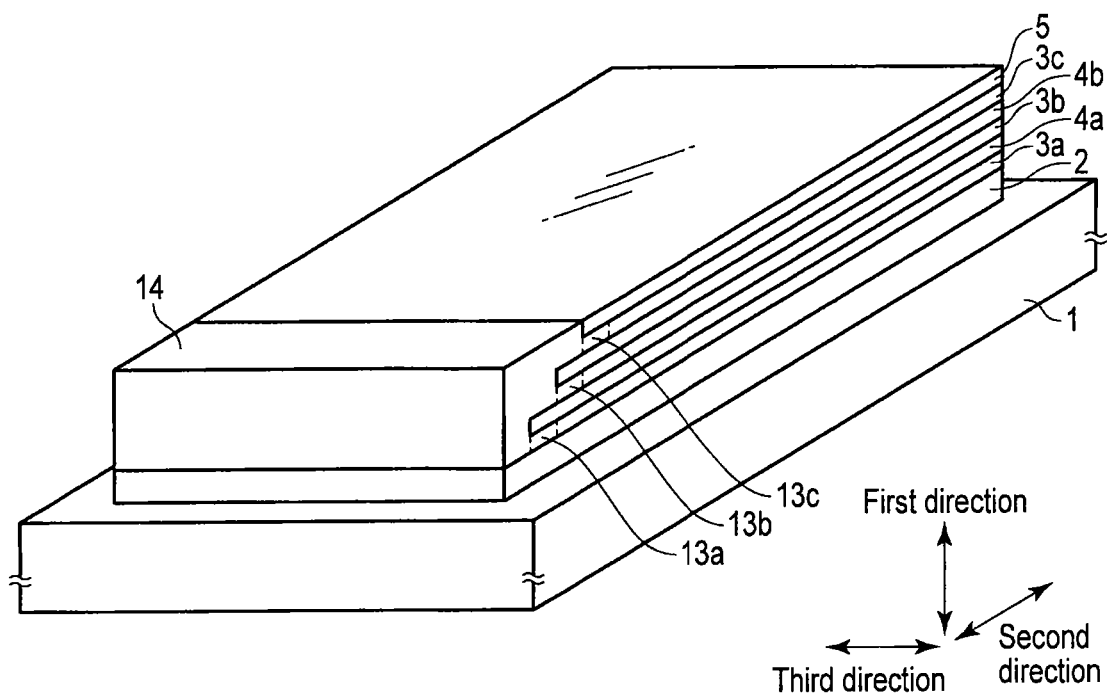
F I G. 10 C
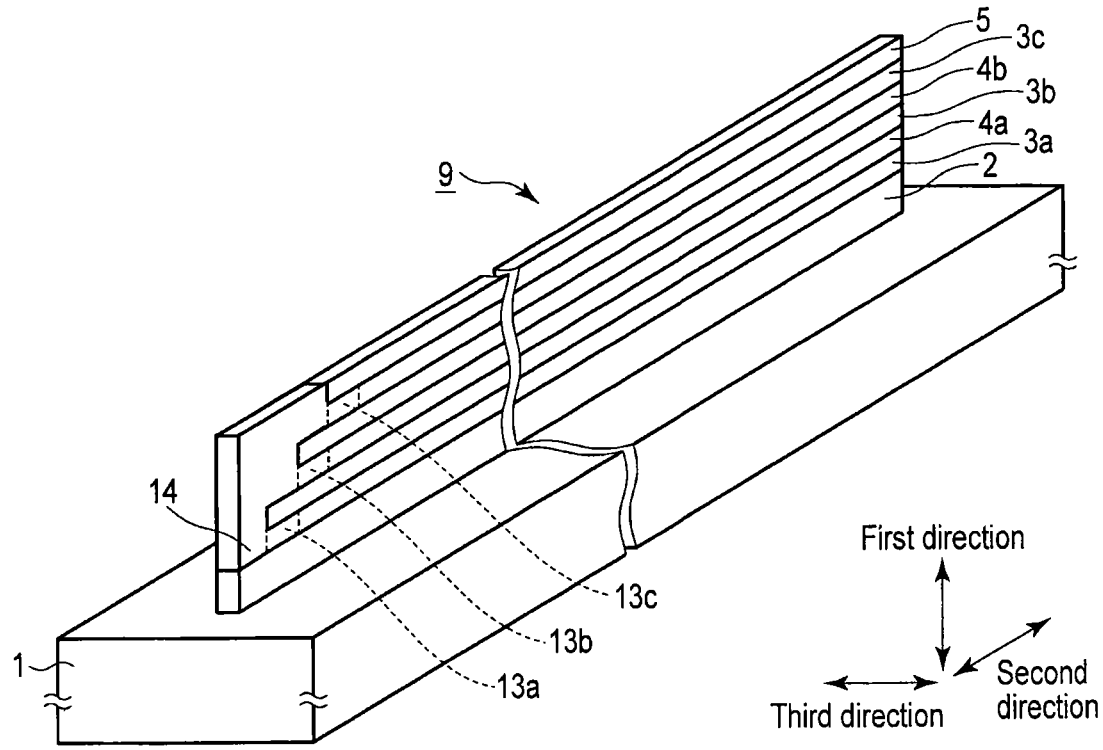
F I G. 10 D

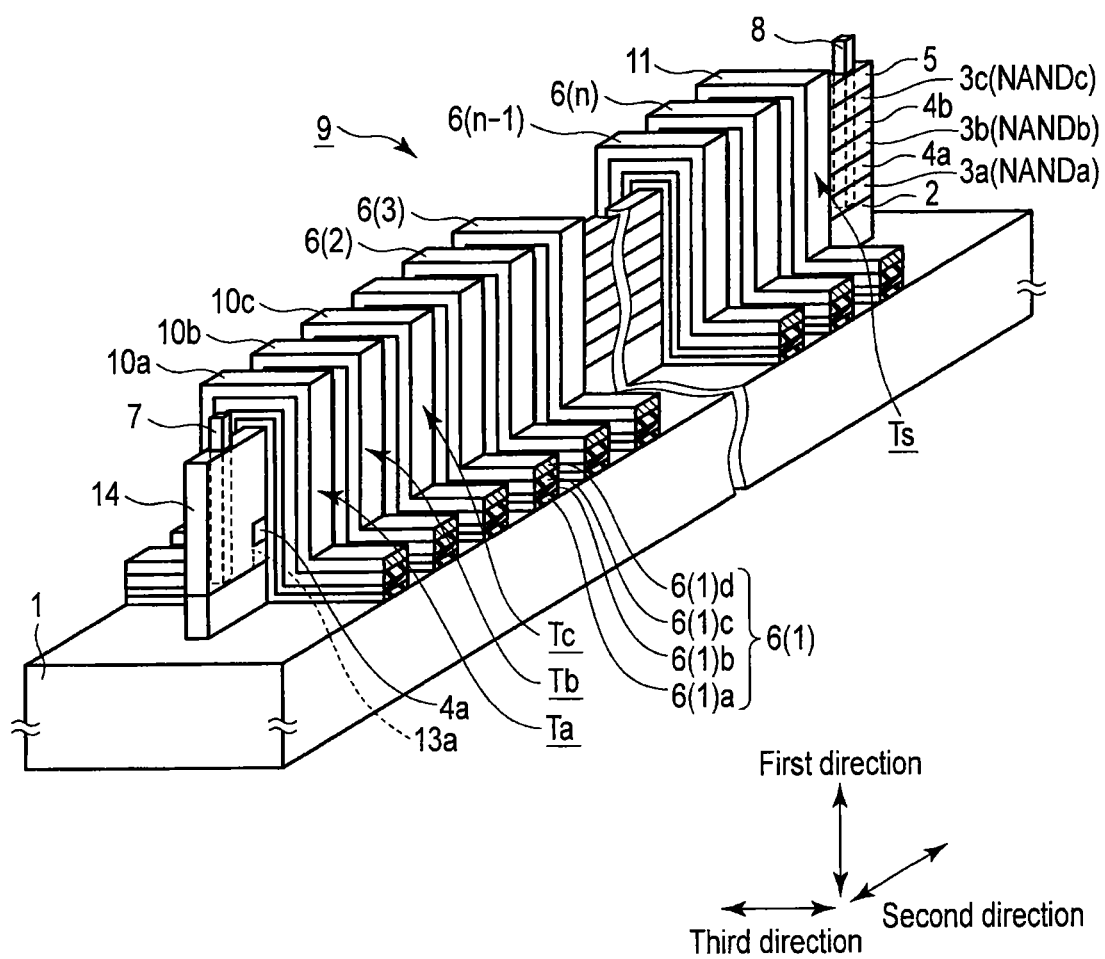
F I G. 10 E

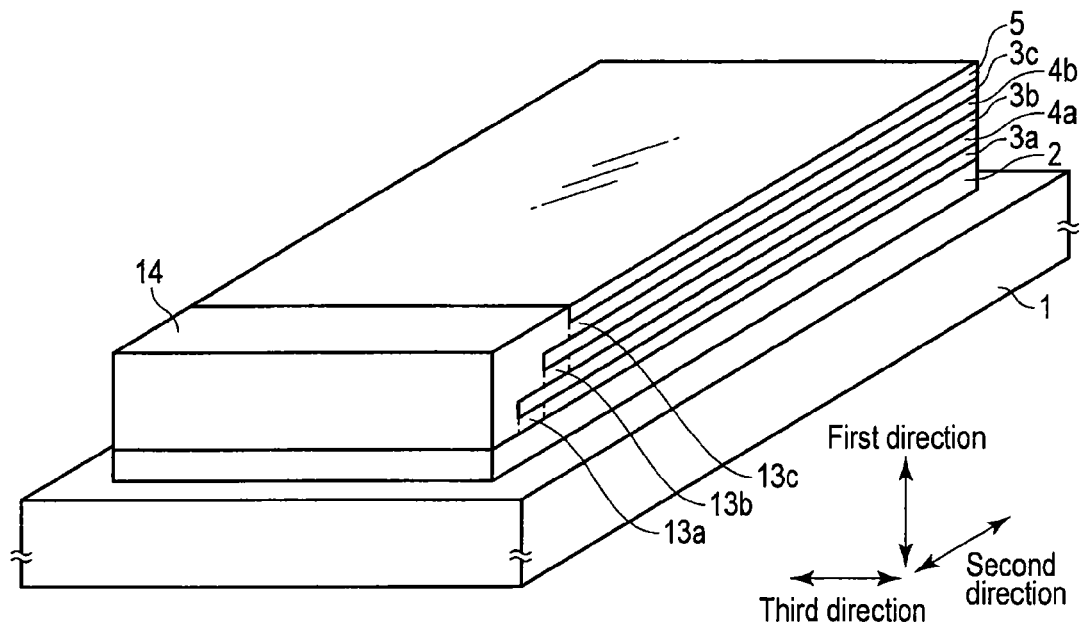
F I G. 14 C
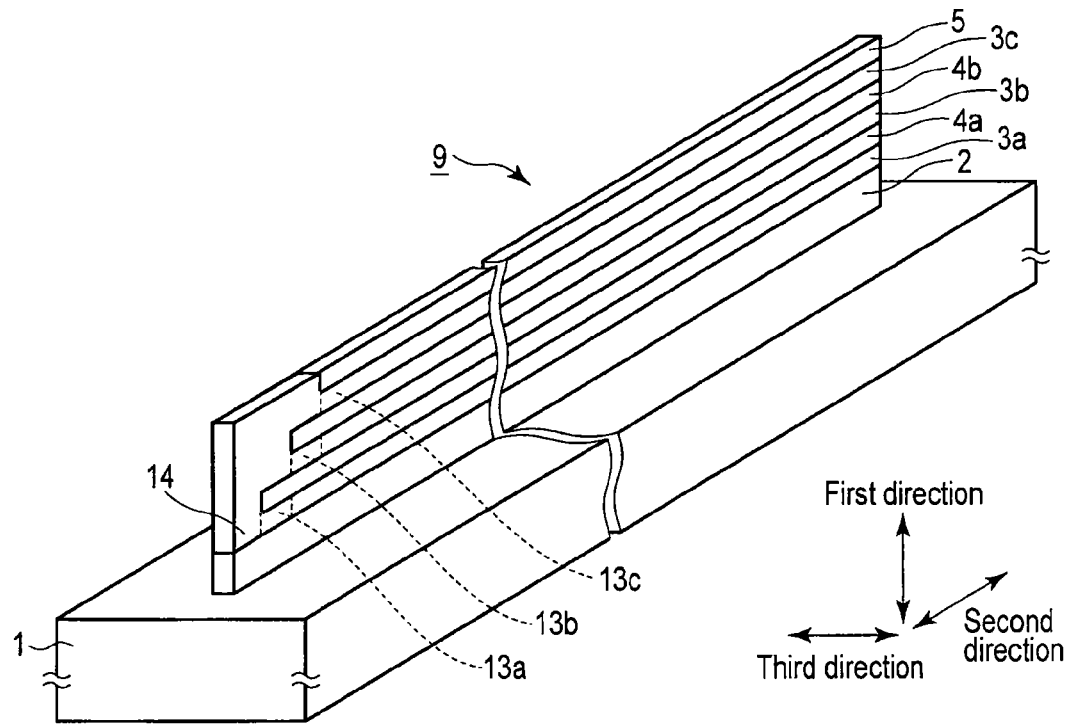
F I G. 14 D

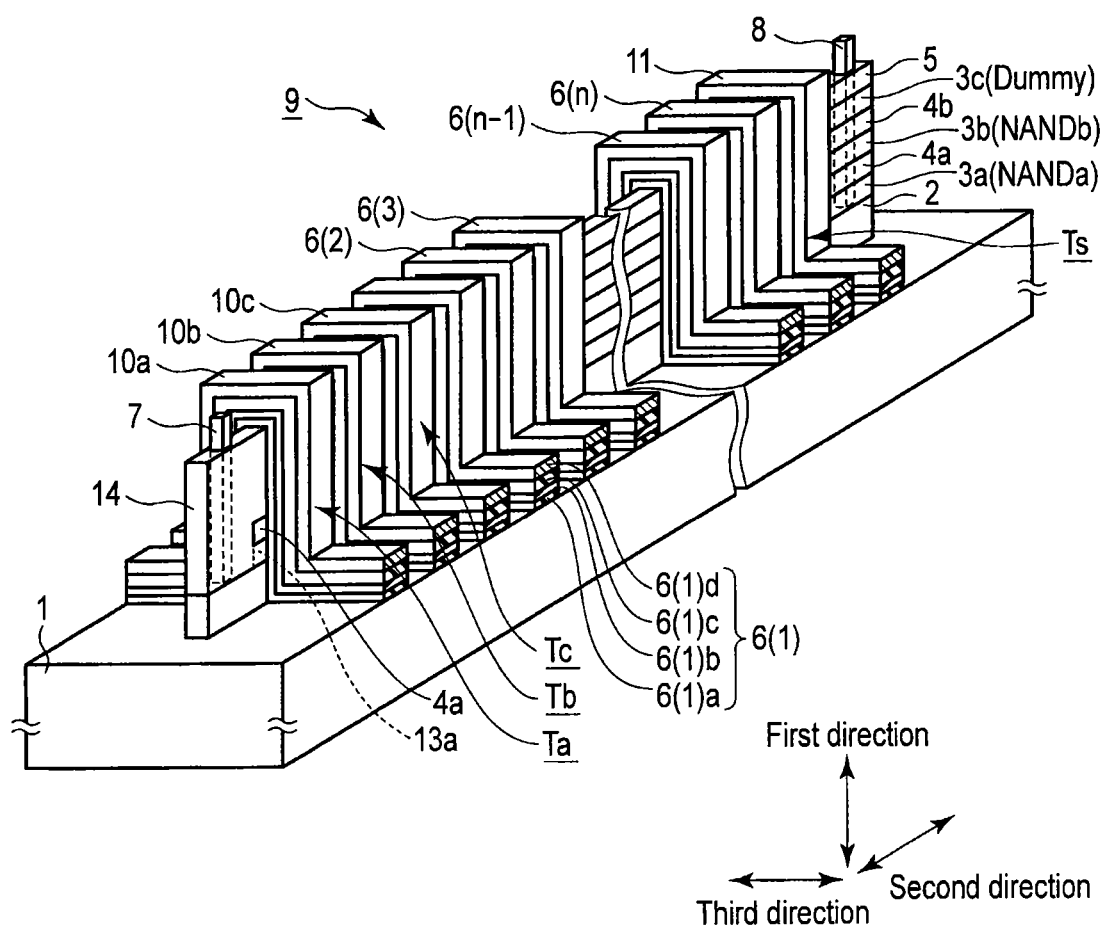
F I G. 14 E

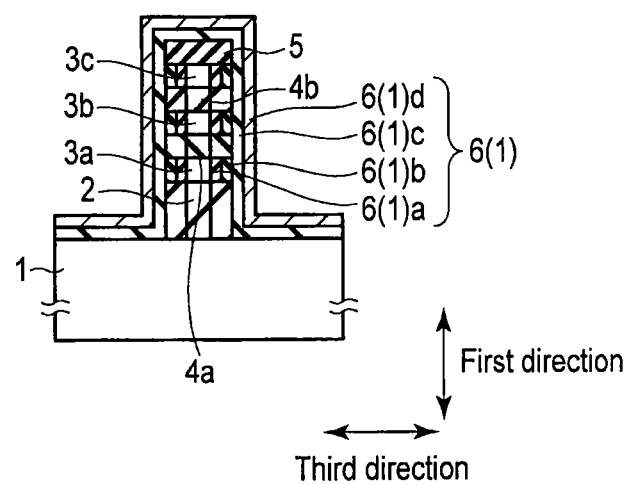
F I G. 17

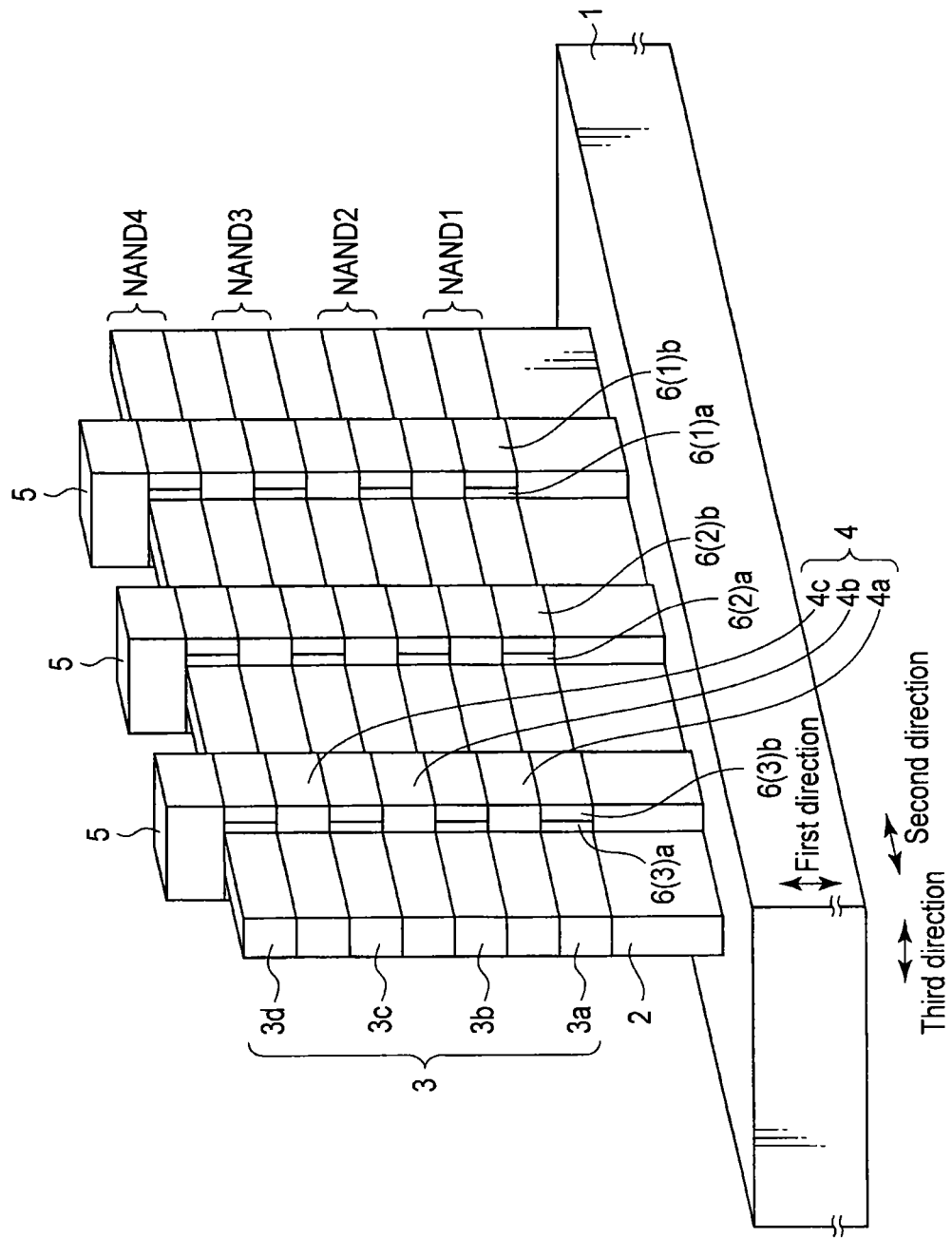
F I G. 18

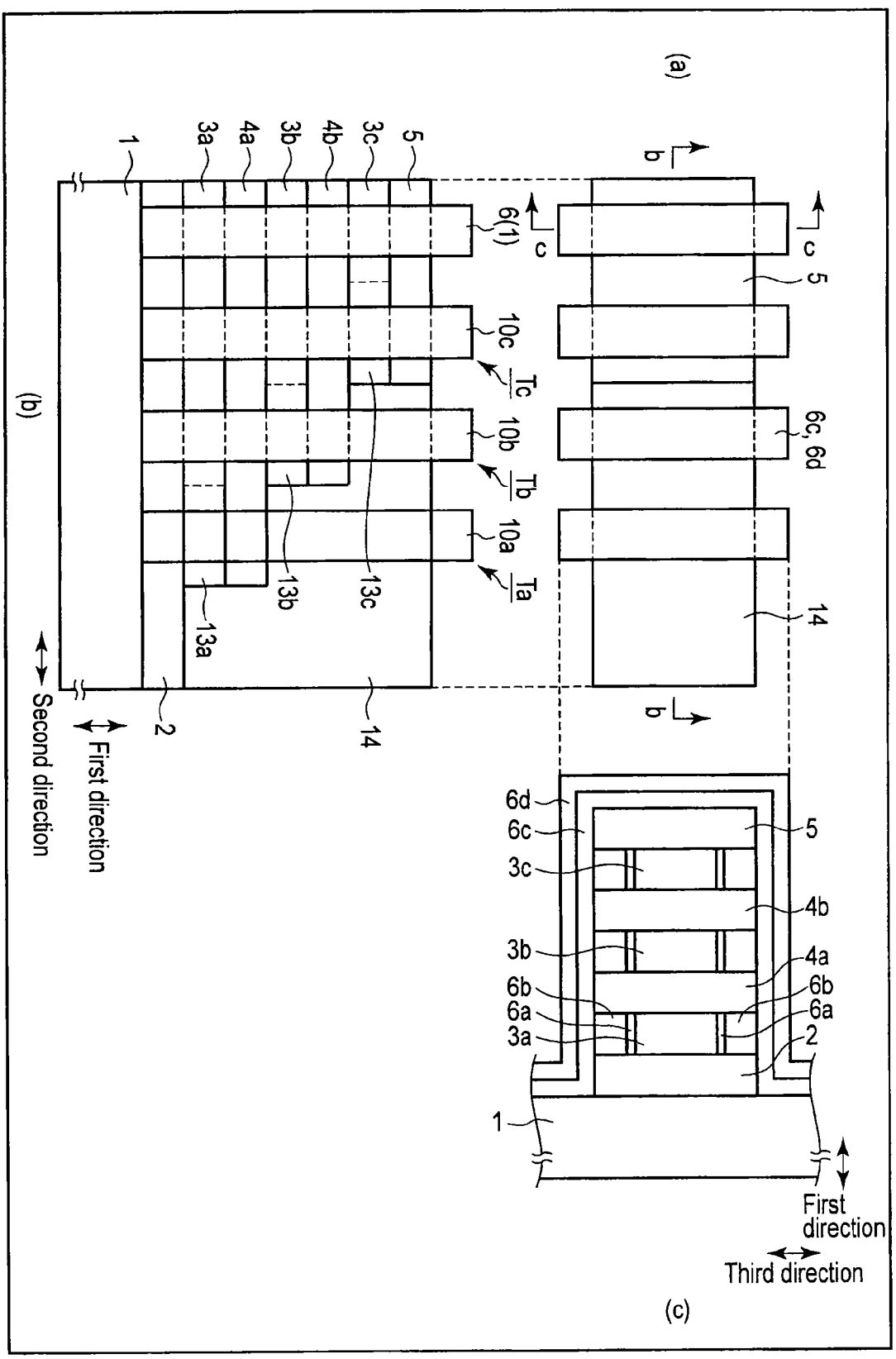
F I G. 19 G

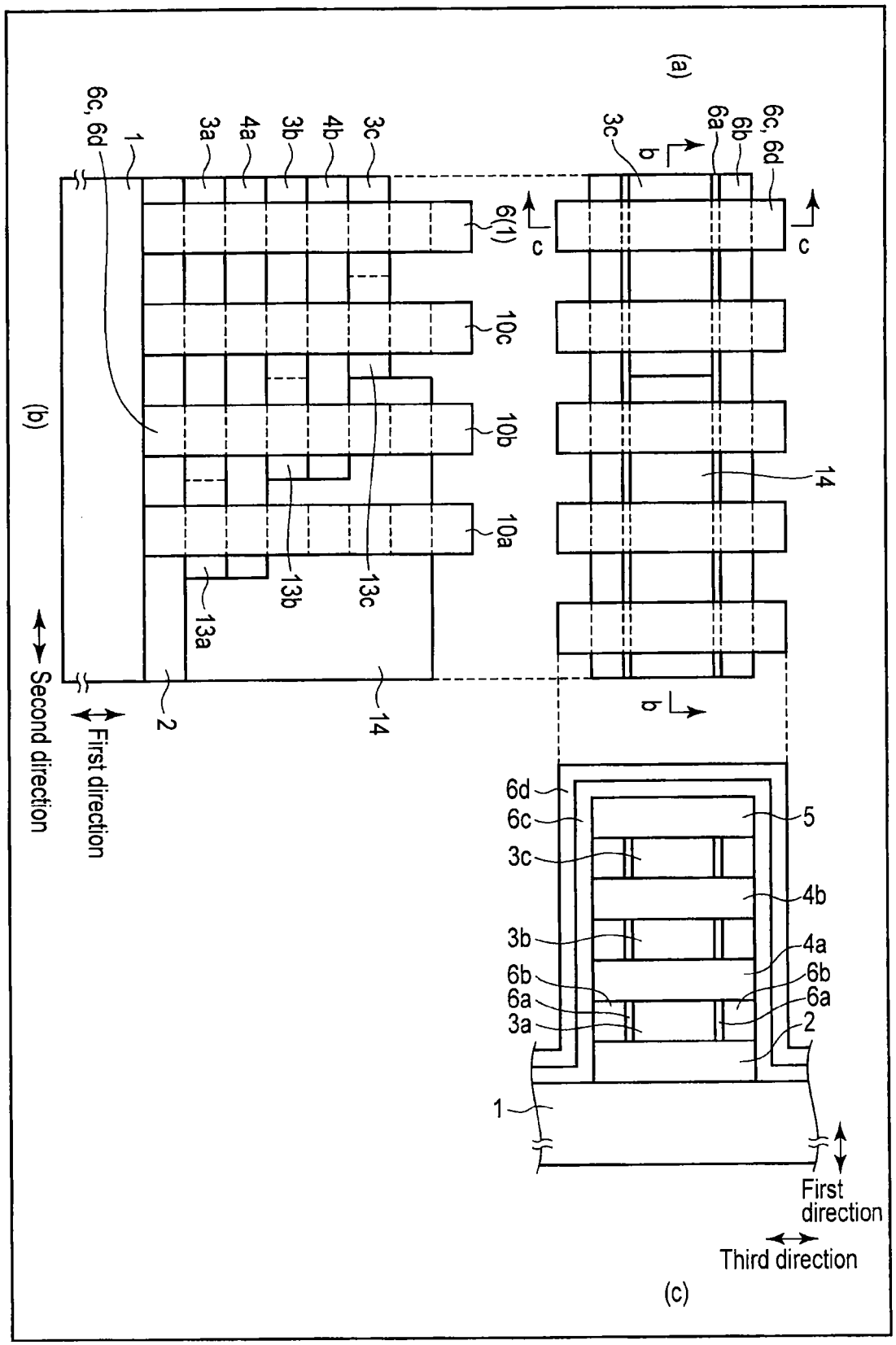
F I G. 19 J

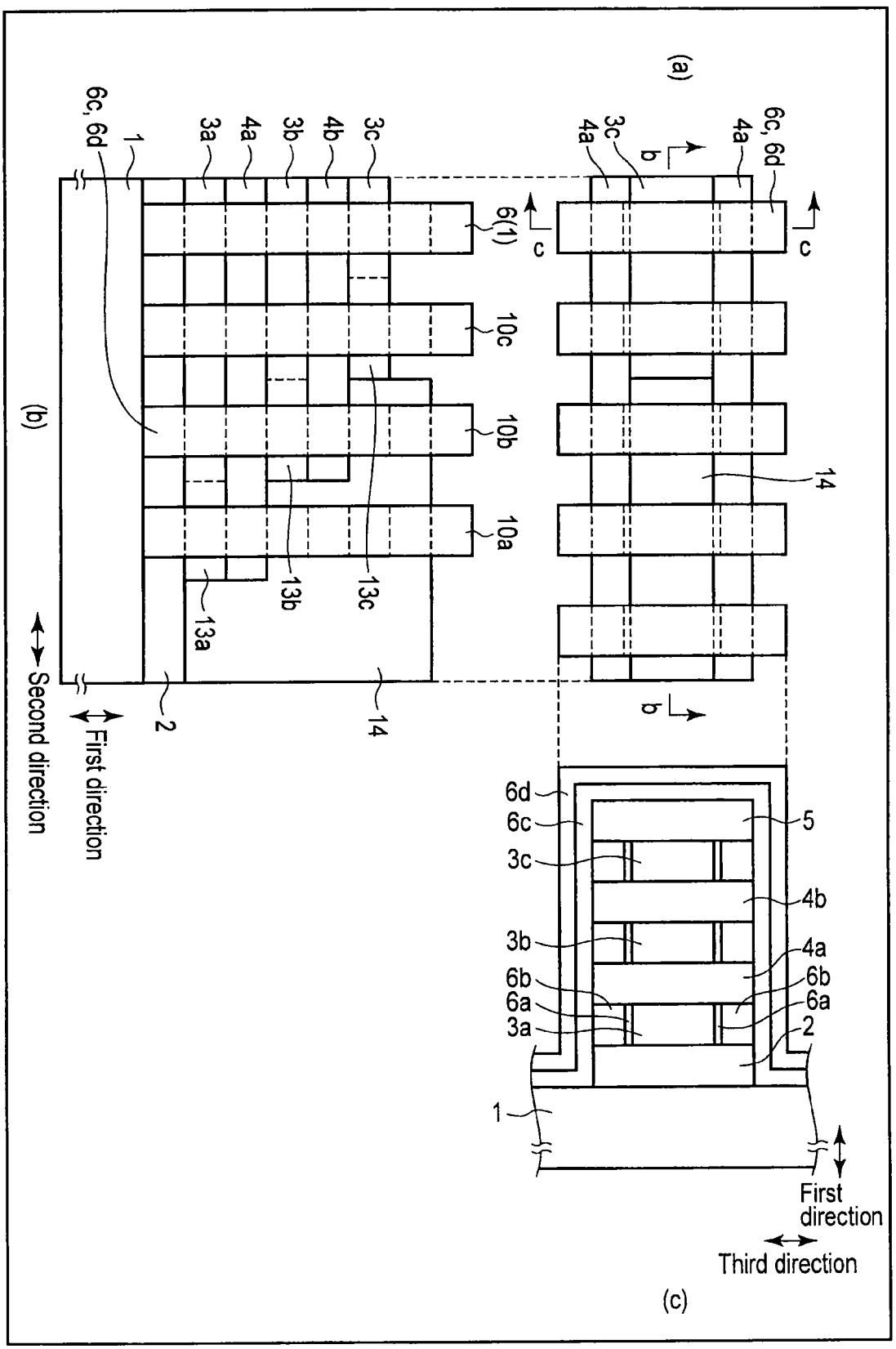
F I G. 19 K

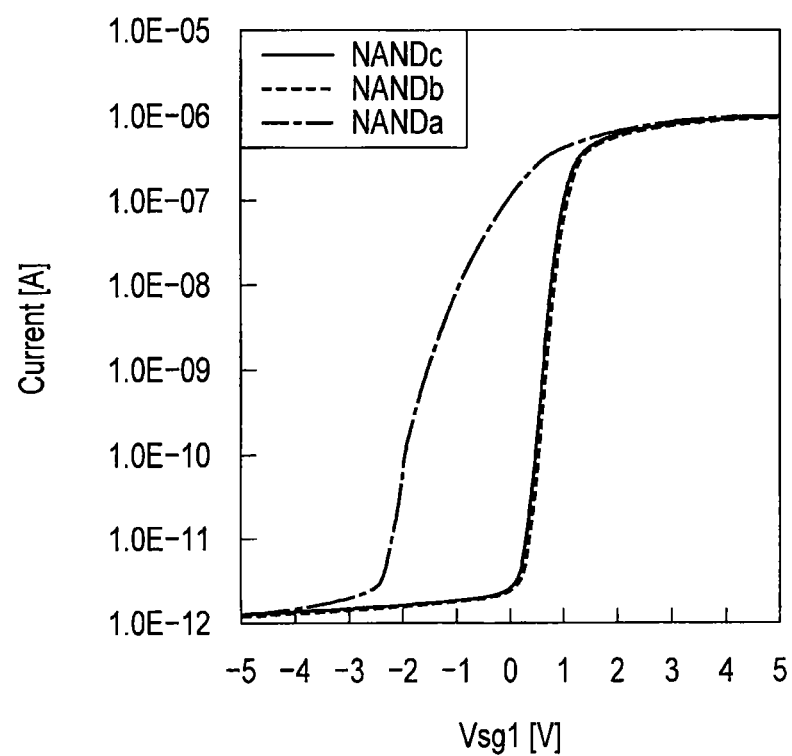
F I G. 21

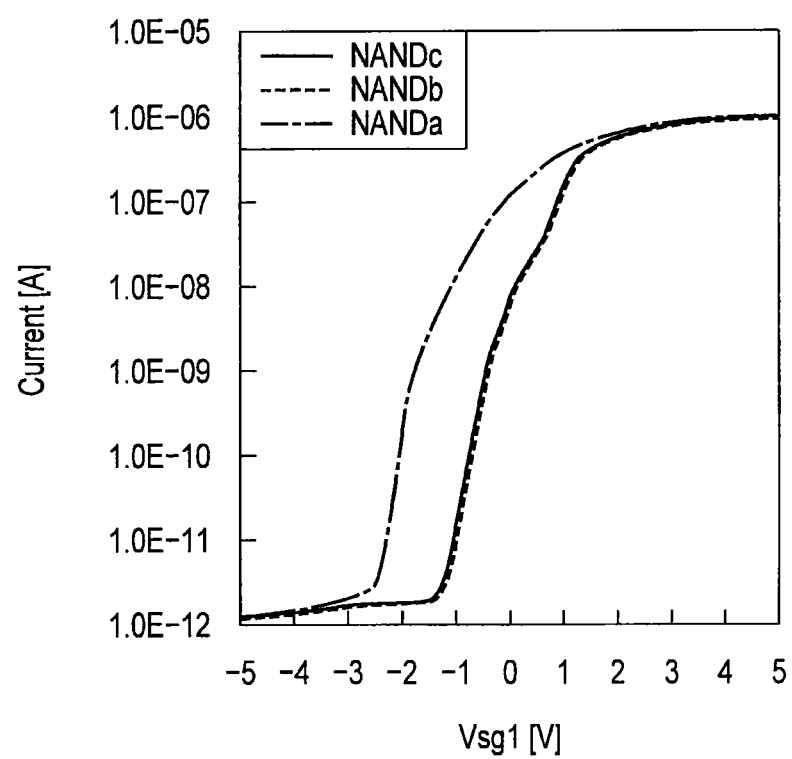
F I G. 23

NONVOLATILE SEMICONDUCTOR MEMORY DEVICE AND METHOD OF MANUFACTURING THE SAME

CROSS REFERENCE TO RELATED APPLICATIONS

This application is a Continuation Application of PCT Application No. PCT/JP2010/054772, filed Mar. 19, 2010, the entire contents of which are incorporated herein by reference.

FIELD

Embodiments described herein relate generally to a nonvolatile semiconductor memory device and a method of manufacturing the same.

BACKGROUND

A NAND-type flash memory is widespread as a storage device for a large volume of data. At present, memory cells are miniaturized for cost reduction and capacity increase per bit. Further miniaturization in the future is demanded. However, further miniaturization of the flash memory involves many problems to be solved, such as the development of lithography technology, a short channel effect, inter-element interference, and the inhibition of inter-element variations. Therefore, there is a strong possibility that future continuous improvement of storage density only by the development of simple in-plane miniaturization technology is difficult.

Accordingly, in order to raise the degree of memory cell integration, there has recently been suggested a three-dimensional stacked layer type semiconductor memory in which memory cells are three-dimensionally arranged.

In the conventional flash memories, drain ends of active areas (semiconductor layers) that are stacked are isolated from each other by an insulating layer, and one drain-side select transistor is provided for the active areas. Drain electrodes (contact plugs) are independently connected to the active areas, respectively.

However, in this structure, the drain electrode is formed for each memory string (active area), and regions to form the drain electrodes are therefore needed. As a result, increasing the number of memory strings to be stacked is not a great contribution to the improvement in the degree of memory cell integration because the regions to form the drain electrodes increase proportionately.

Another problem is that one bit line is connected to one memory string via the drain electrode so that the number of bit lines arranged on a memory cell array increases and their layout is complicated.

In view of such circumstances, there has been suggested a technique to connect drain ends of stacked active areas by a common semiconductor layer and provide drain-side select transistors (layer select transistors) for the active areas (e.g., refer to FIG. 13 in PCT/JP2009/060803).

According to this technique, one common drain electrode (contact plug) has only to be connected to memory strings (active areas). Therefore, the degree of memory cell integration can be improved by increasing the number of memory strings to be stacked.

However, intensive studies by the present inventors have proved that sufficient cut-off characteristics for the drain-side select transistors (layer select transistors) cannot be obtained by the device structure disclosed in the prior application). That is, when a current is passed through one selected memory string, unnecessary currents are also passed through the remaining unselected memory strings. This prevents accurate reading/writing/erasing.

BRIEF DESCRIPTION OF THE DRAWINGS

FIG. 2 is a view taken along the line II-II of FIG. 1;
FIG. 3 is a view taken along the line of FIG. 1;
FIG. 4 is a view showing the range of the position of the edge of an insulating layer on the side of a drain electrode;
FIG. 5 is a view showing a first application;
FIG. 6 is a view showing a second application;
FIGS. 8A to 8F are views, each showing a first example of a method of manufacturing the structure in FIG. 1;
FIGS. 9A to 9C are views, each showing a second example of a method of manufacturing the structure in FIG. 1;
FIGS. 10A to 10E are views, each showing a third example of a method of manufacturing the structure in FIG. 1;
FIG. 17 is a view taken along the line XVII-XVII of FIG. 15;
FIG. 18 is a view showing the structure in FIG. 15;
FIG. 21 is a graph showing the results of the simulation in FIG. 20;
FIG. 23 is a graph showing the results of the simulation in FIG. 22.

DETAILED DESCRIPTION

Figure 1:
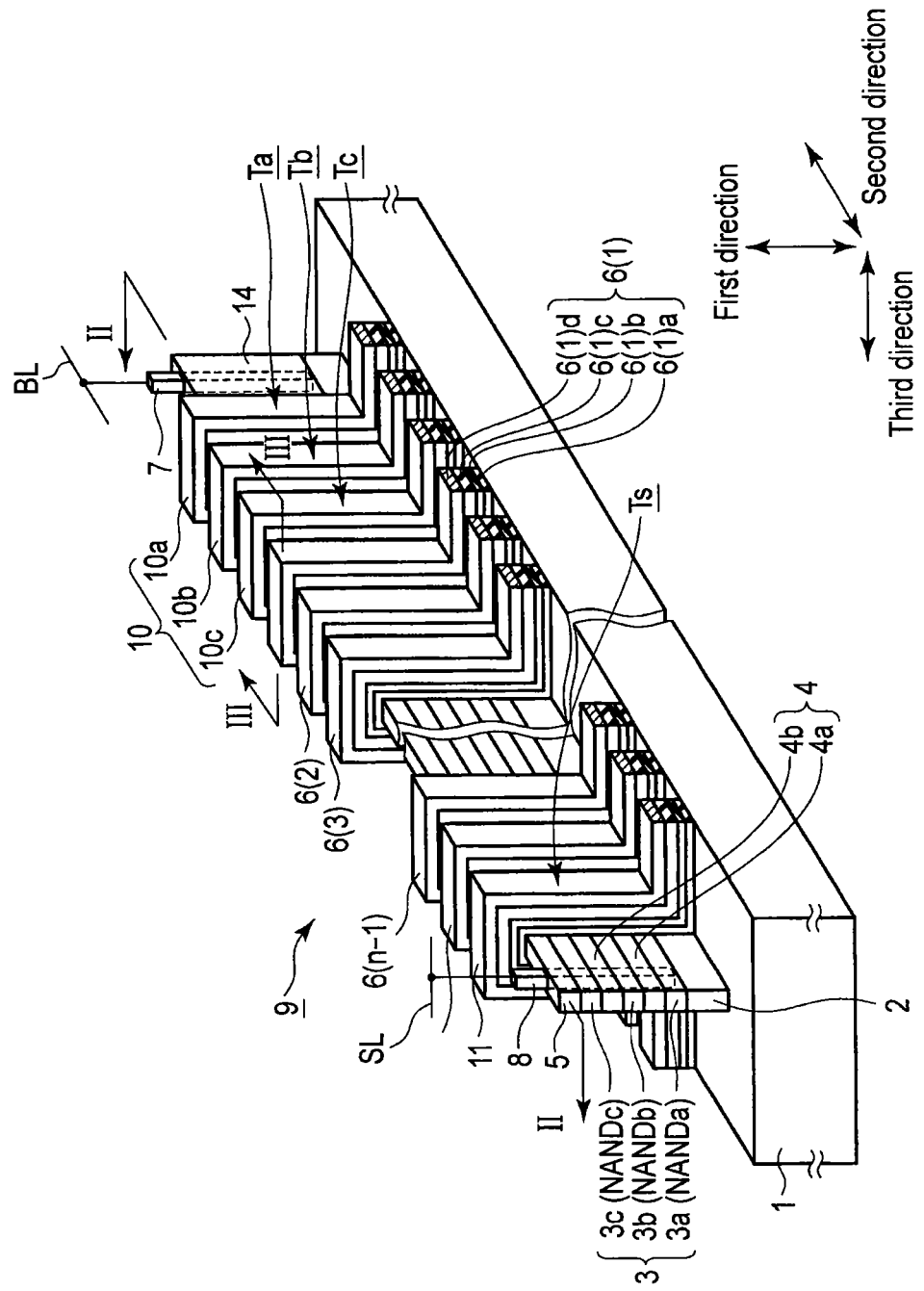
FIG. 1 is a view showing a structure of a first embodiment.

In general, according to one embodiment, a nonvolatile semiconductor memory device comprises: a semiconductor substrate; a fin-type stacked layer structure in which a first insulating layer, a first semiconductor layer, . . . an n-th insulating layer, an n-th semiconductor layer, and an (n+1)-th insulating layer (n is a natural number equal to or more than 2) are stacked in order thereof in a first direction perpendicular to a surface of the semiconductor substrate and which extends in a second direction parallel to the surface of the semiconductor substrate; first to n-th memory strings which use the first to n-th semiconductor layers as channels respectively; a common semiconductor layer which combines the first to n-th semiconductor layers at first ends of the first to n-th memory strings in the second direction; a drain electrode connected to the common semiconductor layer; a source electrode connected to the first to n-th semiconductor layers at second ends of the first to n-th memory strings in the second direction; and first to n-th layer select transistors arranged in order from the drain electrode to the first to n-th memory strings between the first to n-th memory strings and the drain electrode, wherein the first to n-th layer select transistors comprise first to n-th select gate electrodes extending in the first direction respectively, a drain side edge of an i-th insulating layer (i is one of 2 to n) among the first to (n+1)-th insulating layers is located at the same position as a memory string side edge of an (i−1)-th select gate electrode or located closer to the drain electrode than the memory string side edge of the (i−1)-th select gate electrode, where the drain side edge is a edge which is near the drain electrode, and the memory string side edge is a edge which is near the first to n-th memory strings, and a j-th layer select transistor (j is one of 1 to n) among the first to n-th layer select transistors is normally-on in a j-th semiconductor layer.

Hereinafter, embodiments will be described in detail with reference to the drawings.

1. BASIC CONCEPT

The embodiment is intended for a three-dimensional stacked layer type semiconductor memory comprising first to n-th layer select transistors (n is a natural number equal to or more than 2) at the drain-electrode-side ends of first to n-th semiconductor layers that constitute a fin-type stacked layer structure. According to this structure, one common drain electrode is provided for the first to n-th semiconductor layers, and a high degree of integration can be obtained.

Here, if the j-th layer select transistor (j is one of 1 to n) among the first to n-th layer select transistors is normally-on in a j-th semiconductor layer, the first to n-th semiconductor layers can be selected (layer selection), that is, first to n-th memory strings can be selected.

The embodiment is also intended for a structure in which the drain-electrode-side ends of first to n-th semiconductor layers that constitute a fin-type stacked layer structure are combined to one another by a common semiconductor layer. According to this structure, channels of first to n-th layer select transistors are thicker, and their on-resistance is lower, so that the selection of the first to n-th semiconductor layers can be faster.

Figure 13:
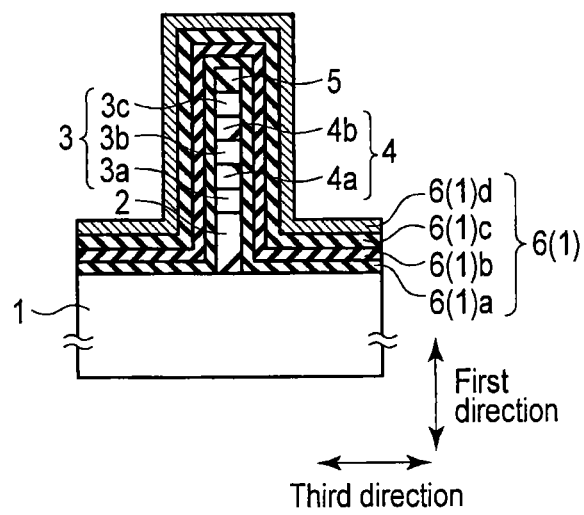
FIG. 13 is a view taken along the line XIII-XIII of FIG. 11.

This structure is shown, for example, in FIG. 13 of PCT/JP2009/060803 as a prior application.

According to the embodiment, in such a three-dimensional stacked layer type semiconductor memory, the drain-electrode-side edge of an i-th insulating layer (i is one of 2 to n) among first to (n+1)-th insulating layers that constitute a fin-type stacked layer structure is located at the same position as the edge of an (i−1)-th select gate electrode of the (i−1)-th layer select transistor on the side of the first to n-th memory strings or located closer to the side of the drain electrode, in order to improve the cut-off characteristics of the first to n-th layer select transistors.

Thus, the position of the edge of the i-th insulating layer on the side of the drain electrode is adjusted so that when a current is passed through one selected memory string, unnecessary currents do not run through the remaining unselected memory strings, and reading/writing/erasing can be accurately performed.

2. EMBODIMENTS

(1) First Embodiment

A. Structure

FIG. 1 shows a structure according to the first embodiment. FIG. 2 is a sectional view taken along the line II-II of FIG. 1. FIG. 3 is a sectional view taken along the line of FIG. 1.

Semiconductor substrate 1 is, for example, a silicon substrate. Fin-type stacked layer structure 9 is formed on semiconductor substrate 1.

In the present embodiment, fin-type stacked layer structure 9 is a stack in which first insulating layer 2, first semiconductor layer 3a, second insulating layer 4a, second semiconductor layer 3b, third insulating layer 4b, third semiconductor layer 3c, and fourth insulating layer 5 are stacked in order in a first direction perpendicular to the surface of semiconductor substrate 1. This stack extends in a second direction parallel to the surface of semiconductor substrate 1.

However, fin-type stacked layer structure 9 is not limited thereto, and can be generalized as a stack in which a first insulating layer, a first semiconductor layer, . . . an n-th insulating layer, an n-th semiconductor layer, and an (n+1)-th insulating layer (n is a natural number equal to or more than 2) are stacked in order.

First insulating layer 2 is made of, for example, silicon oxide ($SiO_2$). First to third semiconductor layers 3 (3a, 3b, and 3c) are made of, for example, monocrystalline silicon (Si). First to third semiconductor layers 3 (3a, 3b, and 3c) are preferably monocrystalline, but may be amorphous or polycrystalline.

Second and third insulating layers 4 (4a and 4b) are made of, for example, silicon oxide ($SiO_2$). Fourth insulating layer 5 is made of, for example, silicon oxide ($SiO_2$), silicon nitride ($SiN_x$), or a structure having a stack of these materials.

First to third memory strings (NANDa, NANDb, and NANDc) use first to third semiconductor layers 3 (3a, 3b, and 3c) as channels. Here, one memory string uses one semiconductor layer as a channel. Therefore, it is preferable for higher integration to increase the number of semiconductor layers that constitute fin-type stacked layer structure 9 and increase the number of memory strings.

First to third memory strings (NANDa, NANDb, and NANDc) have stacked layer structures of charge storage layer 6(1)b and control gate electrode 6(1)d extending in the first direction across first to third semiconductor layers 3 (3a, 3b, and 3c).

First gate insulating layer 6(1)a is formed between first to third semiconductor layers 3 (3a, 3b, and 3c) and charge storage layer 6(1)b. Second gate insulating layer 6(1)c is formed between charge storage layer 6(1)b and control gate electrode 6(1)d.

In this embodiment, first to third memory strings (NANDa, NANDb, and NANDc) have a silicon/oxide/nitride/oxide/silicon (SONOS) type. That is, charge storage layer 6(1)b is made of an insulator such as silicon-rich SiN. Second gate insulating layer 6(1)c serves to block a leakage current between charge storage layer 6(1)b and control gate electrode 6(1)d, and is therefore called a block insulating layer.

In this embodiment, first to third memory strings (NANDa, NANDb, and NANDc) cover two side surfaces of first to third semiconductor layers 3 (3a, 3b, and 3c) that face in a third direction. That is, first to third memory strings (NANDa, NANDb, and NANDc) have a double gate structure.

Common semiconductor layer 14 combines first to third semiconductor layers 3 (3a, 3b, and 3c) at the ends (ends on the side of drain electrode 7) of first to third memory strings (NANDa, NANDb, and NANDc) in a second direction.

Common semiconductor layer 14 is made of, for example, monocrystalline silicon (Si), and is integrated with first to third semiconductor layers 3 (3a, 3b, and 3c). Common semiconductor layer 14 is preferably monocrystalline as are first to third semiconductor layers 3 (3a, 3b, and 3c), but may be amorphous or polycrystalline.

Drain electrode 7 is connected to common semiconductor layer 14, and source electrode 8 is connected to first to third semiconductor layers 3 (3a, 3b, and 3c) at the ends of first to third memory strings (NANDa, NANDb, and NANDc) in the second direction. The bottoms of drain electrode 7 and source electrode 8 preferably reach first insulating layer 2.

Bit line BL is connected to drain electrode 7, and source line SL is connected to source electrode 8.

First to third layer select transistors Ta, Tb, and Tc are arranged in order from the side of drain electrode 7 to first to third memory strings (NANDa, NANDb, and NANDc) between first to third memory strings (NANDa, NANDb, and NANDc) and drain electrode 7. The number of layer select transistors is equal to the number of semiconductor layers that constitute fin-type stacked layer structure 9.

First to third layer select transistors Ta, Tb, and Tc have first to third select gate electrodes 10 (10a, 10b, and 10c) extending in the first direction across first to third semiconductor layers 3 (3a, 3b, and 3c).

In this embodiment, first to third select gate electrodes 10 (10a, 10b, and 10c) cover two side surfaces of first to third semiconductor layers 3 (3a, 3b, and 3c) that face in the third direction. That is, first to third layer select transistors Ta, Tb, and Tc have a double gate structure.

Source-side select transistor Ts is located between first to third memory strings (NANDa, NANDb, and NANDc) and source electrode 8.

Source-side select transistor Ts has select gate electrode 11 extending in the first direction across first to third semiconductor layers 3 (3a, 3b, and 3c).

In this embodiment, source-side select gate electrode 11 covers two side surfaces of first to third semiconductor layers 3 (3a, 3b, and 3c) that face in the third direction. That is, source-side select transistor Ts has a double gate structure.

First to third layer select transistors Ta, Tb, and Tc and source-side select transistor Ts are not limited in their structures as long as these transistors function as switch elements.

For example, first to third layer select transistors Ta, Tb, and Tc and source-side select transistor Ts may each have the same structure as that of each of the memory cells that constitute first to third memory strings (NANDa, NANDb, and NANDc), or may have a different structure.

The positions of the edges of second and third insulating layers 4 (4a and 4b) on the side of drain electrode 7 are described.

The edge of second insulating layer 4a on the side of drain electrode 7 is located at the same position as the edge of first select gate electrode 10a on the side of first to third memory strings (NANDa, NANDb, and NANDc) or located closer to the side of drain electrode 7.

For example, as shown in FIG. 4, the edge of second insulating layer 4a on the side of drain electrode 7 is located at point a or located closer to the side of drain electrode 7.

The edge of third insulating layer 4b on the side of drain electrode 7 is located at the same position as the edge of second select gate electrode 10b on the side of first to third memory strings (NANDa, NANDb, and NANDc) or located closer to the side of drain electrode 7.

For example, as shown in FIG. 4, the edge of third insulating layer 4b on the side of drain electrode 7 is located at point b or located closer to the side of drain electrode 7.

The above is generalized. Fin-type stacked layer structure 9 is a stack in which a first insulating layer, a first semiconductor layer, . . . an n-th insulating layer, an n-th semiconductor layer, and an (n+1)-th insulating layer (n is a natural number equal to or more than 2) are stacked in order. In this case, the edge of an i-th insulating layer (i is one of 2 to n) among first to (n+1)-th insulating layers on the side of the drain electrode is located at the same position as the edge of an (i−1)-th select gate electrode on the side of the first to n-th memory strings or located closer to the side of the drain electrode.

The edge of the i-th insulating layer on the side of the drain electrode is preferably located closer to the side of the drain electrode than the edge of an (i+1)-th insulating layer on the side of the drain electrode. In this case, the edges of first to (n+1)-th insulating layers on the side of the drain electrode are stepped.

The edge of the (i+1)-th insulating layer among the first to (n+1)-th insulating layers on the side of the drain electrode is preferably located at the same position as the edge of an (i−1)-th select gate electrode on the side of the first to n-th memory strings or located closer to the side of the first to n-th memory strings. This is because, for example, impurity regions 13a, 13b, and 13c are formed by one ion implantation, which will be described later in detail in connection with a manufacturing method.

The position of the edge of the uppermost (n+1)-th insulating layer on the side of the drain electrode is not particularly limited. This is because no semiconductor layer (memory string) as an active area is formed on the (n+1)-th insulating layer, that is, fourth insulating layer 5 in FIG. 1 to FIG. 3.

The threshold states of first to third layer select transistors Ta, Tb, and Tc are described.

First layer select transistor Ta which is farthest from first to third memory strings (NANDa, NANDb, and NANDc) is normally-on (uncontrollable) within the range of voltages applied to first select gate electrode 10a in lowermost first semiconductor layer 3a.

The normally-on state here is obtained by providing impurity region 13a in first semiconductor layer 3a as a channel of first layer select transistor Ta.

In other second and third semiconductor layers 3b and 3c, the on/off of first layer select transistor Ta is controlled within the range of voltages applied to first select gate electrode 10a.

Second layer select transistor Tb is normally-on (uncontrollable) within the range of voltages applied to second select gate electrode 10b in interlayer second semiconductor layer 3b.

The normally-on state here is obtained by providing impurity region 13b in second semiconductor layer 3b as a channel of second layer select transistor Tb.

In other first and third semiconductor layers 3a and 3c, the on/off of second layer select transistor Tb is controlled within the range of voltages applied to second select gate electrode 10b.

Third layer select transistor Tc which is closest to first to third memory strings (NANDa, NANDb, and NANDc) is normally-on (uncontrollable) within the range of voltages applied to third select gate electrode 10c in uppermost third semiconductor layer 3c.

The normally-on state here is obtained by providing impurity region 13c in third semiconductor layer 3c as a channel of third layer select transistor Tc.

In other first and second semiconductor layers 3a and 3b, the on/off of third layer select transistor Tc is controlled within the range of voltages applied to third select gate electrode 10c.

The above is generalized. Fin-type stacked layer structure 9 is a stack in which a first insulating layer, a first semiconductor layer, . . . an n-th insulating layer, an n-th semiconductor layer, and an (n+1)-th insulating layer (n is a natural number equal to or more than 2) are stacked in order. In this case, a j-th layer select transistor (j is one of 1 to n) among first to n-th layer select transistors is normally-on in a j-th semiconductor layer.

According to such a structure, for example, first layer select transistor Ta is switched off in second and third memory strings NANDb and NANDc, all of first to third layer select transistors Ta, Tb, and Tc are switched on in first memory string NANDa, and a current is passed through first memory string NANDa. In this case, a leak path from first memory string NANDa to second and third memory strings NANDb and NANDc is cut off by second insulating layer 4a.

Similarly, for example, second layer select transistor Tb is switched off in first and third memory strings NANDa and NANDc, all of first to third layer select transistors Ta, Tb, and Tc are switched on in second memory string NANDb, and a current is passed through second memory string NANDb. In this case, a leak path from second memory string NANDb to third memory string NANDc is cut off by third insulating layer 4b.

In this way, unnecessary currents do not run through the unselected memory strings, and cut-off characteristics can be improved.

B. Material Examples

Materials best suited to the generations of the semiconductor memories can be properly selected as the materials that constitute the elements of the device structure shown in FIG. 1 to FIG. 3.

For example, first gate insulating layer 6(1)a can be $SiO_2$, charge storage layer 6(1)b can be $Si_3N_4$, second gate insulating layer 6(1)c can be $Al_2O_3$, and control gate electrode 6(1)d can be NiSi.

First gate insulating layer 6(1)a may be silicon oxynitride, or a stacked layer structure of silicon oxide and silicon nitride. First gate insulating layer 6(1)a may include silicon nanoparticles, metal ions, or the like.

Charge storage layer 6(1)b may be made of at least one of the materials selected from the group consisting of $Si_xN_y$ having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

Charge storage layer 6(1)b may otherwise be made of impurity-added polysilicon or a conductor such as a metal.

Second gate insulating layer 6(1)c may be made of at least one of the materials selected from the group consisting of silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), lanthanum aluminate ($LaAlO_3$), and lanthanum aluminum silicate (LaAlSiO).

Control gate electrode 6(1)d can be made of a metal compound such as tantalum nitride (TaN), tantalum carbide (TaC), or titanium nitride (TiN), or an electrically conductive metallic material such as V, Cr, Mn, Y, Mo, Ru, Rh, Hf, Ta, W, Ir, Co, Ti, Er, Pt, Pd, Zr, Gd, Dy, Ho, and Er and silicides of these substances.

As an impurity that constitutes impurity regions 13a, 13b, and 13c, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

C. First Application

FIG. 5 shows a first application of the first embodiment.

Here, the same elements as those in the first embodiment (FIG. 1 to FIG. 3) are provided with the same reference marks and are thus not described in detail.

The first application is characterized in that diffusion layer 17 surrounding drain electrode 7 is formed in common semiconductor layer 14.

Diffusion layer 17 can be made of an impurity serving as an n-type semiconductor, an impurity serving as a p-type semiconductor, or a combination of these substances, similarly to impurity regions 13a, 13b, and 13c.

Diffusion layer 17 serves to reduce contact resistance between common semiconductor layer 14 and drain electrode 7.

D. Second Application

FIG. 6 shows a second application of the first embodiment.

Here, the same elements as those in the first embodiment (FIG. 1 to FIG. 3) are provided with the same reference marks and are thus not described in detail.

The second application is characterized in that first to third select gate electrodes 10a, 10b, and 10c cover one of two side surfaces of first to third semiconductor layers 3 (3a, 3b, and 3c) that face in the third direction.

That is, first to third layer select transistors Ta, Tb, and Tc have a single gate structure.

In the present application, insulating layer 19 is located between two fin-type stacked layer structures 9a and 9b, and isolate the fin-type stacked layer structures 9a and 9b.

Insulating layer 19 can be replaced by an electrode.

In this case, a bias can be applied to the electrode during writing/erasing to improve writing/erasing characteristics.

E. Third Application

Figure 7:
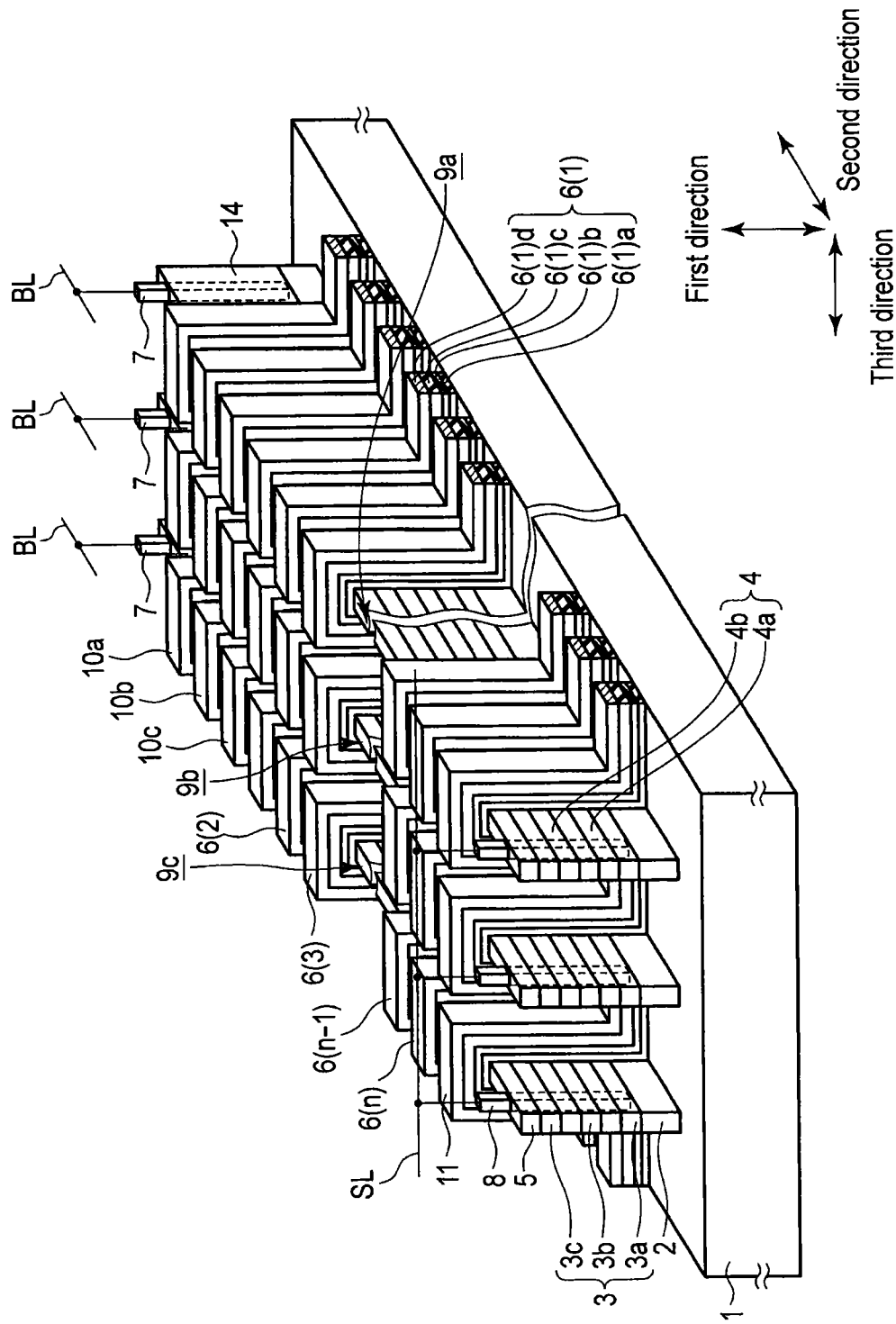
FIG. 7 is a view showing a third application.

FIG. 7 shows a third application of the first embodiment.

Here, the same elements as those in the first embodiment (FIG. 1 to FIG. 3) are provided with the same reference marks and are thus not described in detail.

The third application is characterized in that fin-type stacked layer structures 9a, 9b, and 9c are arranged in the third direction to constitute a memory cell array. Each fin-type stacked layer structure has the same structure as fin-type stacked layer structure 9 disclosed in FIG. 1 to FIG. 3.

Gate stacked layer structures 6(1), 6(2), ... 6(n) including control gate electrodes extend in the third direction across fin-type stacked layer structures 9a, 9b, and 9c. Similarly, gate stacked layer structures 10a, 10b, and 10c including select gate electrodes extend in the third direction across fin-type stacked layer structures 9a, 9b, and 9c.

Such an array structure enables a three-dimensional stacked layer type semiconductor memory having a high memory capacity.

F. Operations

The operations of the three-dimensional stacked layer type semiconductor memories according to the first embodiment (FIG. 1 to FIG. 3) and the first to third applications (FIG. 5 to FIG. 7) are described.

Write operation is as follows.

First, in writing in memory string NANDa that uses first semiconductor layer 3a as a channel, a ground potential is applied to drain electrode 7 and source electrode 8, and a first positive bias is applied to select gate electrodes 10b and 10c and control gate electrodes 6(1)d, . . . 6(n)d. No bias is applied to select gate electrodes 10a and 11.

At the same time, for example, n-type impurity storage regions are formed in first to third semiconductor layers 3 (3a, 3b, and 3c) serving as channels of first to third layer select transistors Ta, Tb, and Tc and first to third memory strings NANDa, NANDb, and NANDc.

As no bias is applied to select gate electrode 10a, first layer select transistor Ta is off in second and third semiconductor layers 3b and 3c, and is on in first semiconductor layer 3a owing to impurity region 13a. Moreover, as no bias is applied to select gate electrode 11, source-side select transistor Ts is off in first to third semiconductor layers 3 (3a, 3b, and 3c).

Subsequently, for example, a second positive bias higher than the first positive bias is applied to the control gate electrode of the selected memory cell targeted for writing, and program data "0"/"1" is transferred to drain electrode 7 from bit line BL.

In second and third semiconductor layers 3b and 3c in which unselected memory strings NANDb and NANDc are formed, the channel potential is increased by capacitive coupling resulting from the application of the second positive bias. Therefore, a sufficiently high voltage is not applied across the control gate electrode (or charge storage layer) and the channel, and writing is inhibited accordingly.

In first semiconductor layer 3a in which selected memory string NANDa is formed, first layer select transistor Ta is on. Thus, program data "0"/"1" is transferred to first semiconductor layer 3a as a channel.

When the program data is "0", first semiconductor layer 3a as the channel, for example, has a positive potential. In this condition, if the second positive bias is applied to the control gate electrode of the selected memory cell and the channel potential is slightly increased by the capacitive coupling, first layer select transistor Ta is cut off.

Therefore, in first semiconductor layer 3a, the channel potential is increased by the capacitive coupling resulting from the application of the second positive bias. That is, a sufficiently high voltage is not applied across the control gate electrode (or charge storage layer) and the channel, and electrons are not injected into the charge storage layer. Therefore, writing is inhibited ("0"-programming).

In contrast, when the program data is "1", first semiconductor layer 3a as the channel, for example, has a ground potential. In this condition, even if the second positive bias is applied to the control gate electrode of the selected memory cell, first layer select transistor Ta is not cut off.

Therefore, the ground potential is applied to first semiconductor layer 3a as the channel, and the second positive bias is applied to the control gate electrode. That is, a sufficiently high voltage is generated across the control gate electrode (or charge storage layer) and the channel, and electrons are injected into the charge storage layer. Therefore, writing is performed ("1"-programming).

Next, in writing in memory string NANDb that uses second semiconductor layer 3b as a channel, a ground potential is applied to drain electrode 7 and source electrode 8, and a first positive bias is applied to select gate electrodes 10a and 10c and control gate electrodes 6(1)d, . . . 6(n)d. No bias is applied to select gate electrodes 10b and 11.

At the same time, for example, n-type impurity storage regions are formed in first to third semiconductor layers 3 (3a, 3b, and 3c) serving as channels of first to third layer select transistors Ta, Tb, and Tc and first to third memory strings NANDa, NANDb, and NANDc.

As no bias is applied to select gate electrode 10b, second layer select transistor Tb is off in first and third semiconductor layers 3a and 3c, and is on in second semiconductor layer 3b owing to impurity region 13b. Moreover, as no bias is applied to select gate electrode 11, source-side select transistor Ts is off in first to third semiconductor layers 3 (3a, 3b, and 3c).

Subsequently, for example, a second positive bias higher than the first positive bias is applied to the control gate electrode of the selected memory cell targeted for writing, and program data "0"/"1" is transferred to drain electrode 7 from bit line BL.

In first and third semiconductor layers 3a and 3c in which unselected memory strings NANDa and NANDc are formed, the channel potential is increased by capacitive coupling resulting from the application of the second positive bias. Therefore, a sufficiently high voltage is not applied across the control gate electrode (or charge storage layer) and the channel, and writing is inhibited accordingly.

In second semiconductor layer 3b in which selected memory string NANDb is formed, second layer select transistor Tb is on. Thus, program data "0"/"1" is transferred to second semiconductor layer 3b as a channel.

When the program data is "0", second semiconductor layer 3b as the channel, for example, has a positive potential. In this condition, if the second positive bias is applied to the control gate electrode of the selected memory cell and the channel potential is slightly increased by the capacitive coupling, second layer select transistor Tb is cut off.

Therefore, in second semiconductor layer 3b, the channel potential is increased by the capacitive coupling resulting from the application of the second positive bias. That is, a sufficiently high voltage is not applied across the control gate electrode (or charge storage layer) and the channel, and electrons are not injected into the charge storage layer. Therefore, writing is inhibited ("0"-programming).

In contrast, when the program data is "1", second semiconductor layer 3b as the channel, for example, has a ground potential. In this condition, even if the second positive bias is applied to the control gate electrode of the selected memory cell, second layer select transistor Tb remains on.

Therefore, the ground potential is applied to second semiconductor layer 3b as the channel, and the second positive bias is applied to the control gate electrode. That is, a sufficiently high voltage is generated across the control gate electrode (or charge storage layer) and the channel, and electrons are injected into the charge storage layer. Therefore, writing is performed ("1"-programming).

Finally, in writing in memory string NANDc that uses third semiconductor layer 3c as a channel, a ground potential is applied to drain electrode 7 and source electrode 8, and a first positive bias is applied to select gate electrodes 10a and 10b and control gate electrodes 6(1)d, . . . 6(n)d. No bias is applied to select gate electrodes 10c and 11.

At the same time, for example, n-type impurity storage regions are formed in first to third semiconductor layers 3 (3a, 3b, and 3c) serving as channels of first to third layer select transistors Ta, Tb, and Tc and first to third memory strings NANDa, NANDb, and NANDc.

As no bias is applied to select gate electrode 10c, third layer select transistor Tc is off in first and second semiconductor layers 3a and 3b, and is on in third semiconductor layer 3c owing to impurity region 13c. Moreover, as no bias is applied to select gate electrode 11, source-side select transistor Ts is off in first to third semiconductor layers 3 (3a, 3b, and 3c).

Subsequently, for example, a second positive bias higher than the first positive bias is applied to the control gate electrode of the selected memory cell targeted for writing, and program data "0"/"1" is transferred to drain electrode 7 from bit line BL.

In first and second semiconductor layers 3a and 3b in which unselected memory strings NANDa and NANDb are formed, the channel potential is increased by capacitive coupling resulting from the application of the third positive bias. Therefore, a sufficiently high voltage is not applied across the control gate electrode (or charge storage layer) and the channel, and writing is inhibited accordingly.

In third semiconductor layer 3c in which selected memory string NANDc is formed, third layer select transistor Tc is on. Thus, program data "0"/"1" is transferred to third semiconductor layer 3c as a channel.

When the program data is "0", third semiconductor layer 3c as the channel, for example, has a positive potential. In this condition, if the second positive bias is applied to the control gate electrode of the selected memory cell and the channel potential is slightly increased by the capacitive coupling, third layer select transistor Tc is cut off.

Therefore, in third semiconductor layer 3c, the channel potential is increased by the capacitive coupling resulting from the application of the second positive bias. That is, a sufficiently high voltage is not applied across the control gate electrode (or charge storage layer) and the channel, and electrons are not injected into the charge storage layer. Therefore, writing is inhibited ("0"-programming).

In contrast, when the program data is "1", third semiconductor layer 3c as the channel, for example, has a ground potential. In this condition, even if the second positive bias is applied to the control gate electrode of the selected memory cell, third layer select transistor Tc remains on.

Therefore, the ground potential is applied to third semiconductor layer 3c as the channel, and the second positive bias is applied to the control gate electrode. That is, a sufficiently high voltage is generated across the control gate electrode (or charge storage layer) and the channel, and electrons are injected into the charge storage layer. Therefore, writing is performed ("1"-programming).

Erase operation is as follows.

First Example

Erase operation is collectively performed in, for example, first to third memory strings NANDa, NANDb, and NANDc in the fin type stacked layer structures (block erasing 1).

First, a ground potential is applied to drain electrode 7 and source electrode 8, and a first negative bias is applied to select gate electrodes 10a, 10b, 10c, and 11 and control gate electrodes 6(1)d, . . . 6(n)d.

At the same time, for example, p-type impurity storage regions are formed in first to third semiconductor layers 3 (3a, 3b, and 3c) serving as channels of first to third layer select transistors Ta, Tb, and Tc and first to third memory strings NANDa, NANDb, and NANDc.

Furthermore, a second positive bias higher than the first positive bias is applied to control gate electrodes 6(1)d, . . . 6(n)d.

As a result, a sufficiently high voltage is generated across the control gate electrode (or charge storage layer) and the channel, and electrons in the charge storage layer are discharged to the channel.

Thus, erasing is performed (block erasing).

Second Example

The erase operation can also be performed in, for example, one of first to third memory strings NANDa, NANDb, and NANDc in the fin type stacked layer structures (block erasing 2).

For example, in order to erase first memory string NANDa, no bias is applied to select gate electrodes 10a and 11, as in writing. As a result, first layer select transistor Ta is off in second and third semiconductor layers 3b and 3c. Thus, first memory string NANDa can be selectively erased.

In order to erase second memory string NANDb, no bias is applied to select gate electrodes 10b and 11, as in writing. As a result, second layer select transistor Tb is off in first and third semiconductor layers 3a and 3c. Thus, second memory string NANDb can be selectively erased.

In order to erase third memory string NANDc, no bias is applied to select gate electrodes 10c and 11, as in writing. As a result, third layer select transistor Tc is off in first and second semiconductor layers 3a and 3b. Thus, third memory string NANDc can be selectively erased.

Third Example

The erase operation can be performed in, for example, the memory cell in one of memory cells in first to third memory strings NANDa, NANDb, and NANDc in the fin type stacked layer structures (page erasing/one cell erasing).

In this case, the following conditions are further added to the conditions in the above-mentioned first or second examples.

A second negative bias higher than the first negative bias is applied to the control gate electrode of the selected memory cell targeted for erasing. No second negative bias is applied to the control gate electrodes of the unselected memory cells which are not targeted for erasing.

As a result, a sufficiently high voltage is generated across the control gate electrode (or charge storage layer) and the channel in the selected memory cell alone, and electrons in the charge storage layer are discharged to the channel. Thus, erasing is performed.

Read operation is as follows.

First, in order to read memory string NANDa that uses first semiconductor layer 3a as a channel, drain electrode 7 is connected to a reading circuit, and a ground voltage is applied to source electrode 8. A first positive bias is applied to select gate electrodes 10b, 10c, and 11 and control gate electrodes 6(1)d, . . . 6(n)d.

The first positive bias has, for example, a value that switches on the memory cell regardless of whether data is "0" or "1". No bias is applied to select gate electrode 10a.

At the same time, as no bias is applied to select gate electrode 10a, first layer select transistor Ta is off in second and third semiconductor layers 3b and 3c, and is on in first semiconductor layer 3a.

Data is then sequentially read in memory string NANDa from the source-side memory cells to the drain-side memory cells.

In the selected memory cell targeted for reading, for example, a second positive bias for reading that is lower than the first positive bias is applied to the control gate electrode.

The second positive bias has, for example, a value between the threshold of the data "0" and the threshold of the data "1".

Therefore, whether to switch on or off the selected memory cell is determined by the value of the data stored in the selected memory cell, so that reading can be performed by using the reading circuit to detect potential changes in bit line BL and changes in currents running through bit line.

Next, in order to read memory string NANDb that uses second semiconductor layer 3b as a channel, drain electrode 7 is connected to the reading circuit, and a ground voltage is applied to source electrode 8. A first positive bias is applied to select gate electrodes 10a, 10c, and 11 and control gate electrodes 6(1)d, . . . 6(n)d.

The first positive bias has, for example, a value that switches on the memory cell regardless of whether data is "0" or "1". No bias is applied to select gate electrode 10b.

At the same time, as no bias is applied to select gate electrode 10b, second layer select transistor Tb is off in first and third semiconductor layers 3a and 3c, and is on in second semiconductor layer 3b.

Data is then sequentially read in memory string NANDb from the source-side memory cells to the drain-side memory cells.

In the selected memory cell targeted for reading, for example, a second positive bias for reading that is lower than the first positive bias is applied to the control gate electrode. The second positive bias has, for example, a value between the threshold of the data "0" and the threshold of the data "1".

Therefore, whether to switch on or off the selected memory cell is determined by the value of the data stored in the selected memory cell, so that reading can be performed by using the reading circuit to detect potential changes in bit line BL and changes in currents running through bit line.

Finally, in order to read memory string NANDc that uses third semiconductor layer 3c as a channel, drain electrode 7 is connected to the reading circuit, and a ground voltage is applied to source electrode 8. A first positive bias is applied to select gate electrodes 10a, 10b, and 11 and control gate electrodes 6(1)d, . . . 6(n)d.

The first positive bias has, for example, a value that switches on the memory cell regardless of whether data is "0" or "1". No bias is applied to select gate electrode 10c.

At the same time, as no bias is applied to select gate electrode 10c, third layer select transistor Tc is off in first and second semiconductor layers 3a and 3b, and is on in third semiconductor layer 3c.

Data is then sequentially read in memory string NANDc from the source-side memory cells to the drain-side memory cells.

In the selected memory cell targeted for reading, for example, a second positive bias for reading that is lower than the first positive bias is applied to the control gate electrode. The second positive bias has, for example, a value between the threshold of the data "0" and the threshold of the data "1".

Therefore, whether to switch on or off the selected memory cell is determined by the value of the data stored in the selected memory cell, so that reading can be performed by using the reading circuit to detect potential changes in bit line BL and changes in currents running through bit line.

G. First Example of Method of Manufacturing Structure in FIG. 1

FIG. 8A to FIG. 8F show a method of manufacturing the structure in FIG. 1.

Figure 8A:
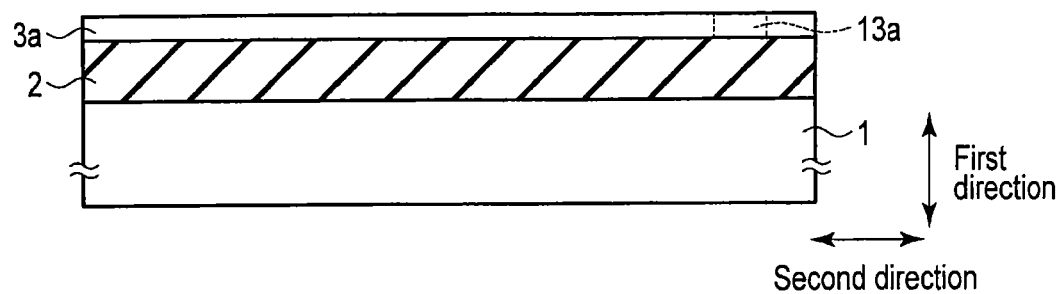

First, as shown in FIG. 8A, first-conductivity-type (e.g., p-type) semiconductor substrate (e.g., silicon) 1 having, for example, a plane direction (100) and a specific resistance of 10 to 20 Ωcm is prepared. On this semiconductor substrate 1, first insulating layer (e.g., silicon oxide) 2 is formed. First semiconductor layer (e.g., silicon) 3a is then formed on first insulating layer 2.

A resist pattern is then formed on first semiconductor layer 3a by a photo etching process (PEP). This resist pattern is used as a mask to implant ions, and impurity-added region 13a is formed in first semiconductor layer 3a. The resist pattern is removed afterwards.

Figure 8B:
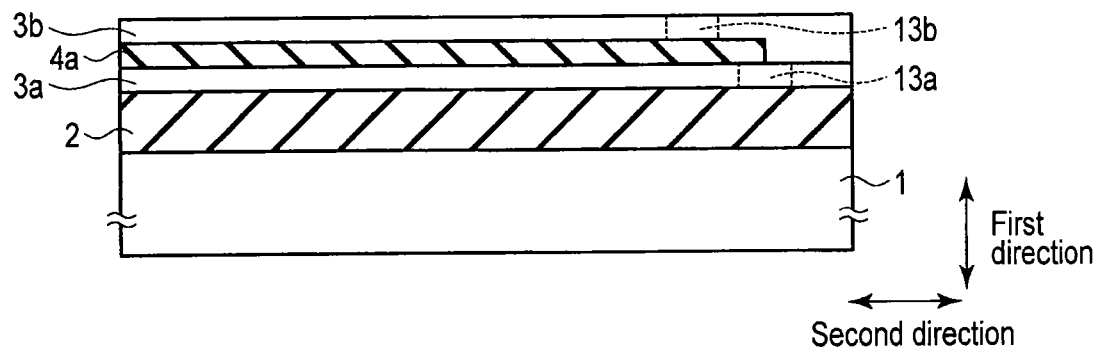

As shown in FIG. 8B, second insulating layer (e.g., silicon oxide) 4a is then formed on first semiconductor layer 3a. Moreover, a resist pattern is formed on second insulating layer 4a by the PEP. This resist pattern is used as a mask for reactive ion etching (RIE) to pattern second insulating layer 4a.

As a result, the position of the edge of second insulating layer 4a in the second direction is determined. The position of the edge of second insulating layer 4a in the second direction complies with the conditions described in the paragraphs for the structure. The resist pattern is removed afterwards.

Second semiconductor layer (e.g., silicon) 3b is then formed on first semiconductor layer 3a and second insulating layer 4a. Second semiconductor layer 3b is combined at one end in the second direction to first semiconductor layer 3a.

A resist pattern is formed on second semiconductor layer 3b by the PEP. This resist pattern is used as a mask to implant ions, and impurity-added region 13b is formed in second semiconductor layer 3b. The resist pattern is removed afterwards.

Figure 8C:
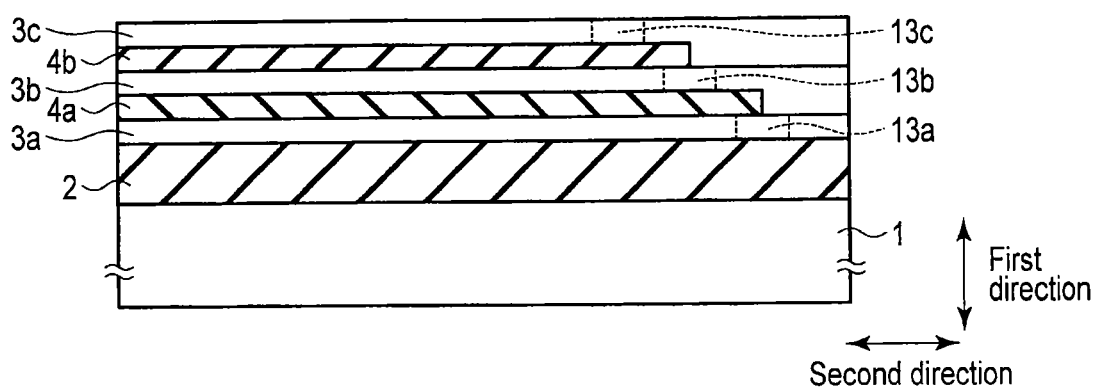

As shown in FIG. 8C, third insulating layer (e.g., silicon oxide) 4b is then formed on second semiconductor layer 3b. Moreover, a resist pattern is formed on third insulating layer 4b by the PEP. This resist pattern is used as a mask for RIE to pattern third insulating layer 4b.

As a result, the position of the edge of third insulating layer 4b in the second direction is determined. The position of the edge of third insulating layer 4b in the second direction complies with the conditions described in the paragraphs for the structure.

The resist pattern is removed afterwards.

Third semiconductor layer (e.g., silicon) 3c is then formed on second semiconductor layer 3b and third insulating layer 4b. Third semiconductor layer 3c is combined at one end in the second direction to second semiconductor layer 3b.

A resist pattern is formed on third semiconductor layer 3c by the PEP. This resist pattern is used as a mask to implant ions, and impurity-added region 13c is formed in third semiconductor layer 3c. The resist pattern is removed afterwards.

Figure 8D:
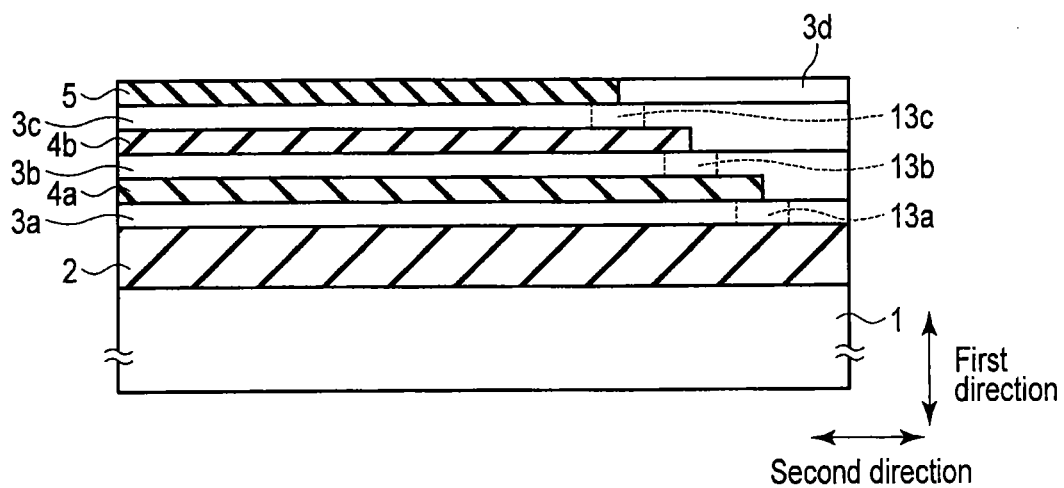

As shown in FIG. 8D, fourth insulating layer (e.g., silicon oxide) 5 is then formed on third semiconductor layer 3c. Moreover, a resist pattern is formed on fourth insulating layer 5 by the PEP. This resist pattern is used as a mask for RIE to pattern fourth insulating layer 5. As a result, the position of the edge of fourth insulating layer 5 in the second direction is determined.

However, the position of the edge of uppermost fourth insulating layer 5 in the second direction is not particularly limited as has been described in the paragraphs for the structure.

The resist pattern is removed afterwards.

Fourth semiconductor layer (e.g., silicon) 3d is then formed on third semiconductor layer 3c. Fourth semiconductor layer 3d is combined at one end in the second direction to third semiconductor layer 3c. However, fourth semiconductor layer 3d may be omitted.

Figure 8E:
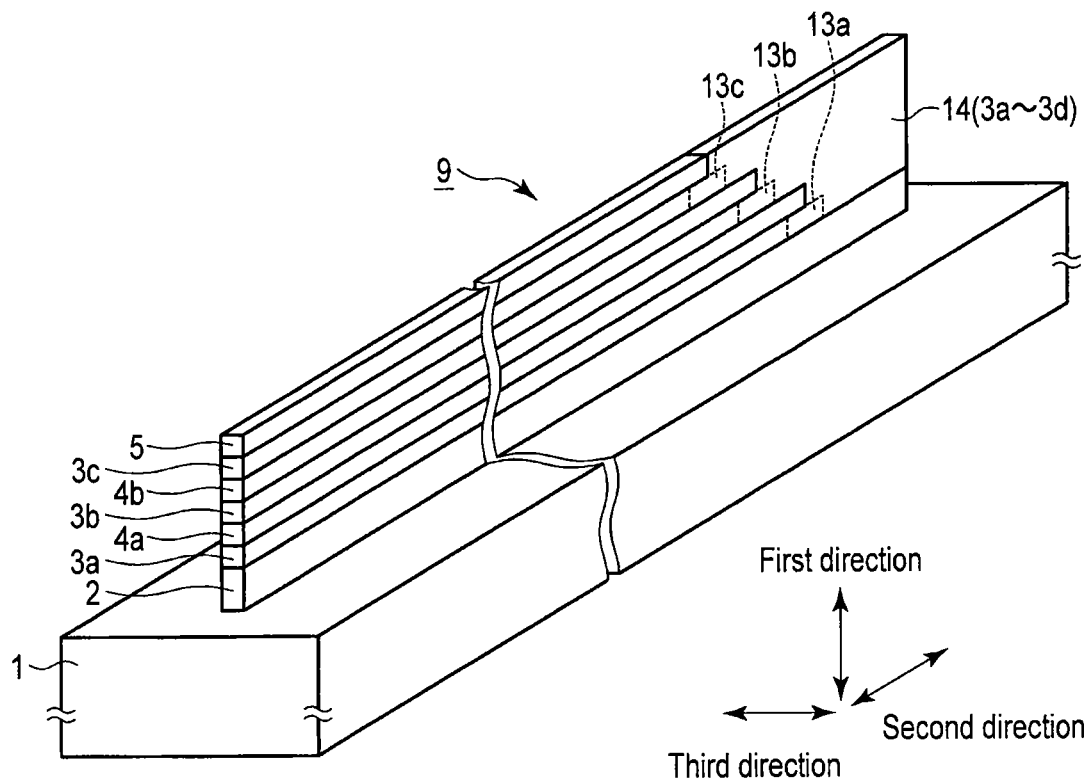

As shown in FIG. 8E, a resist pattern is formed on fourth insulating layer 5 and common semiconductor layer 14 by the PEP. This resist pattern is used as a mask for RIE to sequentially pattern fourth insulating layer 5, third semiconductor layer 3c, third insulating layer 4b, second semiconductor layer 3b, second insulating layer 4a, first semiconductor layer 3a, first insulating layer 2, and common semiconductor layer 14. As a result, fin-type stacked layer structure 9 is formed.

Here, common semiconductor layer 14 means a structure at the ends of first to fourth semiconductor layers 3 ($3a$, $3b$, $3c$, and $3d$) in the second direction.

The resist pattern is removed afterwards.

As shown in FIG. 8F, gate stacked layer structures 6(1), 6(2), ... 6($n$) and select gate electrodes 10 (10$a$, 10$b$, and 10$c$) extending in the third direction across fin-type stacked layer structure 9 are formed by a method such as CVD or sputtering and by an anisotropic etching method such as the RIE.

Here, gate stacked layer structures 6(1), 6(2), ... 6($n$) extend in the first direction, for example, in two side surfaces of first to fourth semiconductor layers 3 ($3a$, $3b$, $3c$, and $3d$) that face in the third direction. Select gate electrodes 10 (10$a$, 10$b$, and 10$c$) also extend in the first direction, for example, in two side surfaces of first to fourth semiconductor layers 3 ($3a$, $3b$, $3c$, and $3d$) that face in the third direction.

The structure shown in FIG. 1 is completed by the steps described above.

H. Second Example of Method of Manufacturing Structure in FIG. 1

FIG. 9A to FIG. 9C show a method of manufacturing the structure in FIG. 1.

First, as shown in FIG. 9A, first-conductivity-type (e.g., p-type) semiconductor substrate (e.g., silicon) 1 having, for example, a plane direction (100) and a specific resistance of 10 to 20 Ωcm is prepared. On this semiconductor substrate 1, first insulating layer (e.g., silicon oxide) 2 is formed. First semiconductor layer (e.g., silicon) 3$a$ is then formed on first insulating layer 2.

Second insulating layer (e.g., silicon oxide) 4$a$ is then formed on first semiconductor layer 3$a$. Moreover, a resist pattern is formed on second insulating layer 4$a$ by the PEP. This resist pattern is used as a mask for RIE to pattern second insulating layer 4$a$.

As a result, the position of the edge of second insulating layer 4$a$ in the second direction is determined. The position of the edge of second insulating layer 4$a$ in the second direction complies with the conditions described in the paragraphs for the structure. The resist pattern is removed afterwards.

Second semiconductor layer (e.g., silicon) 3$b$ is then formed on first semiconductor layer 3$a$ and second insulating layer 4$a$. Second semiconductor layer 3$b$ is combined at one end in the second direction to first semiconductor layer 3$a$.

Third insulating layer (e.g., silicon oxide) 4$b$ is then formed on second semiconductor layer 3$b$. A resist pattern is formed on third insulating layer 4$b$ by the PEP. This resist pattern is used as a mask for RIE to pattern third insulating layer 4$b$.

As a result, the position of the edge of third insulating layer 4$b$ in the second direction is determined. The position of the edge of third insulating layer 4$b$ in the second direction complies with the conditions described in the paragraphs for the structure. The resist pattern is removed afterwards.

Third semiconductor, layer (e.g., silicon) 3$c$ is then formed on second semiconductor layer 3$b$ and third insulating layer 4$b$. Third semiconductor layer 3$c$ is combined at one end in the second direction to second semiconductor layer 3$b$.

Fourth insulating layer (e.g., silicon oxide) 5 is then formed on third semiconductor layer 3$c$. A resist pattern is formed on fourth insulating layer 5 by the PEP. This resist pattern is used as a mask for RIE to pattern fourth insulating layer 5.

As a result, the position of the edge of fourth insulating layer 5 in the second direction is determined. The position of the edge of uppermost fourth insulating layer 5 in the second direction is not particularly limited as has been described in the paragraphs for the structure.

The resist pattern is removed afterwards.

Fourth semiconductor layer (e.g., silicon) 3$d$ is then formed on third semiconductor layer 3$c$. Fourth semiconductor layer 3$d$ is combined at one end in the second direction to third semiconductor layer 3$c$.

As shown in FIG. 9B, a resist pattern is then formed on fourth insulating layer 5 and fourth semiconductor layer 3$d$ by the PEP. This resist pattern is used as a mask to implant ions, and impurity-added region 13$a$ is formed in first semiconductor layer 3$a$. In this ion implantation, the acceleration energy and dose amount for the ion implantation are set to form impurity-added region 13$a$ in first semiconductor layer 3$a$.

The resist pattern is removed afterwards.

As shown in FIG. 9C, a resist pattern is then again formed on fourth insulating layer 5 and fourth semiconductor layer 3$d$ by the PEP. This resist pattern is used as a mask to implant ions, and impurity-added region 13$b$ is formed in second semiconductor layer 3$b$. In this ion implantation, the acceleration energy and dose amount for the ion implantation are set to form impurity-added region 13$b$ in second semiconductor layer 3$b$.

The resist pattern is removed afterwards.

A resist pattern is then again formed on fourth insulating layer 5 and fourth semiconductor layer 3$d$ by the PEP. This resist pattern is used as a mask to implant ions, and impurity-added region 13$c$ is formed in third semiconductor layer 3$c$. In this ion implantation, the acceleration energy and dose amount for the ion implantation are set to form impurity-added region 13$c$ in third semiconductor layer 3$c$.

The resist pattern is removed afterwards.

The same structure as that shown in FIG. 8D in the first example of the manufacturing method is obtained by the steps described above. Therefore, this is followed by the same steps as those in FIG. 8E and FIG. 8F in the first example to complete the structure shown in FIG. 1.

In the second example of the manufacturing method, the resist does not adhere to first to third semiconductor layers 3 ($3a$, $3b$, and $3c$) as the active areas where the memory strings are formed. This prevents the contamination of first to third semiconductor layers 3 ($3a$, $3b$, and $3c$), and improves the channel characteristics of the memory strings.

I. Third Example of Method of Manufacturing Structure in FIG. 1

FIG. 10A to FIG. 10E show a method of manufacturing the structure in FIG. 1.

Figure 10A:
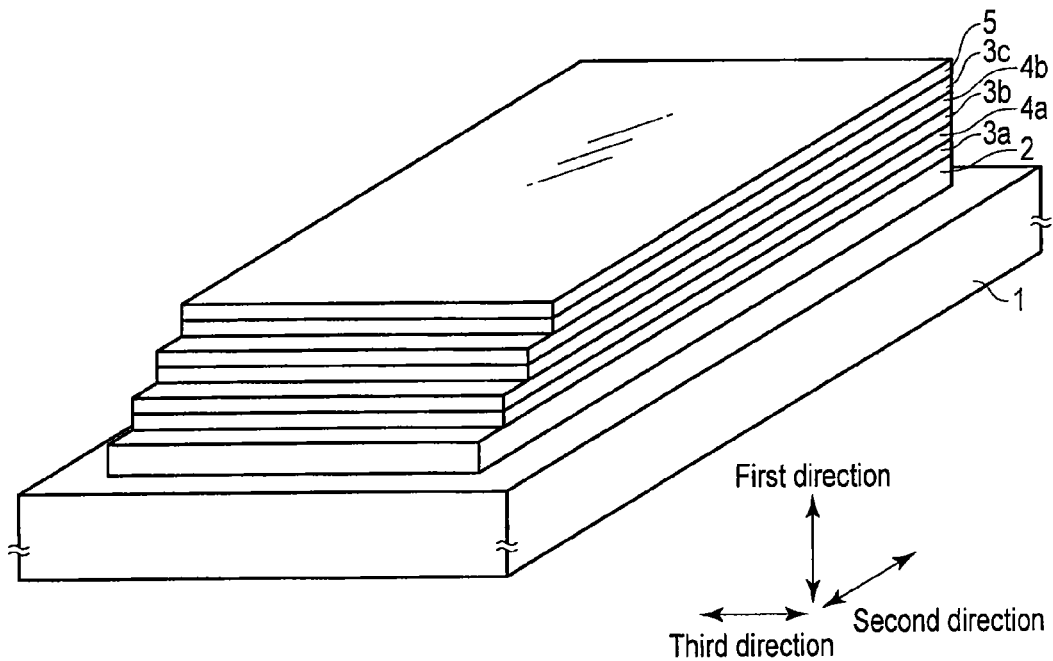

First, as shown in FIG. 10A, first-conductivity-type (e.g., p-type) semiconductor substrate (e.g., silicon) 1 having, for example, a plane direction (100) and a specific resistance of 10 to 20 Ωcm is prepared. On this semiconductor substrate 1, first insulating layer (e.g., silicon oxide) 2 is formed. First semiconductor layer (e.g., silicon) 3$a$ and second insulating layer (e.g., silicon oxide) 4$a$ are then sequentially formed on first insulating layer 2.

A resist pattern is formed on second insulating layer 4a by the PEP. This resist pattern is used as a mask for RIE to pattern second insulating layer 4a and first semiconductor layer 3a.

As a result, the position of the edge of second insulating layer 4a in the second direction is determined. The position of the edge of second insulating layer 4a in the second direction complies with the conditions described in the paragraphs for the structure. The resist pattern is removed afterwards.

Second semiconductor layer (e.g., silicon) 3b and third insulating layer (e.g., silicon oxide) 4b are then sequentially formed on second insulating layer 4a.

A resist pattern is formed on third insulating layer 4b by the PEP. This resist pattern is used as a mask for RIE to pattern third insulating layer 4b and second semiconductor layer 3b.

As a result, the position of the edge of third insulating layer 4b in the second direction is determined. The position of the edge of third insulating layer 4b in the second direction complies with the conditions described in the paragraphs for the structure. The resist pattern is removed afterwards.

Third semiconductor layer (e.g., silicon) 3c and fourth insulating layer (e.g., silicon oxide) 5 are then sequentially formed on third insulating layer 4b.

A resist pattern is formed on fourth insulating layer 5 by the PEP. This resist pattern is used as a mask for RIE to pattern fourth insulating layer 5 and third semiconductor layer 3c.

As a result, the position of the edge of fourth insulating layer 5 in the second direction is determined. The position of the edge of uppermost fourth insulating layer 5 in the second direction is not particularly limited as has been described in the paragraphs for the structure.

The resist pattern is removed afterwards.

Here, in the present example, second to fourth insulating layers 4a, 4b, and 5 are preferably equal in thickness in the first direction if later-described ion implantation (collective implantation) is taken into consideration.

Figure 10B:
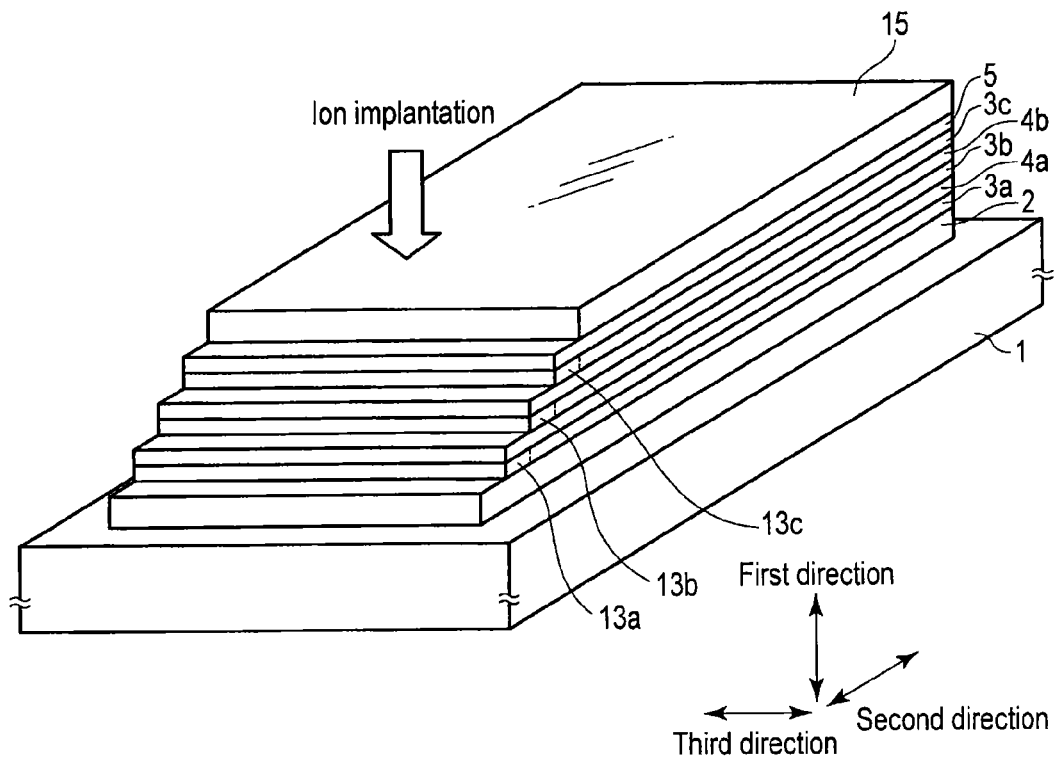

As shown in FIG. 10B, resist pattern 15 is then formed on fourth insulating layer 5 by the PEP. This resist pattern 15 is used as a mask to implant ions.

In this ion implantation, the acceleration energy and dose amount are controlled to simultaneously form impurity regions 13a, 13b, and 13c in first to third semiconductor layers 3 (3a, 3b, and 3c) (collective implantation).

As second to fourth insulating layers 4a, 4b, and 5 function as masks, each of impurity regions 13a, 13b, and 13c is only formed at one end of each of first to third semiconductor layers 3 (3a, 3b, and 3c) in a self-aligning manner.

The resist pattern 15 is removed afterwards.

As shown in FIG. 10C, common semiconductor layer (e.g., silicon) 14 is then formed, and the surface of common semiconductor layer 14 is planarized by chemical mechanical polishing (CMP). This planarization can also be conducted, for example, by dry etching.

Common semiconductor layer 14 combines first to third semiconductor layers 3 (3a, 3b, and 3c) at one end in the second direction.

As shown in FIG. 10D, a resist pattern is then formed on fourth insulating layer 5 and common semiconductor layer 14 by the PEP. This resist pattern is used as a mask for RIE to sequentially pattern fourth insulating layer 5, third semiconductor layer 3c, third insulating layer 4b, second semiconductor layer 3b, second insulating layer 4a, first semiconductor layer 3a, first insulating layer 2, and common semiconductor layer 14. As a result, fin-type stacked layer structure 9 is formed.

The resist pattern is removed afterwards.

As shown in FIG. 10E, gate stacked layer structures 6(1), 6(2), ... 6(n) and select gate electrodes 10 (10a, 10b, and 10c) extending in the third direction across fin-type stacked layer structure 9 are formed by a method such as the CVD or sputtering and by an anisotropic etching method such as the RIE.

Here, gate stacked layer structures 6(1), 6(2), ... 6(n) extend in the first direction, for example, in two side surfaces of first to third semiconductor layers 3 (3a, 3b, and 3c) that face in the third direction. Select gate electrodes 10 (10a, 10b, and 10c) also extend in the first direction, for example, in two side surfaces of first to third semiconductor layers 3 (3a, 3b, and 3c) that face in the third direction.

The structure shown in FIG. 1 is completed by the steps described above.

J. Summary

According to the first embodiment, the positions of the edges of the second and third insulating layers on the side of the drain electrode are adjusted so that when a current is passed through one selected memory string, unnecessary currents do not run through the remaining unselected memory strings, and reading/writing/erasing can be accurately performed.

(2) Second Embodiment

A. Structure

Figure 11:
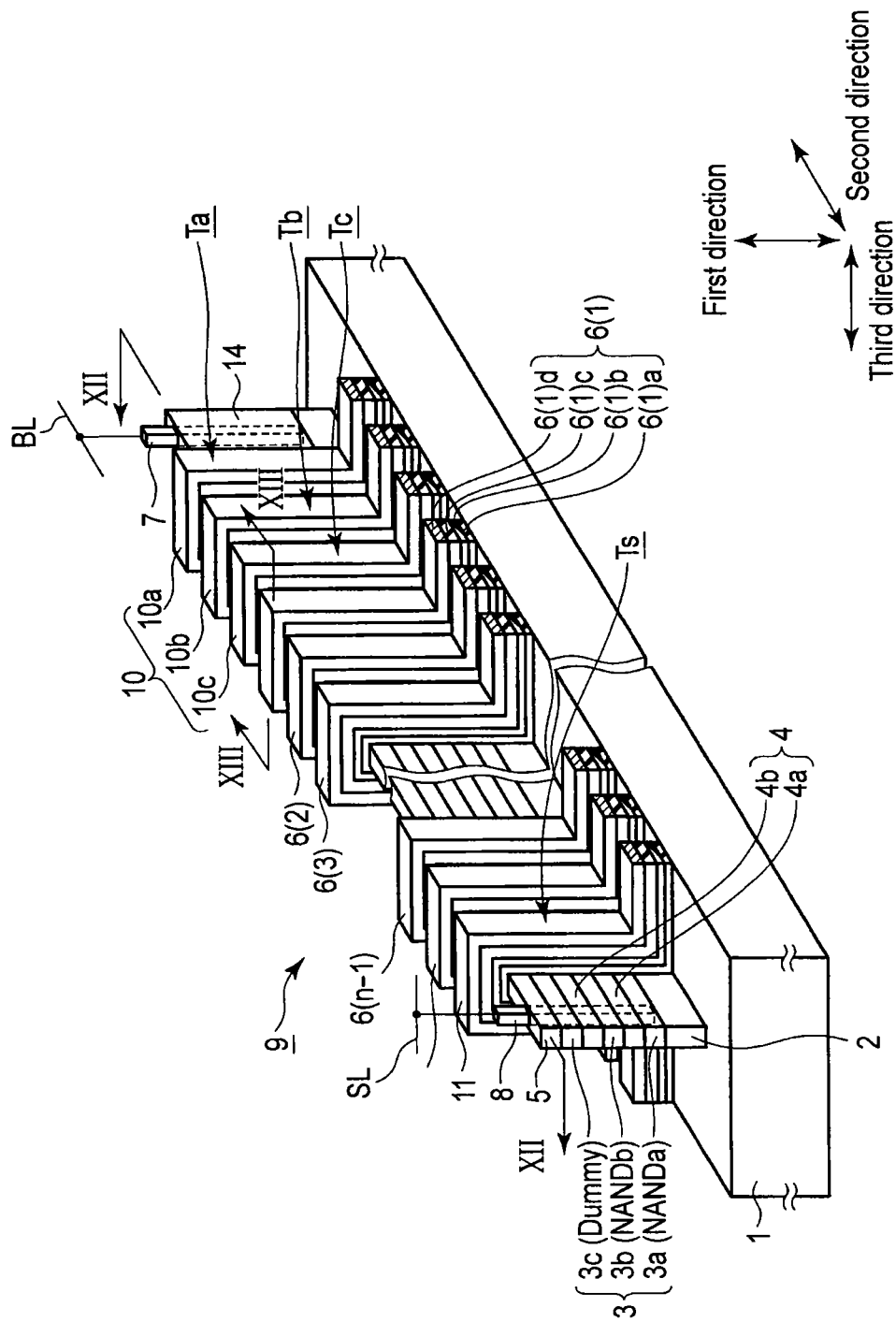
FIG. 11 is a view showing a structure of a second embodiment.
Figure 12:
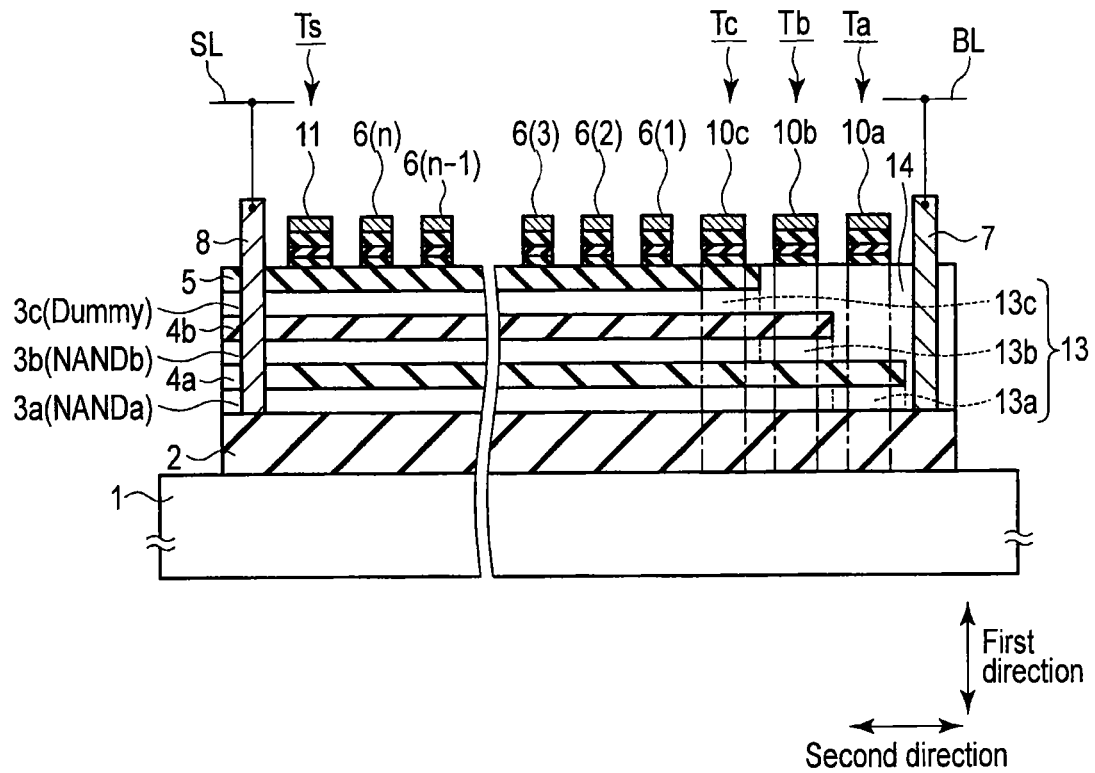
FIG. 12 is a view taken along the line XII-XII of FIG. 11.

FIG. 11 shows a structure according to the second embodiment. FIG. 12 is a sectional view taken along the line XII-XII of FIG. 11. FIG. 13 is a sectional view taken along the line XIII-XIII of FIG. 11.

Here, the same elements as those in the first embodiment (FIG. 1 to FIG. 3) are provided with the same reference marks and are thus not described in detail.

The second embodiment is characterized in that a third memory string (dummy) that uses, as a channel, uppermost third semiconductor layer 3c among first to third semiconductor layers 3a, 3b, and 3c constituting fin-type stacked layer structure 9 comprises dummy cells as non-memory cells.

The uppermost layer is the dummy layer, for example, because impurity region 13c is formed entirely in uppermost third semiconductor layer 3c if the structure shown in FIG. 11 to FIG. 13 is formed by a later-described manufacturing method.

In the present embodiment, as uppermost third semiconductor layer 3c is the dummy layer, third layer select transistor Tc located closest to first and second memory strings NANDa and NANDb is not indispensable. That is, third layer select transistor Tc can be omitted.

The configuration is the same as that according to the first embodiment in other respects.

Particularly, the positions of the edges of second and third insulating layers 4 (4a and 4b) in the second direction are the same as those according to the first embodiment. Although third semiconductor layer 3c is dummy, a leak path from first or second semiconductor layer 3a or 3b to third semiconductor layer 3c can be cut off by adjusting the position of the edge of third insulating layer 4b as in the first embodiment.

B. Material Examples

In the second embodiment (FIG. 11 to FIG. 13), the materials described in Material Examples in the first embodiment can be used to manufacture a three-dimensional stacked layer type semiconductor memory.

C. Applications

The second embodiment (FIG. 11 to FIG. 13) can also be applied as in the first to third applications (FIG. 5 to FIG. 7) in the first embodiment.

D. Operations

Not Omitting Third Layer Select Transistor Tc

In this case, writing/erasing/reading can be performed by the same operations as those described in the first embodiment.

However, the third memory string (dummy) that uses uppermost third semiconductor layer 3c as a channel is dummy, and is therefore not selected.

That is, during writing/erasing/reading, a bias is applied to select gate electrode 10c, and no bias is applied to one of select gate electrodes 10a and 10b.

Therefore, no current runs through third semiconductor layer 3c.

Omitting Third Layer Select Transistor Tc

In this case, writing/erasing/reading can be performed by the same operations as those described in the first embodiment.

However, as third layer select transistor Tc is not present, parts of the operation described in the first embodiment that are associated with select gate electrode 10c are omitted.

G. Method of Manufacturing Structure in FIG. 11

FIG. 14A to FIG. 14E show a method of manufacturing the structure in FIG. 11.

Figure 14:
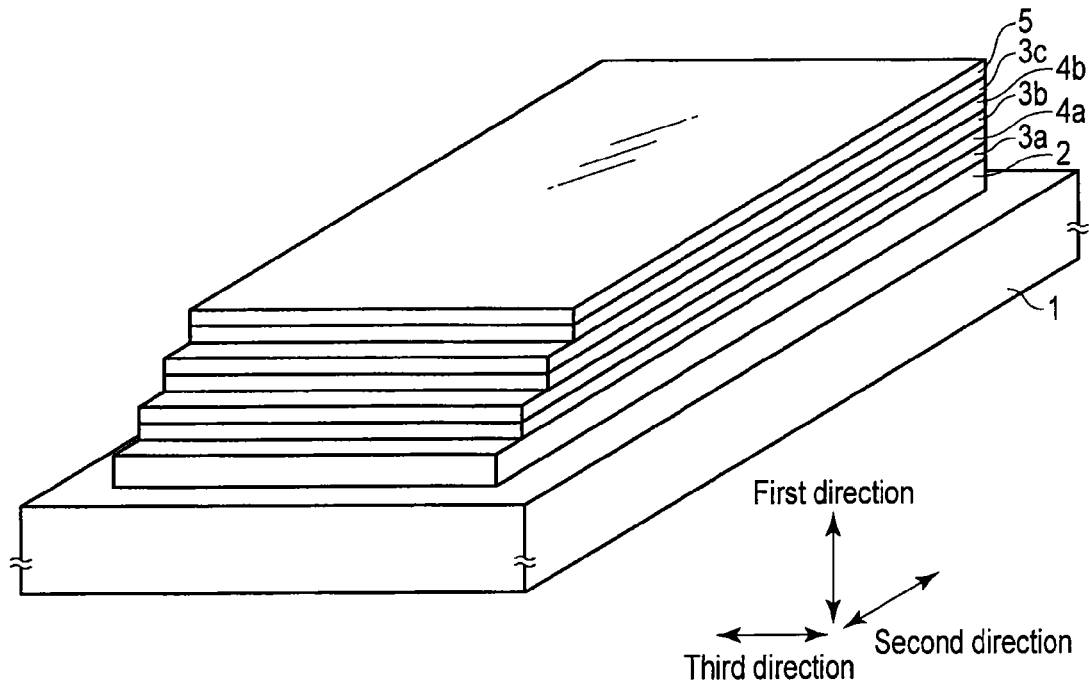
FIGS. 14A to 14E are views, each showing an example of a method of manufacturing the structure in FIG. 11.
Figure 14:
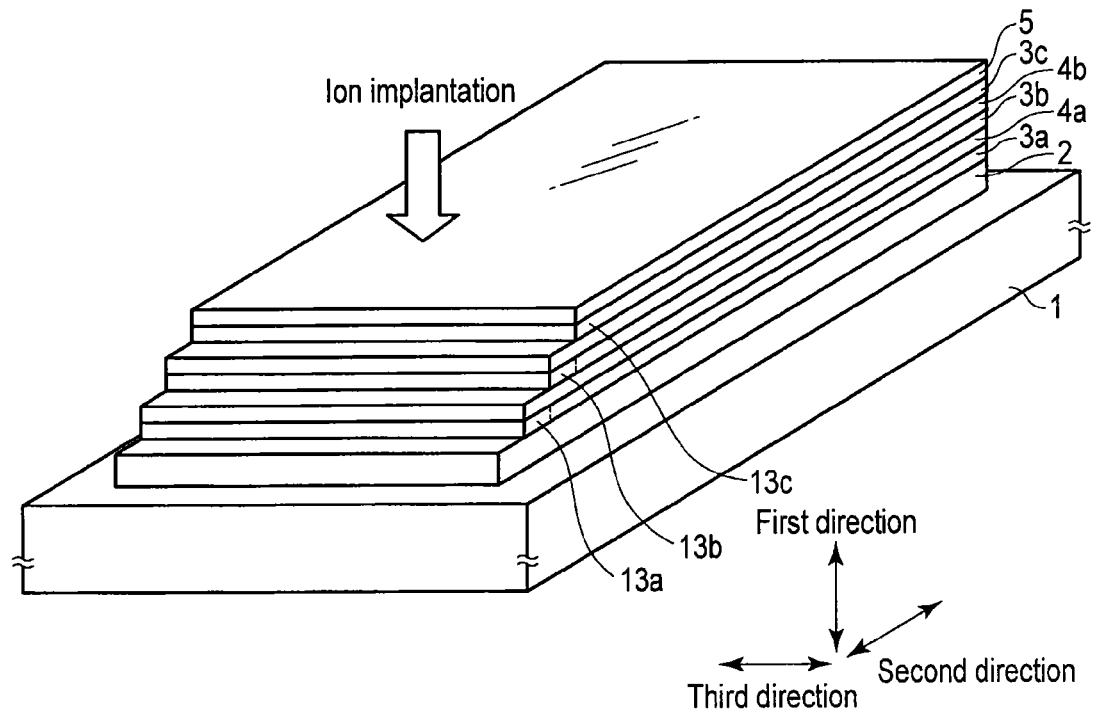

First, as shown in FIG. 14A, first-conductivity-type (e.g., p-type) semiconductor substrate (e.g., silicon) 1 having, for example, a plane direction (100) and a specific resistance of 10 to 20 Ωcm is prepared. On this semiconductor substrate 1, first insulating layer (e.g., silicon oxide) 2 is formed. First semiconductor layer (e.g., silicon) 3a and second insulating layer (e.g., silicon oxide) 4a are then sequentially formed on first insulating layer 2.

A resist pattern is formed on second insulating layer 4a by the PEP. This resist pattern is used as a mask for RIE to pattern second insulating layer 4a and first semiconductor layer 3a.

As a result, the position of the edge of second insulating layer 4a in the second direction is determined. The position of the edge of second insulating layer 4a in the second direction complies with the conditions described in the paragraphs for the structure. The resist pattern is removed afterwards.

Second semiconductor layer (e.g., silicon) 3b and third insulating layer (e.g., silicon oxide) 4b are then sequentially formed on second insulating layer 4a.

A resist pattern is formed on third insulating layer 4b by the PEP. This resist pattern is used as a mask for RIE to pattern third insulating layer 4b and second semiconductor layer 3b.

As a result, the position of the edge of third insulating layer 4b in the second direction is determined. The position of the edge of third insulating layer 4b in the second direction complies with the conditions described in the paragraphs for the structure. The resist pattern is removed afterwards.

Third semiconductor layer (e.g., silicon) 3c and fourth insulating layer (e.g., silicon oxide) 5 are then sequentially formed on third insulating layer 4b.

A resist pattern is formed on fourth insulating layer 5 by the PEP. This resist pattern is used as a mask for RIE to pattern fourth insulating layer 5 and third semiconductor layer 3c.

As a result, the position of the edge of fourth insulating layer 5 in the second direction is determined. The position of the edge of uppermost fourth insulating layer 5 in the second direction is not particularly limited as has been described in the paragraphs for the structure.

The resist pattern is removed afterwards.

Here, in the present example, second and third insulating layers 4a and 4b are preferably equal in thickness in the first direction if later-described ion implantation (collective implantation) is taken into consideration.

The thickness of fourth insulating layer 5 in the first direction may be equal to the thickness of each of second and third insulating layers 4a and 4b in the first direction, or may be greater than the thickness of each of second and third insulating layers 4a and 4b in the first direction.

As shown in FIG. 14B, ions are implanted. In this ion implantation, the acceleration energy and dose amount are controlled to simultaneously form impurity regions 13a, 13b, and 13c in first to third semiconductor layers 3 (3a, 3b, and 3c) (collective implantation).

Impurity region 13c is formed substantially entirely in uppermost third semiconductor layer 3c. In contrast, each of impurity regions 13a and 13b is only formed at one end of each of first and second semiconductor layers 3a and 3b in the second direction in a self-aligning manner. This is because second to fourth insulating layers 4b and 5 function as masks.

As shown in FIG. 14C, common semiconductor layer (e.g., silicon) 14 is then formed, and the surface of common semiconductor layer 14 is planarized by the CMP. This planarization can also be conducted, for example, by dry etching.

Common semiconductor layer 14 combines first to third semiconductor layers 3 (3a, 3b, and 3c) at one end in the second direction.

As shown in FIG. 14D, a resist pattern is then formed on fourth insulating layer 5 and common semiconductor layer 14 by the PEP. This resist pattern is used as a mask for RIE to sequentially pattern fourth insulating layer 5, third semiconductor layer 3c, third insulating layer 4b, second semiconductor layer 3b, second insulating layer 4a, first semiconductor layer 3a, first insulating layer 2, and common semiconductor layer 14. As a result, fin-type stacked layer structure 9 is formed.

The resist pattern is removed afterwards.

As shown in FIG. 14E, gate stacked layer structures 6(1), 6(2), ... 6(n) and select gate electrodes 10 (10a, 10b, and 10c) extending in the third direction across fin-type stacked layer structure 9 are formed by a method such as the CVD or sputtering and by an anisotropic etching method such as the RIE.

Here, gate stacked layer structures 6(1), 6(2), ... 6(n) extend in the first direction, for example, in two side surfaces of first to third semiconductor layers 3 (3a, 3b, and 3c) that face in the third direction. Select gate electrodes 10 (10a, 10b, and 10c) also extend in the first direction, for example, in two side surfaces of first to third semiconductor layers 3 (3a, 3b, and 3c) that face in the third direction.

The structure shown in FIG. 11 is completed by the steps described above.

F. Summary

According to the second embodiment, the positions of the edges of the second and third insulating layers on the side of the drain electrode are adjusted so that when a current is passed through one selected memory string, unnecessary currents do not run through the remaining unselected memory strings (including the dummy memory string), and reading/writing/erasing can be accurately performed.

(3) Third Embodiment

A. Structure

Figure 15:
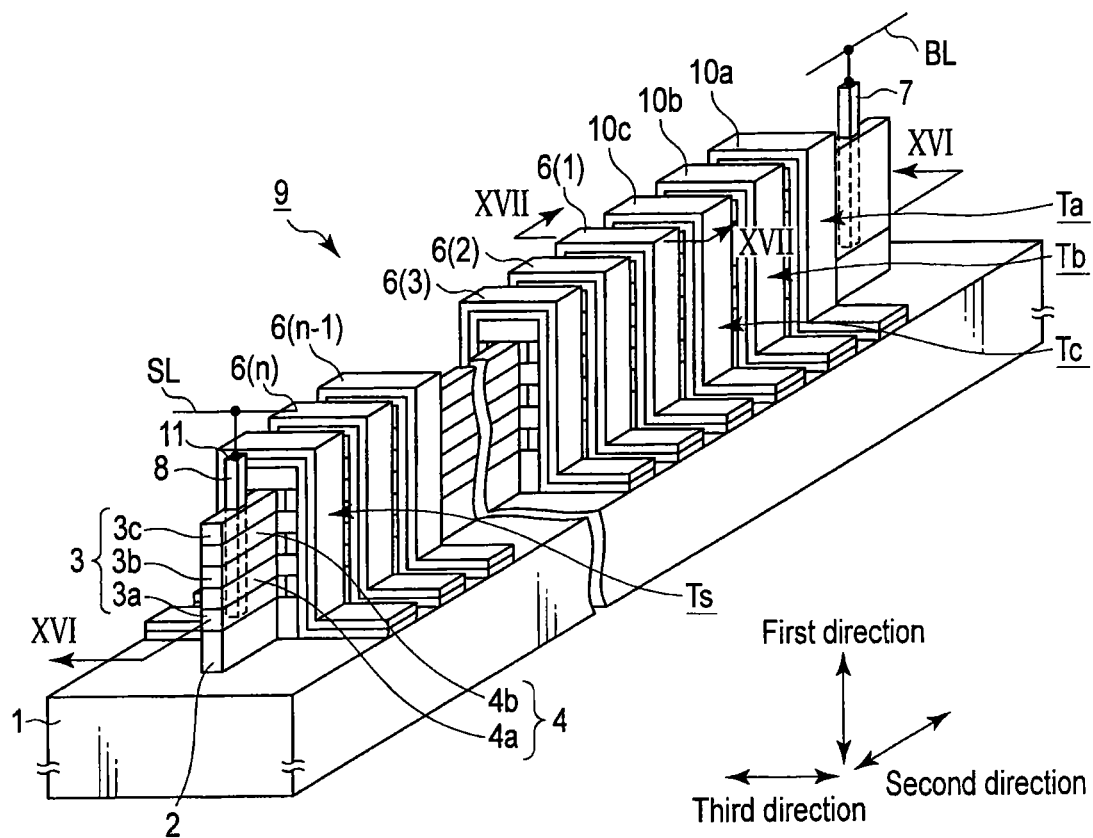
FIG. 15 is a view showing a structure of a third embodiment.
Figure 16:
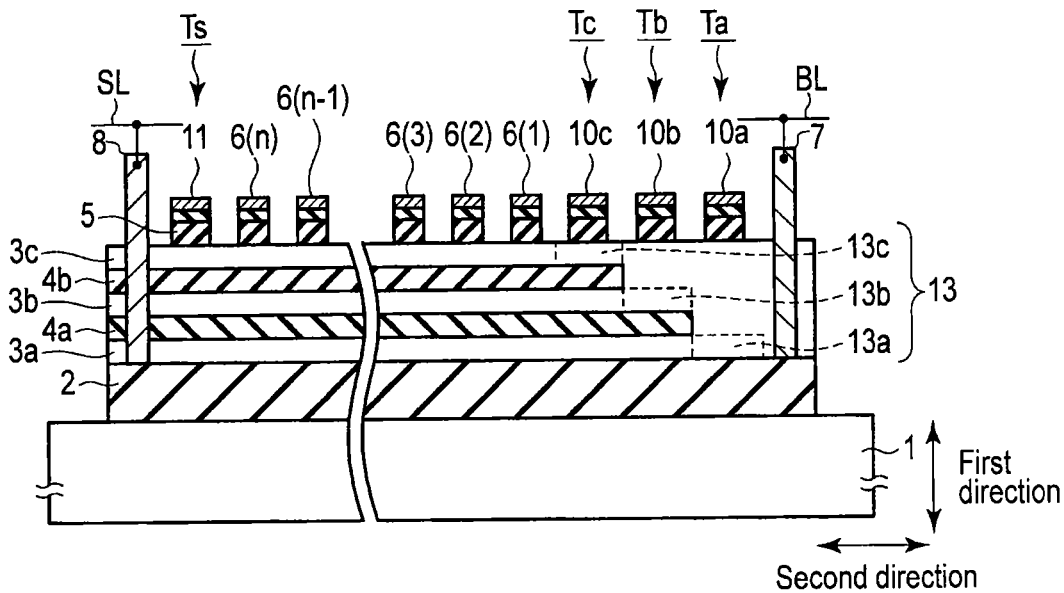
FIG. 16 is a view taken along the line XVI-XVI of FIG. 15.

FIG. 15 shows a structure according to the third embodiment. FIG. 16 is a sectional view taken along the line XVI-XVI of FIG. 15. FIG. 17 is a sectional view taken along the line XVII-XVII of FIG. 15. FIG. 18 is a partial view showing the structure of a charge storage layer.

Here, the same elements as those in the first embodiment (FIG. 1 to FIG. 3) are provided with the same reference marks and are thus not described in detail.

The third embodiment is characterized in that charge storage layers 6(1)b, 6(2)b, and 6(3)b of a memory cell constituting first to third memory strings NANDa, NANDb, and NANDc are independent of one another.

That charge storage layers 6(1)b, 6(2)b, and 6(3)b are independent means that charge storage layers 6(1)b, 6(2)b, and 6(3)b are physically separated by a material (e.g., insulating layers or air gaps) different from the material constituting these charge storage layers.

Charge storage layers 6(1)b, 6(2)b, and 6(3)b are independent for the respective memory cells so that the writing/erasing characteristics and cycling resistance of the three-dimensional stacked layer type semiconductor memory can be improved.

In the present embodiment, the charge storage layers have independent structures for the respective memory cells. Thus, it is possible to apply the memory cells, for example, not only to a SONOS memory cell that uses silicon-rich SiN as a charge storage layer but also to a floating gate type memory cell that uses, as a charge storage layer, a conductor serving as an electrically floating gate.

The configuration is the same as that according to the first embodiment in other respects.

B. Material Examples

In the third embodiment (FIG. 15 to FIG. 18), the materials described in Material Examples in the first embodiment can be used to manufacture a three-dimensional stacked layer type semiconductor memory.

C. Applications

The third embodiment (FIG. 15 to FIG. 18) can also be applied as in the first to third applications (FIG. 5 to FIG. 7) in the first embodiment.

D. Operations

In the third embodiment (FIG. 15 to FIG. 18), writing/erasing/reading can also be performed by the same operations as those described in the first embodiment.

E. Method of Manufacturing Structure in FIG. 15

FIG. 19A to FIG. 19L show a method of manufacturing the structure in FIG. 15.

In each of these drawings, (a) is a plan view, (b) is a sectional view taken along the line b-b, and (c) is a sectional view taken along the line c-c.

Figure 19A:
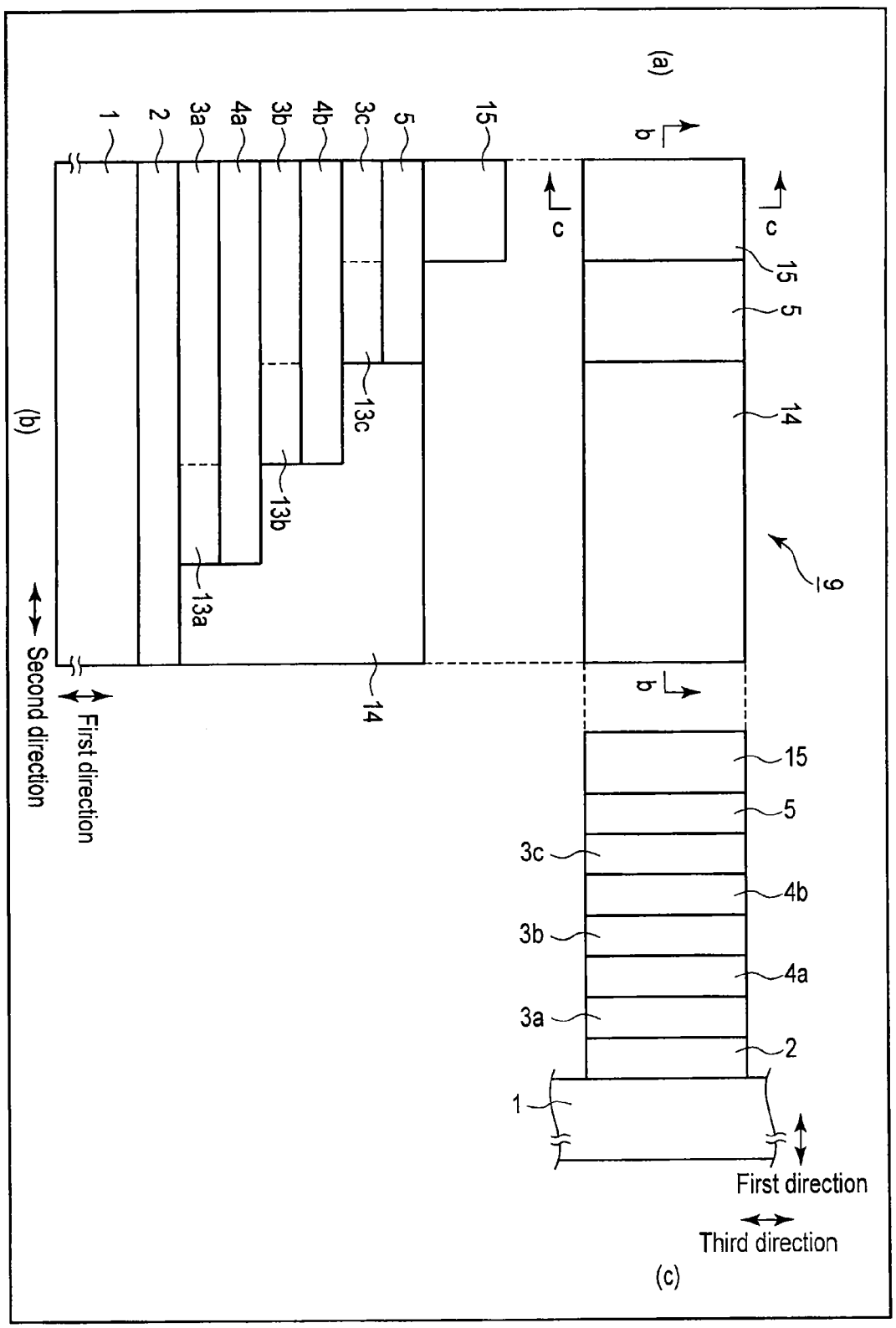
FIGS. 19A to 19L are views, each showing an example of a method of manufacturing the structure in FIG. 15.

First, as shown in FIG. 19A, first-conductivity-type (e.g., p-type) semiconductor substrate (e.g., silicon) 1 having, for example, a plane direction (100) and a specific resistance of 10 to 20 Ωcm is prepared. On this semiconductor substrate 1, first insulating layer (e.g., silicon oxide) 2 is formed. First semiconductor layer (e.g., silicon) 3a and second insulating layer (e.g., silicon oxide) 4a are then sequentially formed on first insulating layer 2.

A resist pattern is formed on second insulating layer 4a by the PEP. This resist pattern is used as a mask for RIE to pattern second insulating layer 4a and first semiconductor layer 3a.

As a result, the position of the edge of second insulating layer 4a in the second direction is determined. The position of the edge of second insulating layer 4a in the second direction complies with the conditions described in the paragraphs for the structure. The resist pattern is removed afterwards.

Second semiconductor layer (e.g., silicon) 3b and third insulating layer (e.g., silicon oxide) 4b are then sequentially formed on second insulating layer 4a.

A resist pattern is formed on third insulating layer 4b by the PEP. This resist pattern is used as a mask for RIE to pattern third insulating layer 4b and second semiconductor layer 3b.

As a result, the position of the edge of third insulating layer 4b in the second direction is determined. The position of the edge of third insulating layer 4b in the second direction complies with the conditions described in the paragraphs for the structure. The resist pattern is removed afterwards.

Third semiconductor layer (e.g., silicon) 3c and fourth insulating layer (e.g., silicon oxide) 5 are then sequentially formed on third insulating layer 4b.

A resist pattern is formed on fourth insulating layer 5 by the PEP. This resist pattern is used as a mask for RIE to pattern fourth insulating layer 5 and third semiconductor layer 3c.

As a result, the position of the edge of fourth insulating layer 5 in the second direction is determined. The position of the edge of uppermost fourth insulating layer 5 in the second direction is not particularly limited as has been described in the paragraphs for the structure.

The resist pattern is removed afterwards.

Here, in the present example, second to fourth insulating layers 4a, 4b, and 5 are preferably equal in thickness in the first direction if later-described ion implantation (collective implantation) is taken into consideration.

A resist pattern 15 is then formed on fourth insulating layer 5 by the PEP. This resist pattern 15 is used as a mask to implant ions.

In this ion implantation, the acceleration energy and dose amount are controlled to simultaneously form impurity regions 13a, 13b, and 13c in first to third semiconductor layers 3 (3a, 3b, and 3c) (collective implantation).

As second to fourth insulating layers 4a, 4b, and 5 function as masks, each of impurity regions 13a, 13b, and 13c is only formed at one end of each of first to third semiconductor layers 3 (3a, 3b, and 3c) in a self-aligning manner.

The resist pattern 15 is removed afterwards.

Common semiconductor layer (e.g., silicon) 14 is then formed, and the surface of common semiconductor layer 14 is planarized by the CMP. This planarization can also be conducted, for example, by dry etching.

Common semiconductor layer 14 combines first to third semiconductor layers 3 (3a, 3b, and 3c) at one end in the second direction.

A resist pattern is then formed on fourth insulating layer 5 and common semiconductor layer 14 by the PEP. This resist pattern is used as a mask for RIE to sequentially pattern fourth insulating layer 5, third semiconductor layer 3c, third insulating layer 4b, second semiconductor layer 3b, second insulating layer 4a, first semiconductor layer 3a, first insulating layer 2, and common semiconductor layer 14. As a result, fin-type stacked layer structure 9 is formed.

The resist pattern is removed afterwards.

Figure 19B:
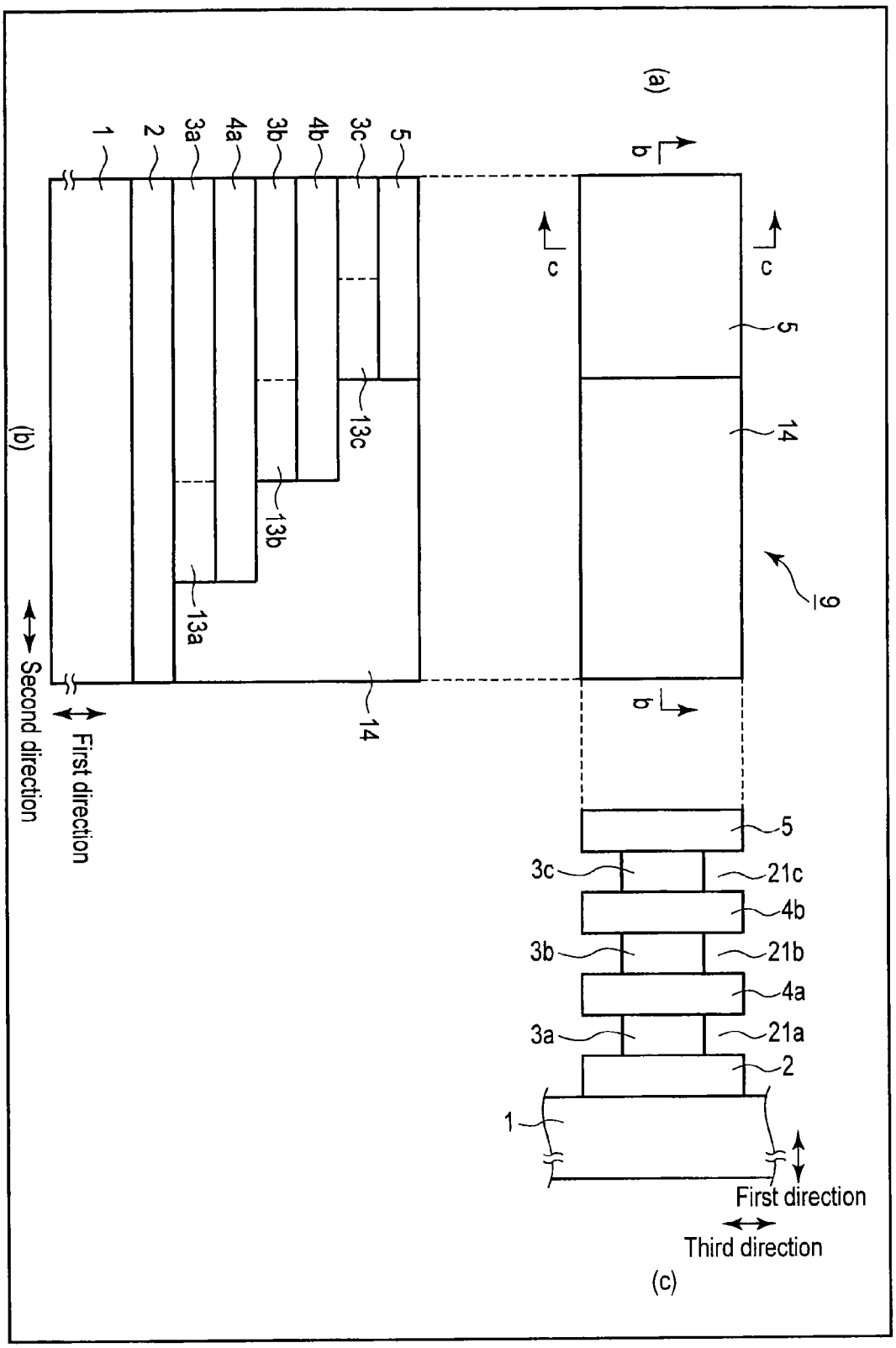

As shown in FIG. 19B, the side surfaces of first to third semiconductor layers 3a to 3c in the third direction are then selectively etched by isotropic dry etching. As a result, the side surfaces of first to third semiconductor layers 3a to 3c in the third direction are set back, and first to third recesses 21a to 21c extending in the second direction are formed.

Figure 19C:
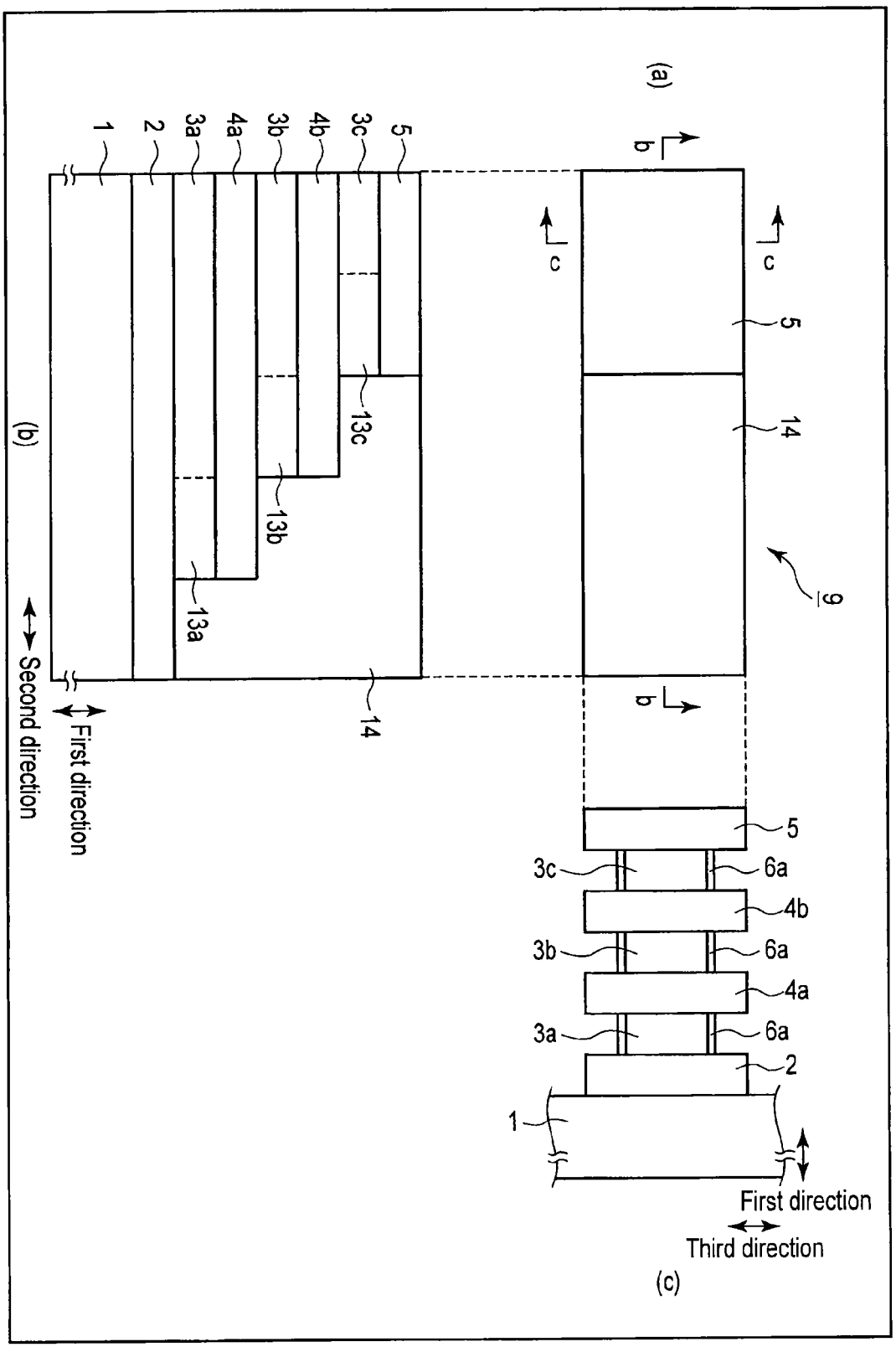

As shown in FIG. 19C, the side surfaces of first to third semiconductor layers 3a to 3c in the third direction are then thermally oxidized, and first gate insulating layers (e.g., silicon oxide) 6a are formed on the side surfaces of first to third semiconductor layers 3a to 3c in the third direction.

Figure 19D:
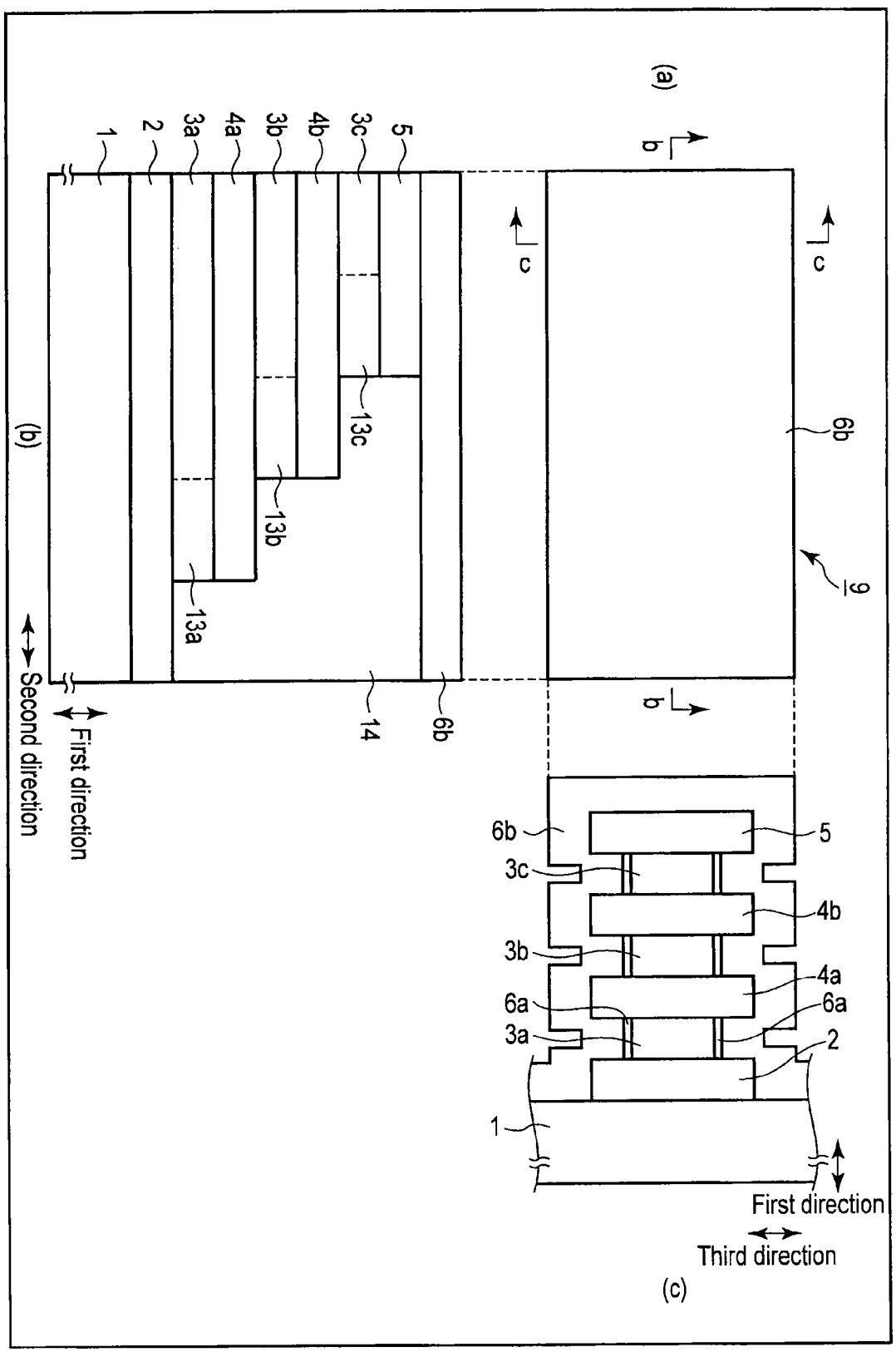

As shown in FIG. 19D, charge storage layer 6b covering fin-type stacked layer structure 9 is then formed. A material such as silicon nitride or conductive polysilicon can be used as charge storage layer 6b.

Figure 19E:
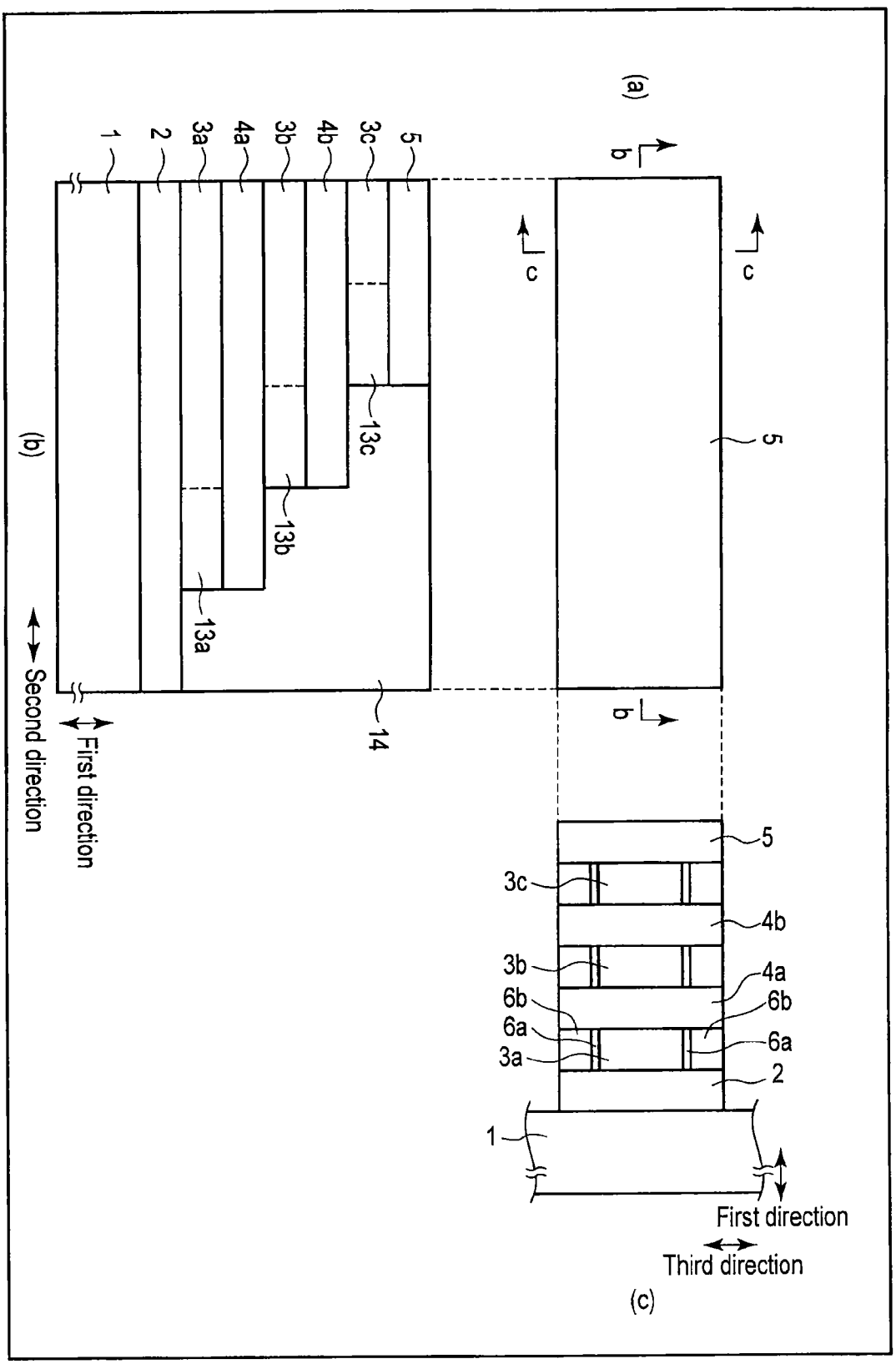

As shown in FIG. 19E, charge storage layer 6b is then selectively etched by anisotropic dry etching. As a result, charge storage layer 6b only remains in first to third recesses 21a to 21c on the side surfaces of first to third semiconductor layers 3a to 3c in the third direction.

That is, fourth insulating layer 5 is exposed when uppermost charge storage layer 6b is removed. Therefore, fourth insulating layer 5 is used as a mask to further etch charge storage layer 6b, and first to third charge storage layers 6b are then formed in first to third recesses 21a to 21c, respectively.

Here, as fourth insulating layer 5 functions as a mask for etching charge storage layer 6b, the width of fourth insulating layer 5 in the first direction may be greater than the width of each of first to third insulating layers 2, 4a, and 4b in the first direction.

If the function of fourth insulating layer 5 as the mask is regarded as important, fourth insulating layer 5 may be formed by a method and a material different from first to third insulating layers 2, 4a, and 4b (e.g., a stacked layer structure of different insulating layers).

At this point, first to third charge storage layers 6b are separated in the first direction.

Figure 19F:
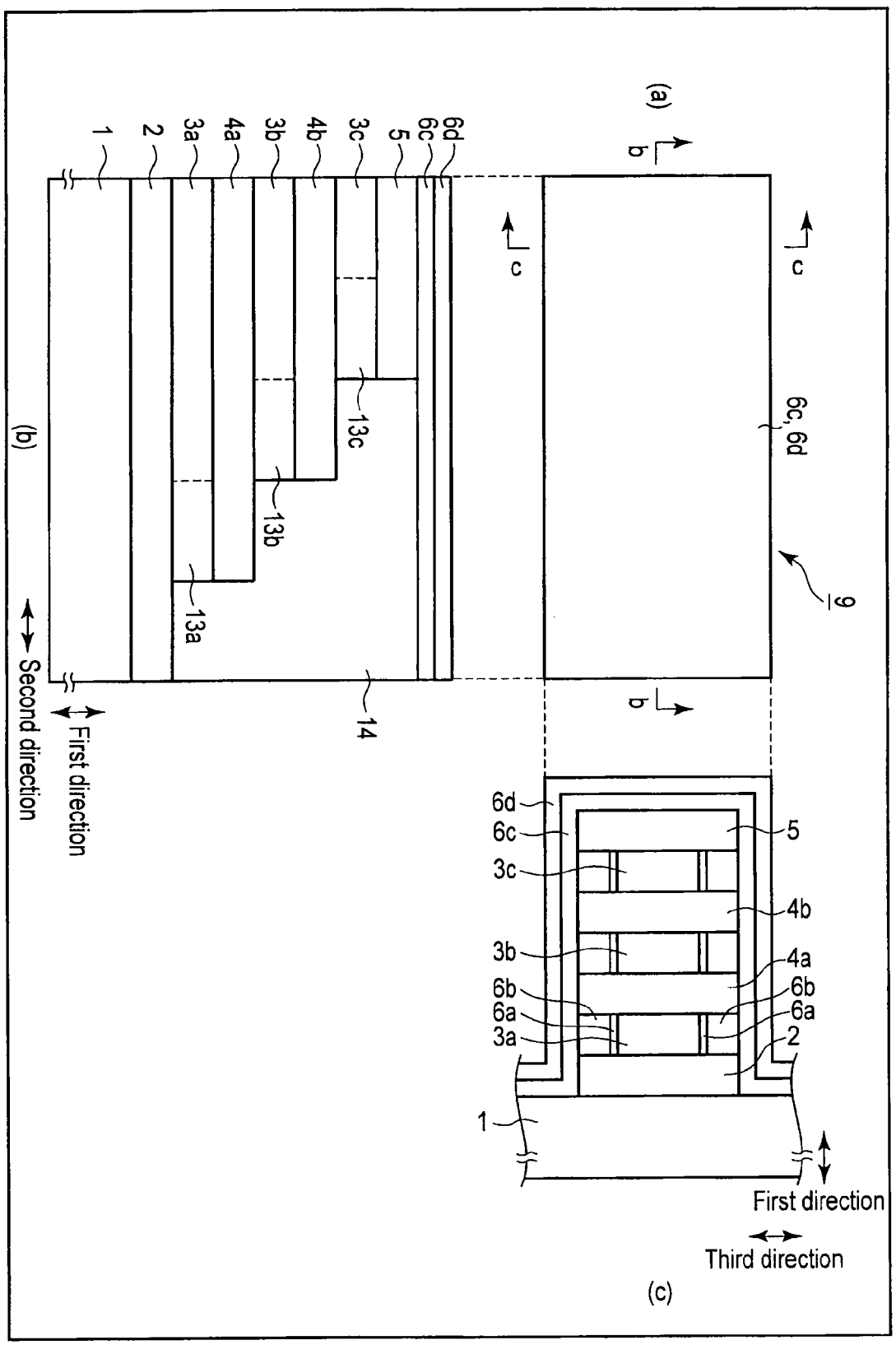

As shown in FIG. 19F, second gate insulating layer 6c and control gate electrode 6d that cover fin-type stacked layer structure (including first to third charge storage layers 6b) 9 are then formed. A material such as aluminum oxide can be used as second gate insulating layer 6c, and a material such as nickel silicide can be used as control gate electrode 6d.

As shown in FIG. 19G, second gate insulating layer 6c and control gate electrode 6d are fabricated by the PEP and the anisotropic dry etching, and control gate electrodes (word lines) 6d, . . . are formed. Control gate electrodes (word lines) 6d, . . . extend in the third direction on the side of fourth insulating layer 5 in the third direction, and extend in the first direction on the side of first to third charge storage layers 6b in the third direction.

In this way, while gate stacked layer structure 6(1) is formed in the memory string, select gate electrodes 10a, 10b, and 10c of layer select transistors Ta, Tb, and Tc are formed at one end of the memory string in the second direction.

Figure 19H:
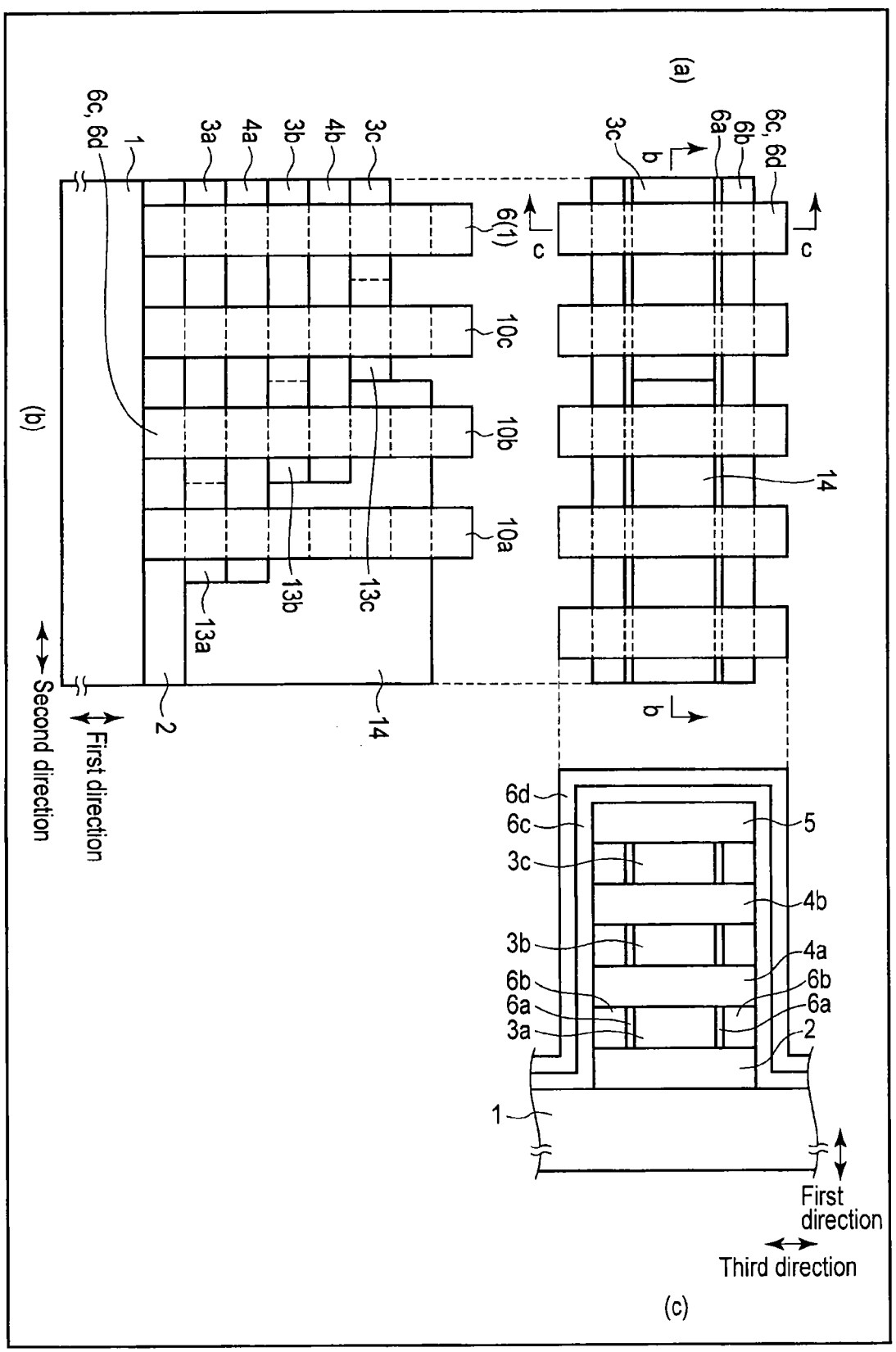
Figure 19:
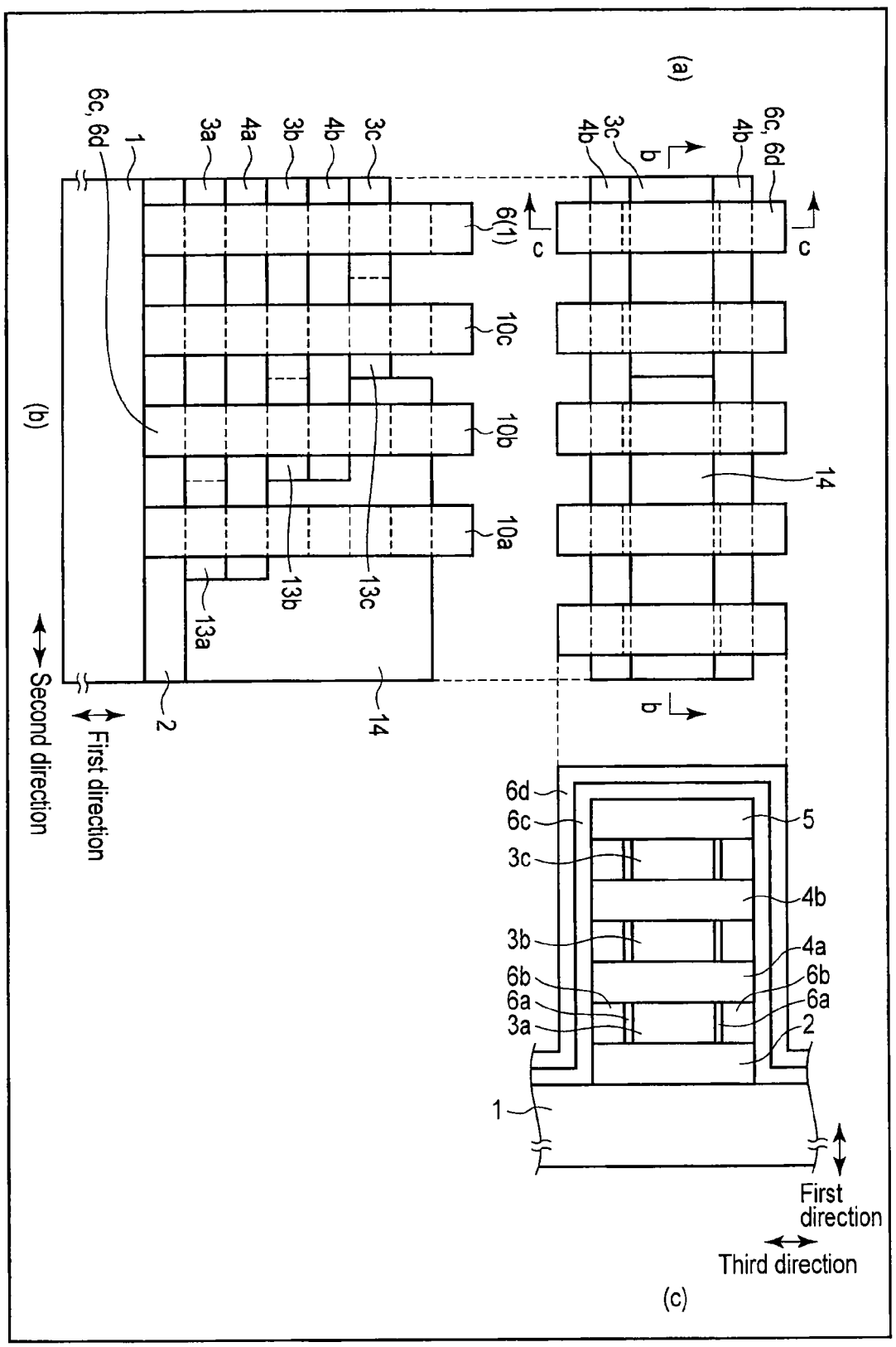

As shown in FIG. 19H, fourth insulating layer 5 is then selectively etched by anisotropic dry etching. At the same time, control gate electrodes 6d, . . . function as masks for the anisotropic dry etching. Therefore, in parts that are not covered by control gate electrodes 6d, . . . , fourth insulating layer 5 is selectively removed, and the side surfaces of third semiconductor layer 3c, third charge storage layer 6b, and third gate insulating layer 6a in the first direction are exposed.

As shown in FIG. 19I, third charge storage layer 6b is then selectively etched by anisotropic dry etching. At the same time, control gate electrodes 6d, . . . and third semiconductor layer 3c function as masks for the anisotropic dry etching. In this etching, first gate insulating layer 6a can be removed together.

Therefore, as the part of third charge storage layer 6b that is not covered by control gate electrodes 6d, . . . is selectively removed, third charge storage layers 6b, . . . separated in the second direction and third gate insulating layer 6a are formed on the side of third semiconductor layer 3c in the third direction.

As shown in FIG. 19J, third insulating layer 4b is then selectively etched by anisotropic dry etching. At the same time, control gate electrodes 6d, . . . and third semiconductor layer 3c function as masks for the anisotropic dry etching.

Therefore, in parts that are not covered by control gate electrodes 6d, . . . and third semiconductor layer 3c, third insulating layer 4b is selectively removed, and the side surfaces of second charge storage layer 6b and second gate insulating layer 6a in the first direction are exposed.

As shown in FIG. 19K, second charge storage layer 6b is then selectively etched by anisotropic dry etching. At the same time, control gate electrodes 6d, . . . and third semiconductor layer 3c function as masks for the anisotropic dry etching. In this etching, first gate insulating layer 6a can be removed together.

Therefore, as the part of second charge storage layer 6b that is not covered by control gate electrodes 6d, . . . is selectively removed, second charge storage layers 6b, . . . separated in the second direction and second gate insulating layer 6a are formed on the side of second semiconductor layer 3b in the third direction.

Similarly, first charge storage layers 6b, . . . separated in the second direction and first gate insulating layer 6a are formed on the side of first semiconductor layer 3a in the third direction.

Figure 19L:
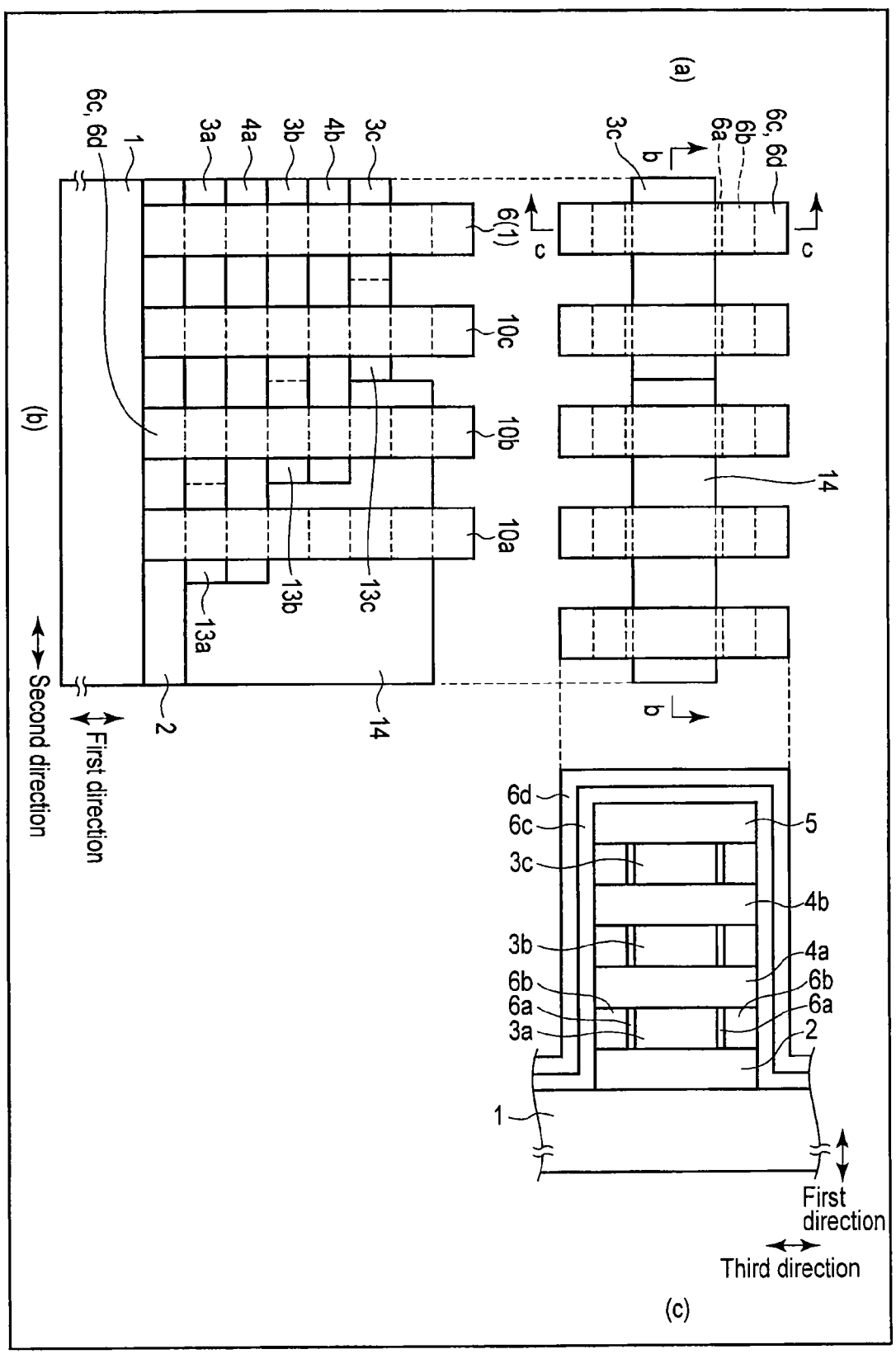

As shown in FIG. 19L, charge storage layers 6b, . . . physically separated for the respective memory cells are formed by the process described above. This prevents a situation where a charge in a charge storage layer moves to another charge storage layer in first to third charge storage layers 6b, . . . , so that satisfactory data retention characteristics can be obtained.

F. Summary

According to the third embodiment, the positions of the edges of the second and third insulating layers on the side of the drain electrode are adjusted so that when a current is passed through one selected memory string, unnecessary currents do not run through the remaining unselected memory strings, and reading/writing/erasing can be accurately performed.

3. VERIFICATION OF CUT-OFF CHARACTERISTICS

The improvement of the cut-off characteristics according to the structure of the embodiment is described by comparison with that according to a conventional structure.

Figure 20:
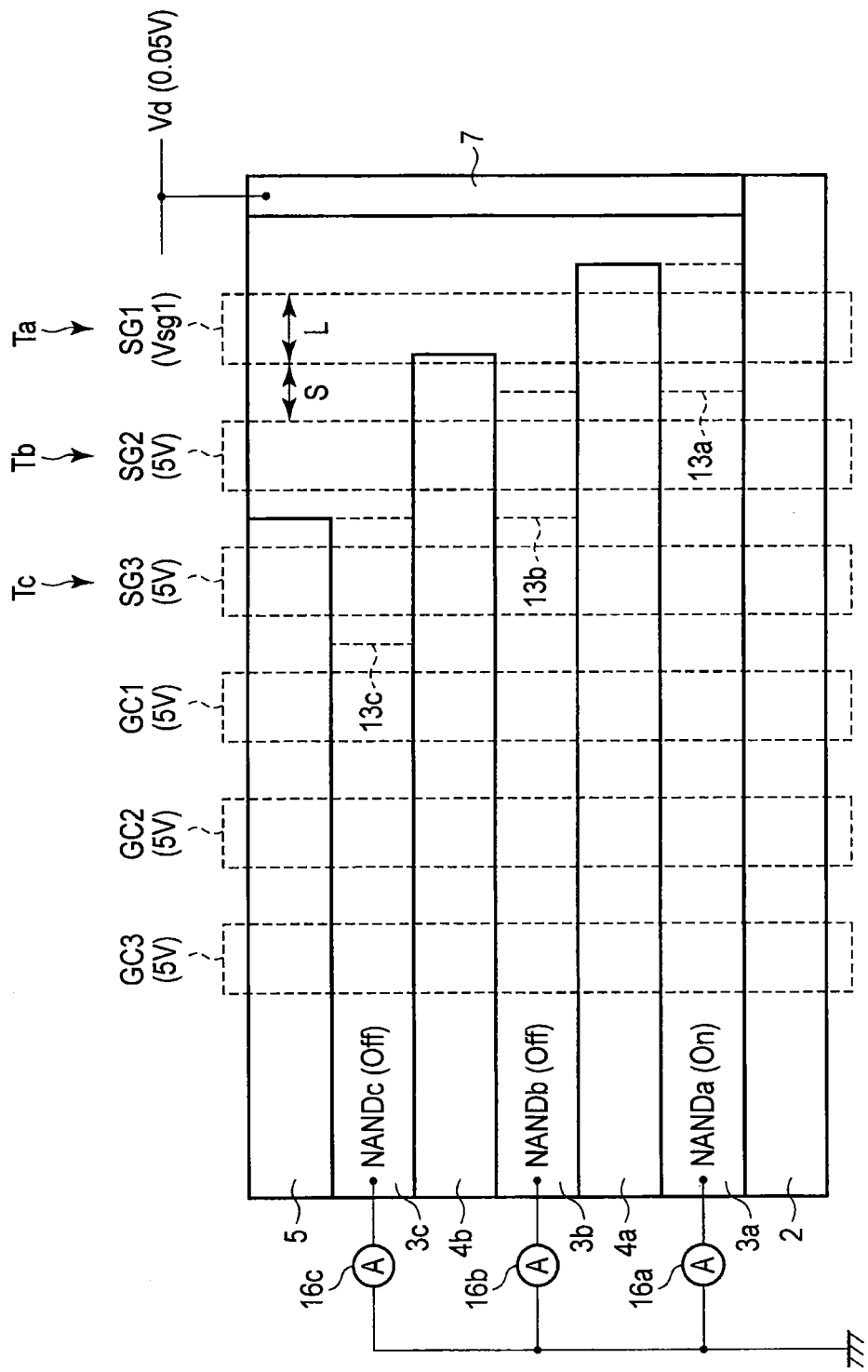
FIG. 20 is a diagram showing a simulation model of the embodiment.

FIG. 20 shows a simulation model according to the embodiment.

Conditions are as follows.

First to third semiconductor layers 3a, 3b, and 3c and common semiconductor layer 14 are p-type semiconductor layers including a p-type impurity of $1 \times 10^{17}$ atoms/cm$^3$, and impurity regions 13a, 13b, and 13c are n-type impurity regions including an n-type impurity of $1\times10^{16}$ atoms/cm$^3$, here $5\times10^{18}$ atoms/cm$^3$.

The width of each of first to third semiconductor layers 3a, 3b, and 3c in the first direction is 32 nm, and the width of each of first to fourth insulating layers 2, 4a, 4b, and 5 in the first direction is also 32 nm. The width of fin-type stacked layer structure in the third direction, that is, the width of each of first to third semiconductor layers 3a, 3b, and 3c and each of first to fourth insulating layers 2, 4a, 4b, and 5 in the third direction is 20 nm.

Width (line width) L of each of control gate electrodes CG1, CG2, and CG3 and each of select gate electrodes SG1, SG2, and SG3 in the second direction is 32 nm, and the space therebetween is also 32 nm. That is, the gate interval (pitch) is 32 nm.

Potential Vd of drain electrode 7 is 0.05 V, and the source ends of first to third semiconductor layers 3a, 3b, and 3c are connected to a ground point via ammeters 16a, 16b, and 16c.

The potential of each of control gate electrodes CG1, CG2, and CG3 and each of select gate electrodes SG2 and SG3 is 5 V.

Under such conditions, the cut-off characteristics of layer select transistors Ta, Tb, and Tc are verified by changing potential Vsg1 of select gate electrode SG1 from −5 V to 5 V.

Under the above-mentioned conditions, first memory string NANDa is selected, and second and third memory strings NANDb and NANDc are not selected. Therefore, when potential Vsg1 of select gate electrode SG1 is 0 V (first layer select transistors Ta in second and third semiconductor layers 3b and 3c are off), the cut-off characteristics are better if current values detected by ammeters 16b and 16c are lower.

FIG. 21 shows the results of the simulation of FIG. 20.

According to the results, when potential Vsg1 of select gate electrode SG1 is 0 V, a current of about $1\times10^{-7}$ A runs through first memory string NANDa, whereas almost no current runs through second and third memory strings NANDb and NANDc (less than $1\times10^{-11}$ A).

Thus, according to the structure of the embodiment, the cut-off characteristics of the layer select transistors can be improved.

Figure 22:
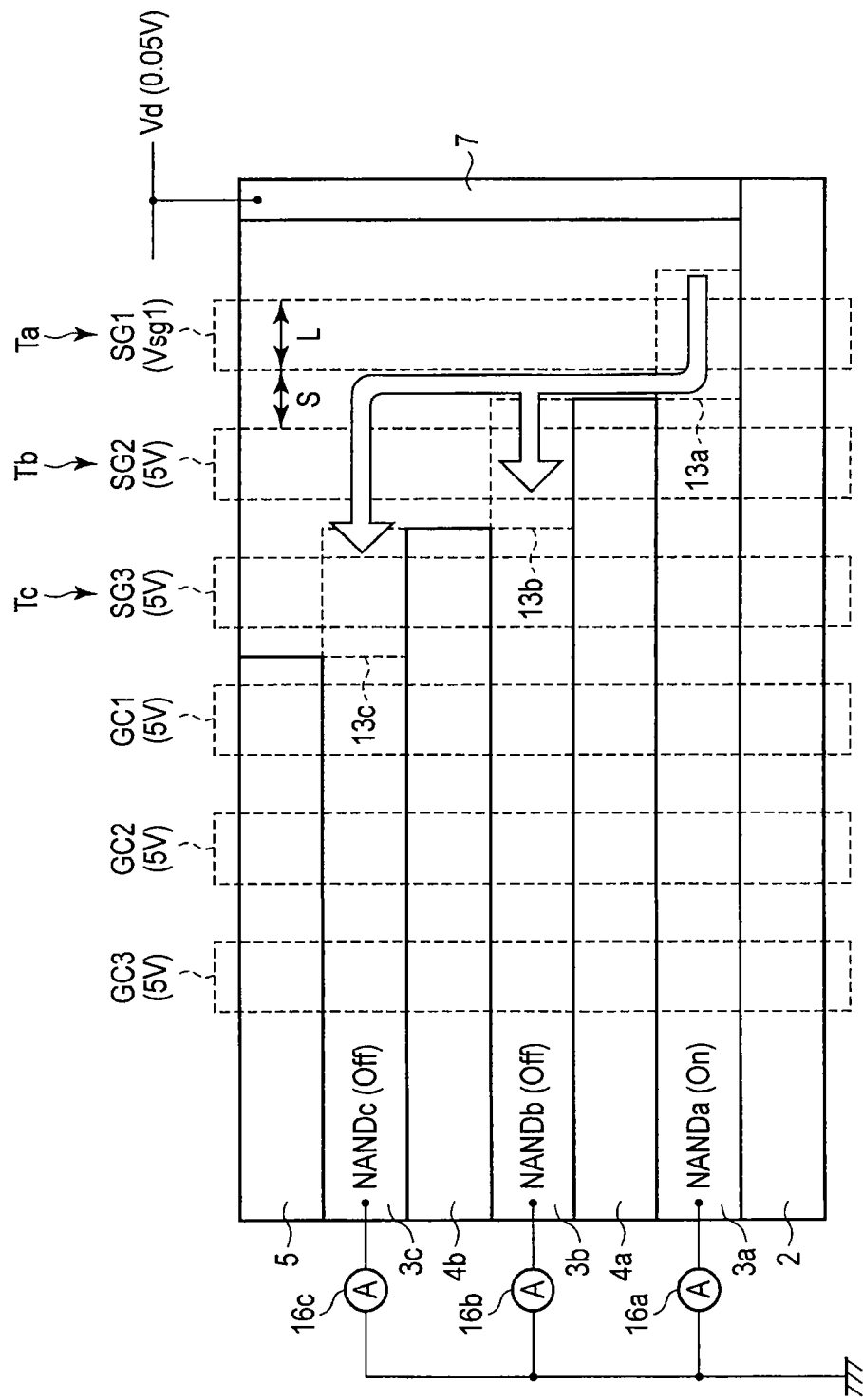
FIG. 22 is a diagram showing a simulation model of a conventional technique.

FIG. 22 shows a simulation model according to a conventional technique.

This conventional technique corresponds to a structure disclosed in FIG. 13 of PCT/JP2009/060803 as a prior application.

The conventional technique is different from the structure according to the embodiment in that the drain ends of second and third insulating layers 4a and 4b are shorter. That is, second and third insulating layers 4a and 4b are not present on impurity regions 13a and 13b.

Other conditions are the same as the structure according to the embodiment (FIG. 20).

Under such conditions, the cut-off characteristics of layer select transistors Ta, Tb, and Tc are verified by changing potential Vsg1 of select gate electrode SG1 from −5 V to 5 V.

Under the above-mentioned conditions, first memory string NANDa is selected, and second and third memory strings NANDb and NANDc are not selected. Therefore, when potential Vsg1 of select gate electrode SG1 is 0 V (first layer select transistors Ta in second and third semiconductor layers 3b and 3c are off), the cut-off characteristics are better if current values detected by ammeters 16b and 16c are lower.

FIG. 23 shows the results of the simulation of FIG. 22.

According to the results, when potential Vsg1 of select gate electrode SG1 is 0 V, a current of about $1\times10^{-7}$ A runs through first memory string NANDa, while a current of about $1\times10^{-8}$ A also runs through second and third memory strings NANDb and NANDc.

This is attributed to the presence of a current path indicated by a thick arrow in FIG. 22. In the structure according to the embodiment, no such current path is present.

Therefore, according to the conventional technique, the cut-off characteristics of the layer select transistors are inadequate.

As described above, according to the structure of the embodiment, a high degree of integration is maintained, and at the same time, the cut-off characteristics can be improved as compared with the conventional technique.

4. OTHERS

Regarding a series connection comprising memory cells and select transistors (layer select transistors and source-side select transistors) connected in series, a diffusion layer may be or may not be formed between the transistors.

When the gate interval (the pitch of the control gate electrodes) is 30 nm or less, a current path can be formed in the semiconductor layer (channel) without even a diffusion layer between the transistors (e.g., see Chang-Hyum Lee et al., VLSI Technology Digest of Technical Papers, pp. 118-119, 2008).

5. CONCLUSION

According to the embodiment, it is possible to provide a three-dimensional stacked layer type semiconductor memory that enables both a high degree of integration and satisfactory cut-off characteristics.

The embodiment is industrially enormously advantageous to, for example, a file memory capable of high-speed random writing, a mobile terminal capable of high-speed downloading, a mobile player capable of high-speed downloading, a semiconductor memory for broadcasting devices, a drive recorder, a home video, a high-capacity buffer memory for communication, and a semiconductor memory for a security camera.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   a fin-type stacked layer structure in which a first insulating layer, a first semiconductor layer, . . . an n-th insulating layer, an n-th semiconductor layer, and an (n+1)-th insulating layer (n is a natural number equal to or more than 2) are stacked in order thereof in a first direction perpendicular to a surface of the semiconductor substrate and which extends in a second direction parallel to the surface of the semiconductor substrate;
   first to n-th memory strings which use the first to n-th semiconductor layers as channels respectively;

a common semiconductor layer which combines the first to n-th semiconductor layers at first ends of the first to n-th memory strings in the second direction;
a drain electrode connected to the common semiconductor layer;
a source electrode connected to the first to n-th semiconductor layers at second ends of the first to n-th memory strings in the second direction; and
first to n-th layer select transistors arranged in order from the drain electrode to the first to n-th memory strings between the first to n-th memory strings and the drain electrode,
wherein the first to n-th layer select transistors comprise first to n-th select gate electrodes extending in the first direction respectively,
a drain side edge of an i-th insulating layer (i is one of 2 to n) among the first to (n+1)-th insulating layers is located at the same position as a memory string side edge of an (i−1)-th select gate electrode or located closer to the drain electrode than the memory string side edge of the (i−1)-th select gate electrode, where the drain side edge is a edge which is near the drain electrode, and the memory string side edge is a edge which is near the first to n-th memory strings, and
a j-th layer select transistor (j is one of 1 to n) among the first to n-th layer select transistors is normally-on in a j-th semiconductor layer.

2. The device of claim 1,
wherein the drain side edge of the i-th insulating layer is located closer to the drain electrode than the drain side edge of an (i+1)-th insulating layer.

3. The device of claim 1,
wherein the drain side edge of an (i+1)-th insulating layer among the first to (n+1)-th insulating layers is located at the same position as the memory string side edge of an (i−1)-th select gate electrode or located closer to the first to n-th memory strings than the memory string side edge of an (i−1)-th select gate electrode.

4. The device of claim 1,
wherein the normally-on state is obtained by an impurity region which is formed in the first to n-th semiconductor layers and which has an impurity concentration of $1\times10^{16}$ atoms/cm$^3$ or more.

5. The device of claim 1,
wherein each of the first to n-th memory strings has a stacked layer structure of a charge storage layer and a control gate electrode which extend in the first direction.

6. The device of claim 1,
wherein the first to n-th memory strings have first to n-th charge storage layers respectively, the first to n-th charge storage layers are independent from each other, and a control gate electrode which covers the first to n-th charge storage layers and which extends in the first direction.

7. The device of claim 1,
wherein the first to n-th select gate electrodes cover two side surfaces of the first to n-th semiconductor layers which face in a third direction perpendicular to the first and second directions.

8. The device of claim 1,
wherein the first to n-th select gate electrodes cover one of two side surfaces of the first to n-th semiconductor layers which face in a third direction perpendicular to the first and second directions.

9. The device of claim 1, further comprising:
a diffusion layer which is formed in the common semiconductor layer and which surrounds the drain electrode.

10. A nonvolatile semiconductor memory device comprising:
a semiconductor substrate;
a fin-type stacked layer structure in which a first insulating layer, a first semiconductor layer, . . . an n-th insulating layer, an n-th semiconductor layer, and an (n+1)-th insulating layer (n is a natural number equal to or more than 2) are stacked in order thereof in a first direction perpendicular to a surface of the semiconductor substrate and which extends in a second direction parallel to the surface of the semiconductor substrate;
first to n-th memory strings which use the first to n-th semiconductor layers as channels respectively;
a common semiconductor layer which combines the first to n-th semiconductor layers at first ends of the first to n-th memory strings in the second direction;
a drain electrode connected to the common semiconductor layer;
a source electrode connected to the first to n-th semiconductor layers at second ends of the first to n-th memory strings in the second direction; and
first to (n−1)-th layer select transistors arranged in order from the drain electrode to the first to n-th memory strings between the first to n-th memory strings and the drain electrode,
wherein the n-th memory string comprises a dummy cell as a non-memory cell;
the first to (n−1)-th layer select transistors comprise first to (n−1)-th select gate electrodes extending in the first direction respectively,
a drain side edge of an i-th insulating layer (i is one of 2 to n) among the first to (n+1)-th insulating layers is located at the same position as a memory string side edge of an (i−1)-th select gate electrode or located closer to the drain electrode than the memory string side edge of the (i−1)-th select gate electrode, where the drain side edge is a edge which is near the drain electrode, and the memory string side edge is a edge which is near the first to n-th memory strings, and
a j-th layer select transistor (j is one of 1 to (n−1)) among the first to (n−1)-th layer select transistors is normally-on in a j-th semiconductor layer.

11. The device of claim 10,
wherein the drain side edge of the i-th insulating layer is located closer to the drain electrode than the drain side edge of an (i+1)-th insulating layer.

12. The device of claim 10,
wherein the drain side edge of an (i+1)-th insulating layer among the first to (n+1)-th insulating layers is located at the same position as the memory string side edge of an (i−1)-th select gate electrode or located closer to the first to n-th memory strings than the memory string side edge of an (i−1)-th select gate electrode.

13. The device of claim 10,
wherein the normally-on state is obtained by an impurity region which is formed in the first to n-th semiconductor layers and which has an impurity concentration of $1\times10^{16}$ atoms/cm$^3$ or more.

14. The device of claim 10,
wherein each of the first to n-th memory strings has a stacked layer structure of a charge storage layer and a control gate electrode which extend in the first direction.

15. The device of claim 10,
wherein the first to n-th memory strings have first to n-th charge storage layers respectively, the first to n-th charge storage layers are independent from each other, and a control gate electrode which covers the first to n-th charge storage layers and which extends in the first direction.

16. The device of claim 10,
wherein the first to (n−1)-th select gate electrodes cover two side surfaces of the first to n-th semiconductor layers which face in a third direction perpendicular to the first and second directions.

17. The device of claim 10,
wherein the first to (n−1)-th select gate electrodes cover one of two side surfaces of the first to n-th semiconductor layers which face in a third direction perpendicular to the first and second directions.

18. The device of claim 10, further comprising:
a diffusion layer which is formed in the common semiconductor layer and which surrounds the drain electrode.

\* \* \* \* \*